(12) United States Patent
Kamigaichi et al.

(10) Patent No.: US 7,244,984 B2
(45) Date of Patent: Jul. 17, 2007

(54) NONVOLATILE SEMICONDUCTOR MEMORY INCLUDING TWO MEMORY CELL COLUMNS SHARING A SINGLE BIT LINE

(75) Inventors: Takeshi Kamigaichi, Kanagawa (JP); Fumitaka Arai, Kanagawa (JP); Kikuko Sugimae, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/892,445

(22) Filed: Jul. 16, 2004

(65) Prior Publication Data

US 2005/0073001 A1 Apr. 7, 2005

(30) Foreign Application Priority Data

Aug. 1, 2003 (JP) ............... P2003-285015

(51) Int. Cl.
*H01L 29/788* (2006.01)
(52) U.S. Cl. ............. 257/315; 257/316; 257/319
(58) Field of Classification Search ............. 257/315, 257/316, 319, 326
See application file for complete search history.

(56) References Cited

U.S. PATENT DOCUMENTS 5,528,537 A 6/1996 Lee et al.

2005/0073001 A1 4/2005 Kamigaichi et al.

FOREIGN PATENT DOCUMENTS

| JP | 6-325580 | 11/1994 |
| JP | 6-325581 | 11/1994 |
| JP | 7-193199 | 7/1995 |
| JP | 2002-280463 | 9/2002 |

OTHER PUBLICATIONS

U.S. Appl. No. 11/450,355, filed Jun. 12, 2006, Kutsukake et al.
U.S. Appl. No. 11/563,069, filed Nov. 24, 2006, Kamigaichi et al.
U.S. Appl. No. 11/565,843, filed Dec. 1, 2006, Arai et al.
U.S. Appl. No. 11/566,283, Dec. 4, 2006, Arai et al.
U.S. Appl. No. 11/550,636, Oct. 18, 2006, Arai et al.

*Primary Examiner*—Ori Nadav
(74) *Attorney, Agent, or Firm*—Oblon, Spivak, McClelland, Maier & Neustadt, P.C.

(57) ABSTRACT

This nonvolatile semiconductor memory includes: a first and a second memory cell column having memory cell transistors connected in series with a floating gate and a first and a second control gate located at both sides of that floating gate; a first select-gate transistor connected between the first memory cell column and a bit line; a second select-gate transistor connected between the second memory cell column and the bit line; and a third select gate transistor connected between the first memory cell column and a source line and also between the second memory cell column and the source line, respectively.

13 Claims, 84 Drawing Sheets

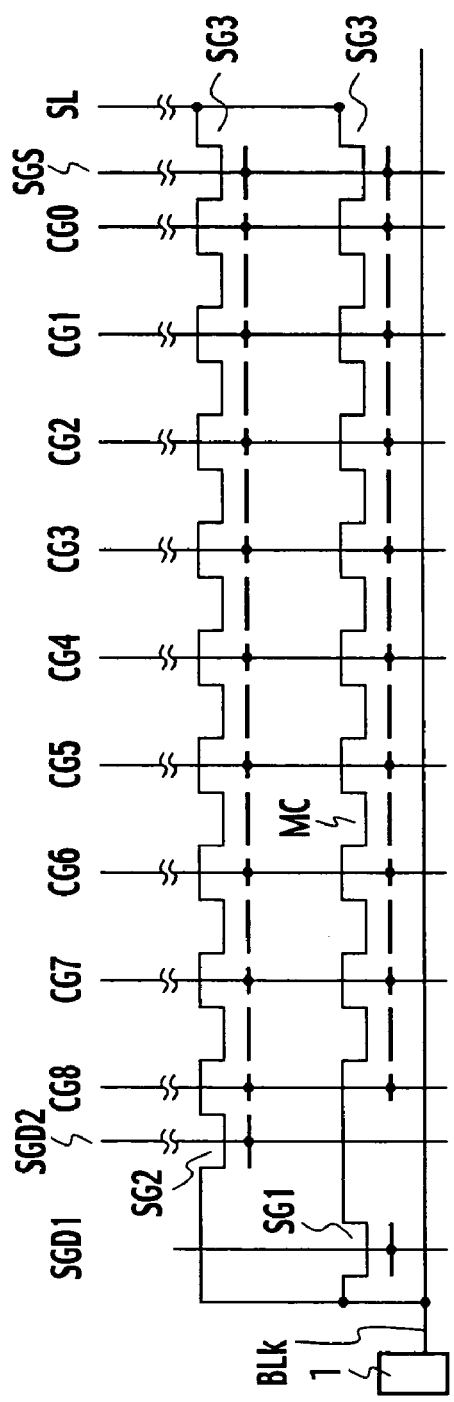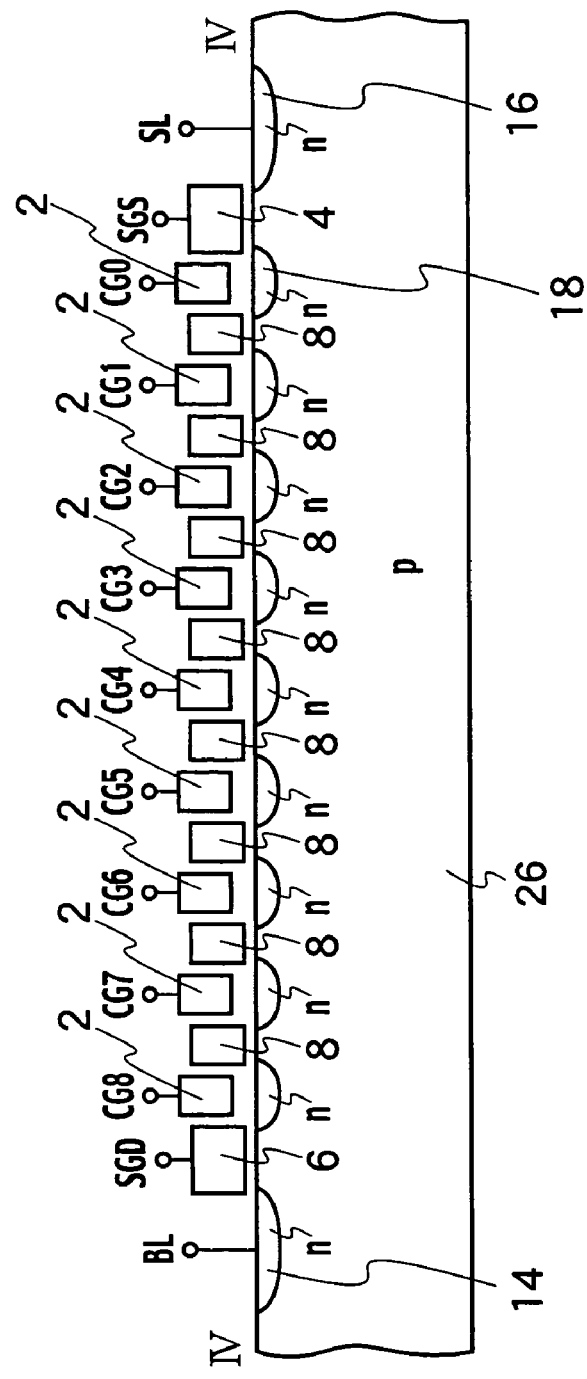

FIG. 2A
FIG. 2B
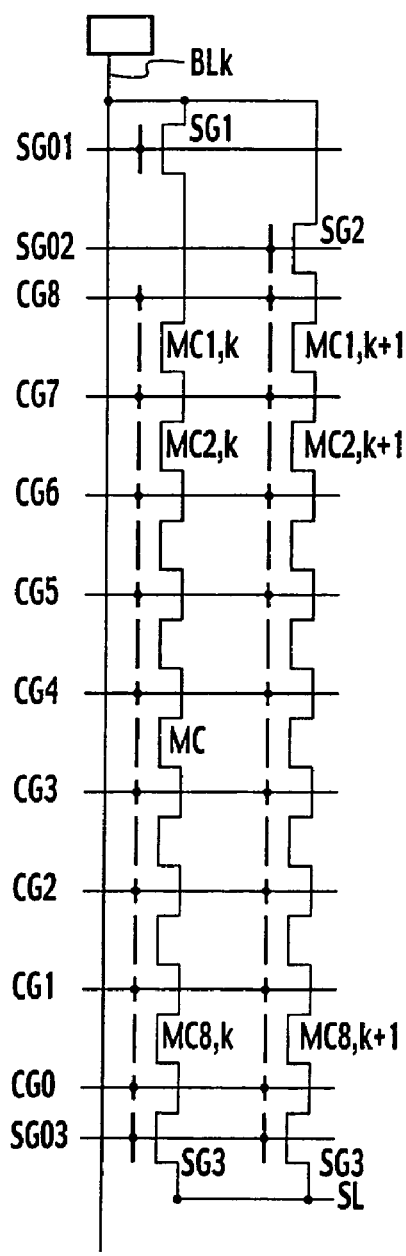
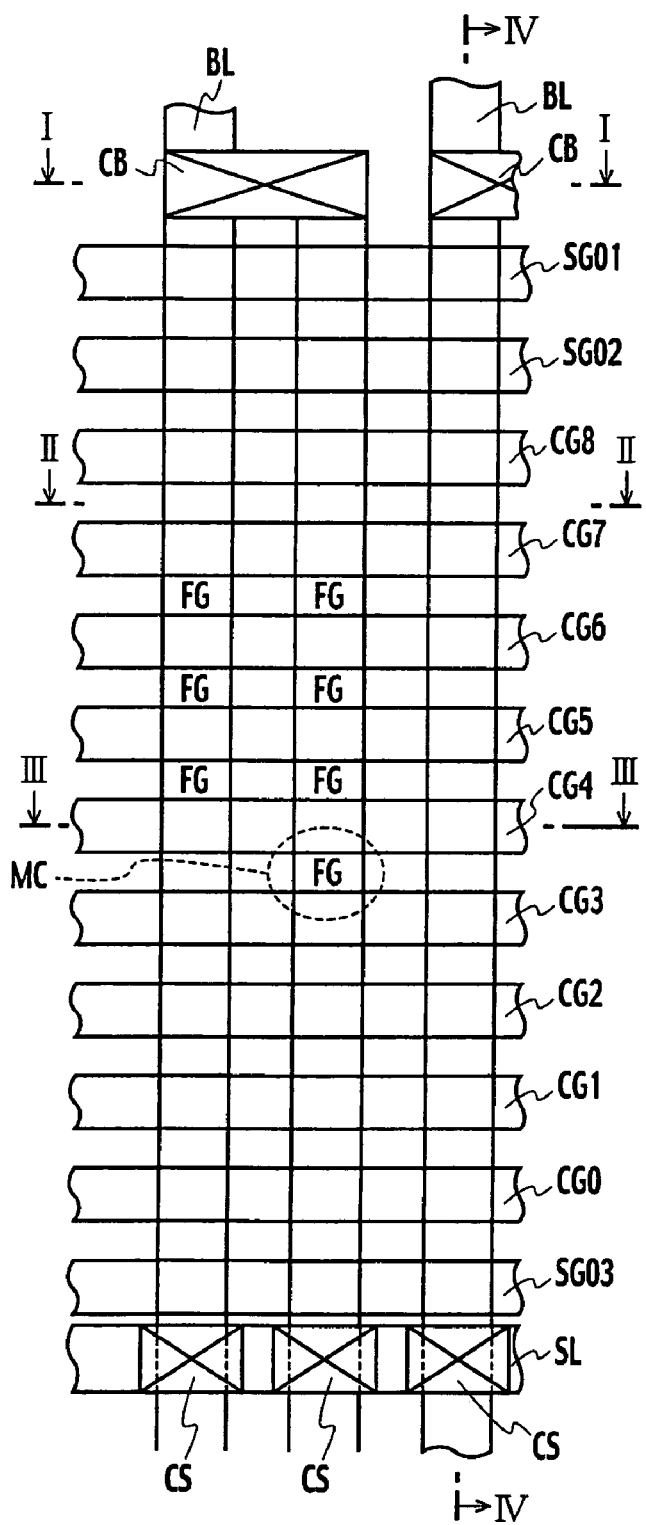

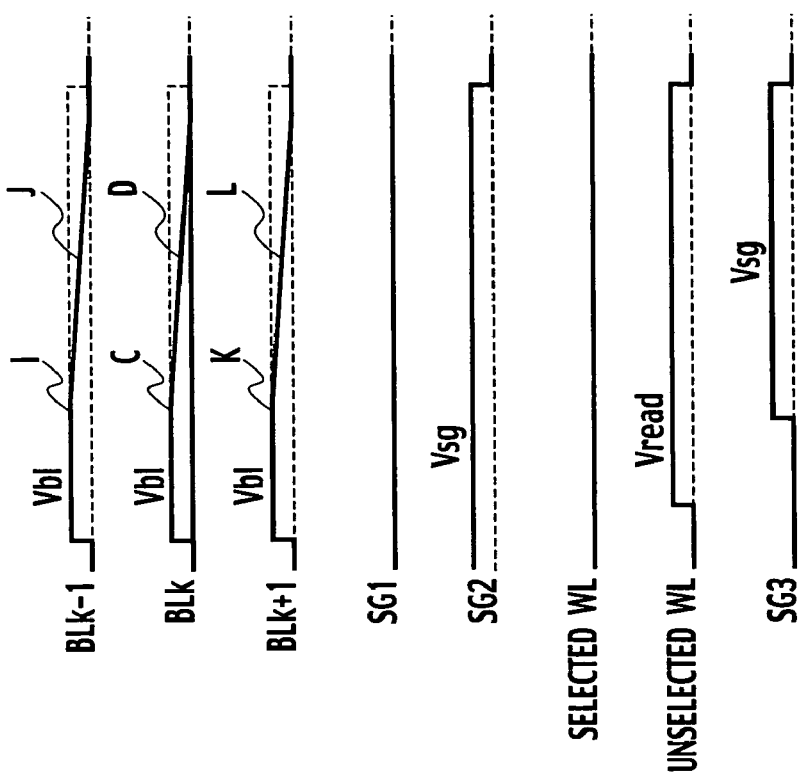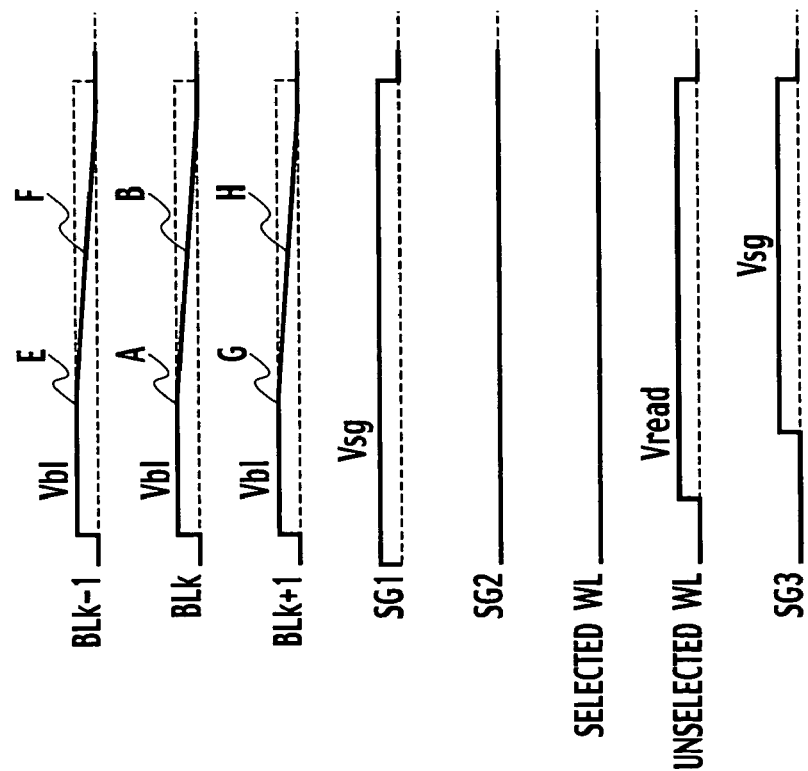

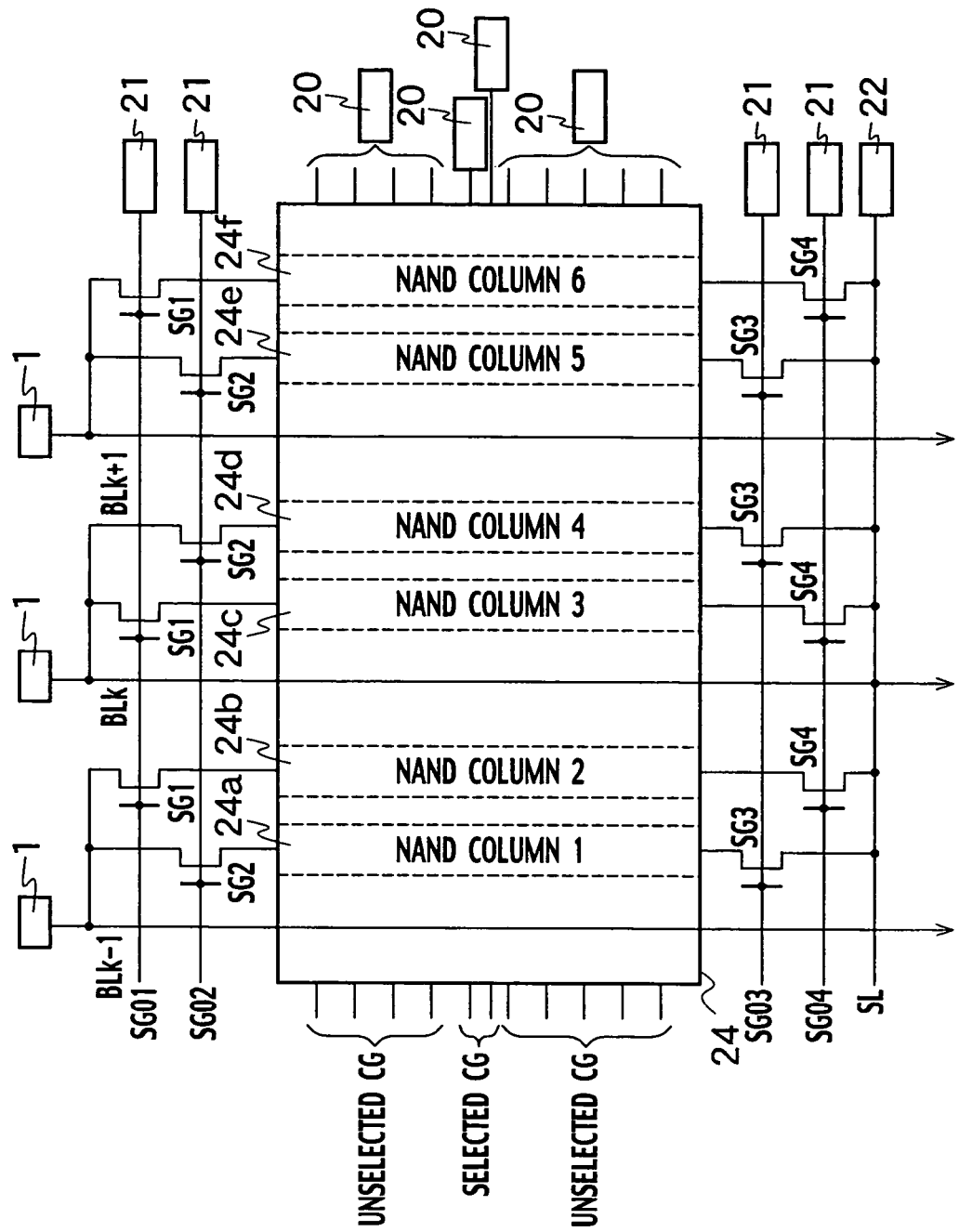

NONVOLATILE SEMICONDUCTOR MEMORY INCLUDING TWO MEMORY CELL COLUMNS SHARING A SINGLE BIT LINE

CROSS REFERENCE TO RELATED APPLICATIONS

This application is based upon and claims the benefit of priority from prior Japanese Patent Application P2003-285015 filed on Aug. 1, 2003; the entire contents of which are incorporated by reference herein.

BACKGROUND OF THE INVENTION

1. Field of the Invention

The present invention relates to a nonvolatile semiconductor memory and a fabrication method for the device. In particular, the invention relates to a nonvolatile semiconductor memory and a fabrication method that achieves a highly integrated circuit where two memory cell columns share a single bit line.

2. Description of the Related Art

As an example of conventional technology, a NAND EEPROM has a single bit line for each NAND column. When bit line BLk is a write-in bit line, and bit lines BLk+1 and BLk−1 are write-in control bit lines, respectively, during write-in, a predetermined gate voltage Vsg is applied to a bit line BL side select gate transistor SG1, and a sufficiently low voltage VBLpgm is applied to a bit line BL that is utilized to write-in. The aforementioned gate voltage Vsg is set to a voltage that allows the select gate transistor SG1 to turn on as opposed to the low voltage VBLpgm. A sufficiently high voltage VBLinhibit is applied to the bit lines BLk+1 and BLk−1 that are utilized to control write-in. The voltage VBLinhibit is set to a voltage level that sufficiently allows the aforementioned select gate transistor SG1 to turn off. A NAND memory cell transistor utilized by a corresponding bit line BL for write-in that has received a sufficiently low voltage VBLpgm is written when the select gate transistor SG1 is turned on so as to apply VBLpgm to the memory cell transistor. Thus, the channel voltage for the memory cell transistor is sufficiently reduced. Also, a NAND memory cell transistor utilized by corresponding bit lines BLk+1 and BLk−1 to control write-in that has received a sufficiently high voltage VBLinhibit is not written when the select gate transistor SG1 is turned off because the memory cell transistor channel voltage rises through capacitive coupling with a control gate CG. This state is a write-in controlled state, as disclosed by K. Imamiya, et.al., "A 125 mm$^2$ 1 Gb NAND Flash Memory With 10 M Bytes/s Program Speed", IEEE JOURNAL OF SOLID-STATE CIRCUITS, VOL. 37, NO. 11, NOVEMBER 2002, pp. 1493-1501.

However there is a problem in the conventional technology. When the device region pitch of NAND memory cell transistors is 2F, the size of the contact connecting the bit line BL to the diffusion layer of the bit line BL side select gate transistor must be larger than F considering misalignment and largely depending on exposure techniques. Here, F denotes the minimum processing dimension. Therefore, the interval between adjacent bit line contacts CB connecting neighboring bit lines BL to the respective diffusion layers of the bit line BL side select gate transistors is less than F. Accordingly, there is a large probability of an electrical short circuit will occur. Naturally, since each bit line BL has to be connected to corresponding bit line contact CB, which is used to connect the diffusion layer of a bit line BL side select gate transistor, processing of the bit lines and contacts is extremely difficult.

The present invention provides a nonvolatile semiconductor memory and a fabrication method for the device, which allow high integration of a NAND EEPROM, and allows bit line contacts CB, each connecting a bit line BL to the diffusion layer of a bit line BL side select gate transistor, to be arranged with a pitch that is twice the NAND column pitch, where two NAND columns share a single bit line BL, particularly in NAND EEPROM.

SUMMARY OF THE INVENTION

An aspect of the present invention inheres in a nonvolatile semiconductor memory including: (a) first and second memory cell columns, each having a plurality of memory cell transistors connected in series, each of the memory cell transistors has a gate structure including a floating gate and first and second control gates located at both sides of the floating gate; (b) a first select gate transistor connected between the first memory cell column and a bit line; (c) a second select gate transistor connected between the second memory cell column and the bit line; and (d) a bit line contact connecting the bit line to a diffusion layer of the first select transistor and the bit line contact connecting the bit line to a diffusion layer of the second select gate transistor, wherein a plurality of bit line contacts is being provided at a pitch twice the pitch of the memory cell column.

Another aspect of the present invention inheres in a fabrication method for a nonvolatile semiconductor memory including: (a) forming gate insulating films for a memory cell transistor and a select gate transistor on a semiconductor substrate; (b) forming a floating gate for the memory cell transistor and a gate electrode for the select gate transistor; (c) forming a cap insulating film for the floating gate; (d) forming a device isolating region; (e) depositing an inter-gate insulating film between the floating gate and control gates for the memory cell transistor; (f) forming a control gate for the memory cell transistor and a gate interconnect for the select gate transistor; (g) forming a salicide control insulating film across the entire surface of the device; and (h) selectively removing the salicide control insulating film on the control gate and on an exposed surface of the semiconductor substrate.

Another aspect of the present invention inheres in a fabrication method for a nonvolatile semiconductor memory including: (a) depositing and forming on a semiconductor substrate a gate insulating film for a memory cell transistor, a control gate, and a mask insulating film; (b) forming a device isolating region and etching the semiconductor substrate so as to form a portion for forming a floating gate; (c) carrying out a heat treatment; (d) depositing a inter-gate insulating film between a control gate and a floating gate; (e) forming a channel profile for the memory cell transistor; (f) opening a tunnel insulating film formation portion; (g) forming a tunnel insulating film for the memory cell transistor; (h) depositing a floating gate electrode across the entire surface of the device; (i) decreasing the height of the floating gate by etch back techniques; (j) forming a cap insulating film across the entire surface of the device, and exposing only the control gate electrode; (k) selectively etching the control gate electrode film; (l) depositing a first interlayer insulating film across the entire surface of the device; (m) exposing only the control gate electrode; (n) selectively etching the cap insulating film within a first opening region so as to expose the floating gate electrode; (o) decreasing the height of the upper surface of the control gate electrode by etching techniques; (p) forming a sidewall insulating film across the entire surface of the device; and (q) forming an opening narrower than the gate width on the upper surface of the floating gate.

Another aspect of the present invention inheres in a fabrication method for a nonvolatile semiconductor memory including: (a) forming a tunnel insulating film, a first gate electrode film for a select gate transistor, and a cap insulating film on the first gate electrode film on a semiconductor substrate; (b) processing each of the films by lithography and etching; (c) depositing an inter-gate insulating film between the first gate electrode and a region intended for forming a control gate across the entire surface of the substrate; (d) removing the inter-gate insulating film at side wall surface of the first gate electrode by lithography and etching; and (e) depositing a gate electrode film as a control gate and select gate transistor gate interconnect across the entire surface of the substrate, and electrically contacting the first gate electrode and the gate electrode film.

BRIEF DESCRIPTION OF DRAWINGS

FIG. 1A is a schematic circuit diagram of a nonvolatile semiconductor memory according to a first embodiment of the present invention;

FIG. 1B is a schematic device cross-sectional block diagram cut along a line IV-IV in FIG. 2B and corresponds to FIG. 1A;

FIG. 2A is a schematic circuit diagram of the nonvolatile semiconductor memory according to the first embodiment of the present invention;

FIG. 2B is a top view of a schematic device pattern corresponding to FIG. 2A;

FIG. 8A is a diagram showing operation waveforms when reading specific memory cells deployed in NAND columns 1, 3 and 5 of FIG. 4, and relates to a read-out operation not using a shielded bit line;

FIG. 8B is a diagram showing operation waveforms when reading specific memory cells deployed in NAND columns 2, 4 and 6 of FIG. 4;

FIG. 9 is a schematic block circuit diagram of a nonvolatile semiconductor memory according to a modified example of the first embodiment of the present invention, and is an example where the bit line BL side and the source line SL side respectively have two select gate lines;

FIG. 109 is a top view of a schematic device pattern in a process of the nonvolatile semiconductor memory fabrication method according to the fifth embodiment of the present invention;

FIG. 110 is a schematic cross-sectional block diagram cut along the line I-I of FIG. 109;

FIG. 111 is a schematic cross-sectional block diagram cut along the line II-II of FIG. 109;

FIG. 112 is a schematic cross-sectional block diagram cut along the line III-III of FIG. 109;

FIG. 113 is a top view of a schematic device pattern in a process of the nonvolatile semiconductor memory fabrication method according to the fifth embodiment of the present invention;

FIG. 114 is a schematic cross-sectional block diagram cut along the line I-I of FIG. 113;

FIG. 115 is a schematic cross-sectional block diagram cut along the line II-II of FIG. 113;

FIG. 116 is a schematic cross-sectional block diagram cut along the line III-III of FIG. 113;

FIG. 117 is a top view of a schematic device pattern in a process of the nonvolatile semiconductor memory fabrication method according to the fifth embodiment of the present invention;

FIG. 118 is a schematic cross-sectional block diagram cut along the line I-I of FIG. 117;

FIG. 119 is a schematic cross-sectional block diagram cut along the line II-II of FIG. 117;

FIG. 120 is a schematic cross-sectional block diagram cut along the line III-III of FIG. 117;

Figure 121:
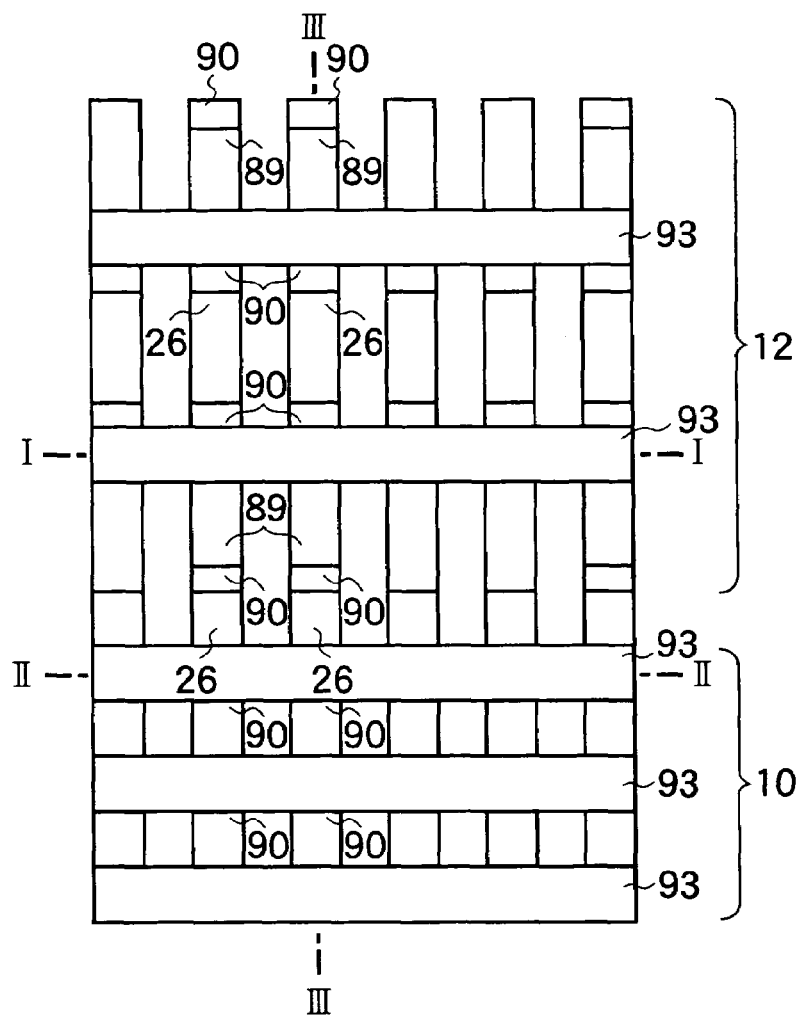
Figure 122:
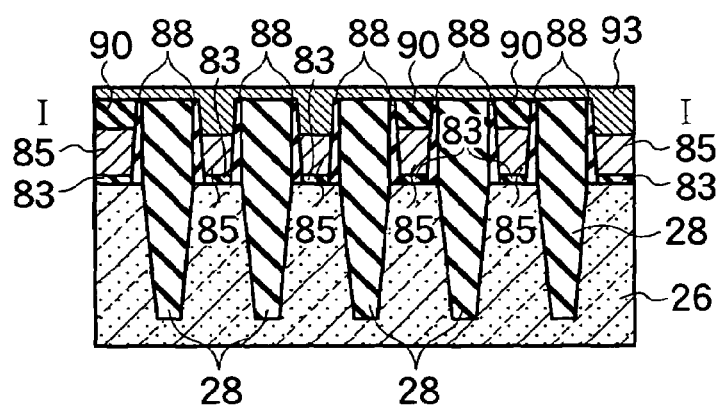
Figure 123:
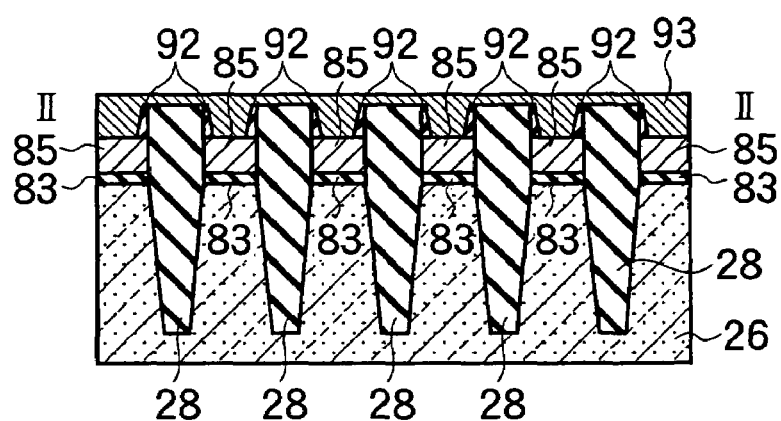
Figure 124:
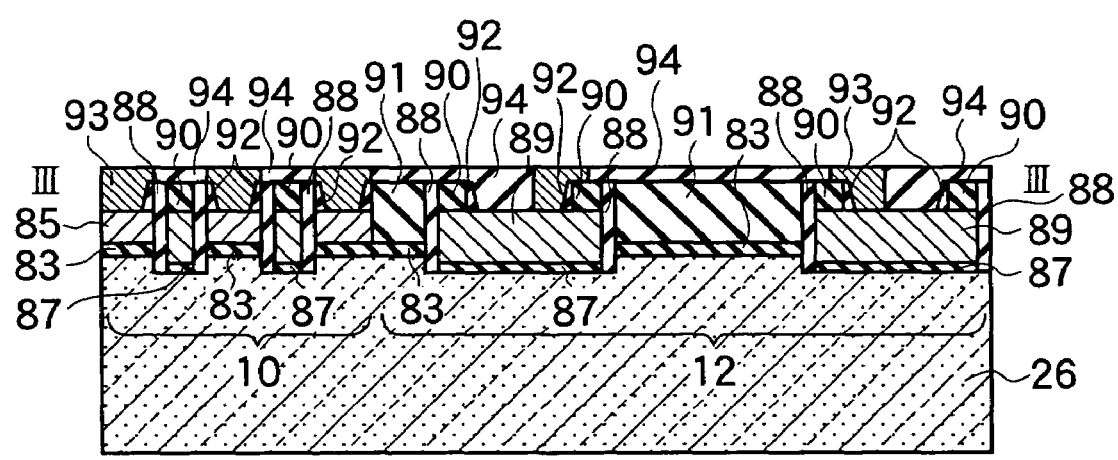
Figure 125:
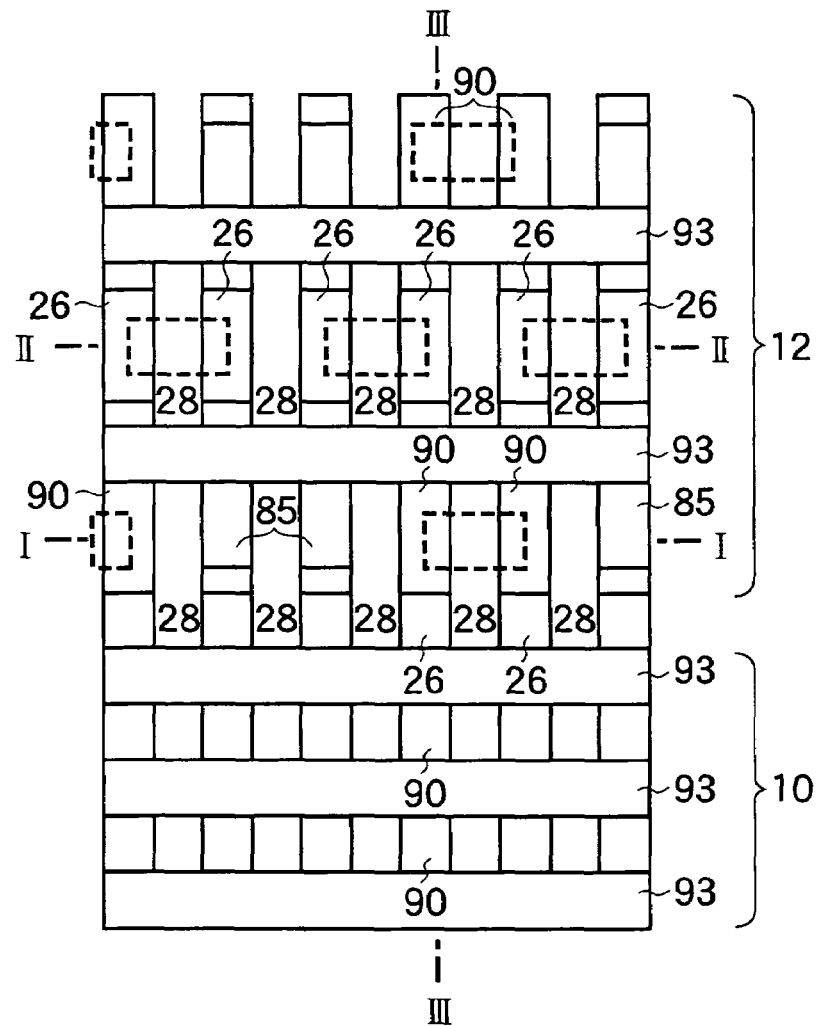
Figure 126:
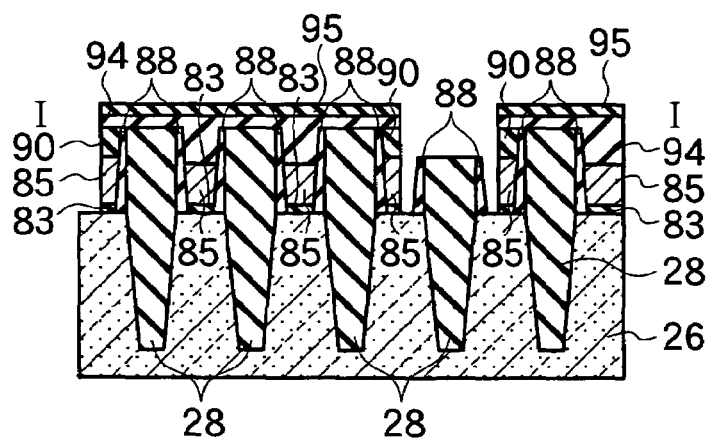
Figure 127:
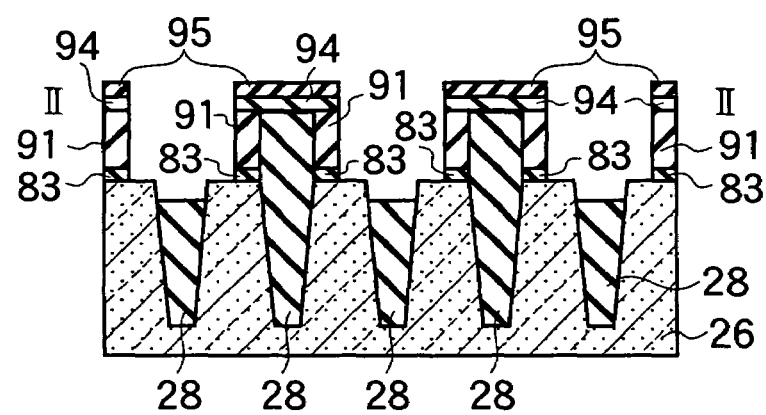
Figure 128:
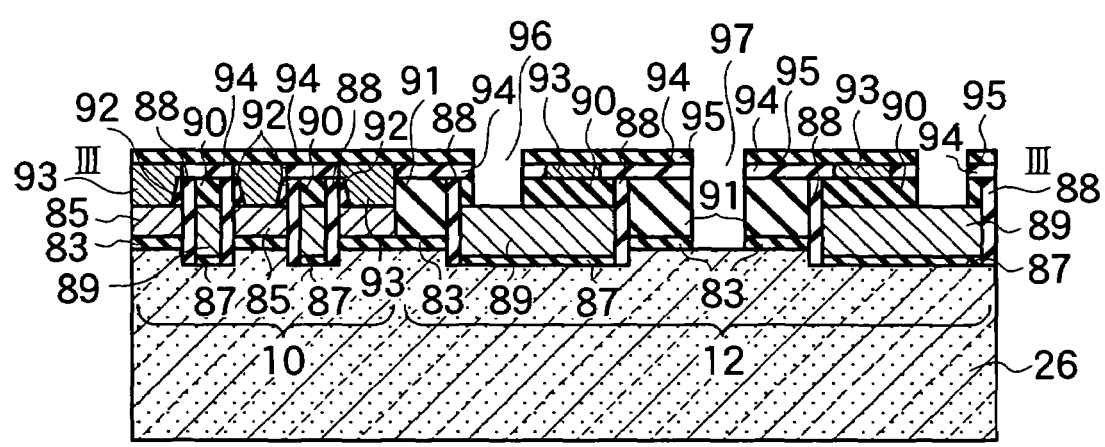
Figure 129:
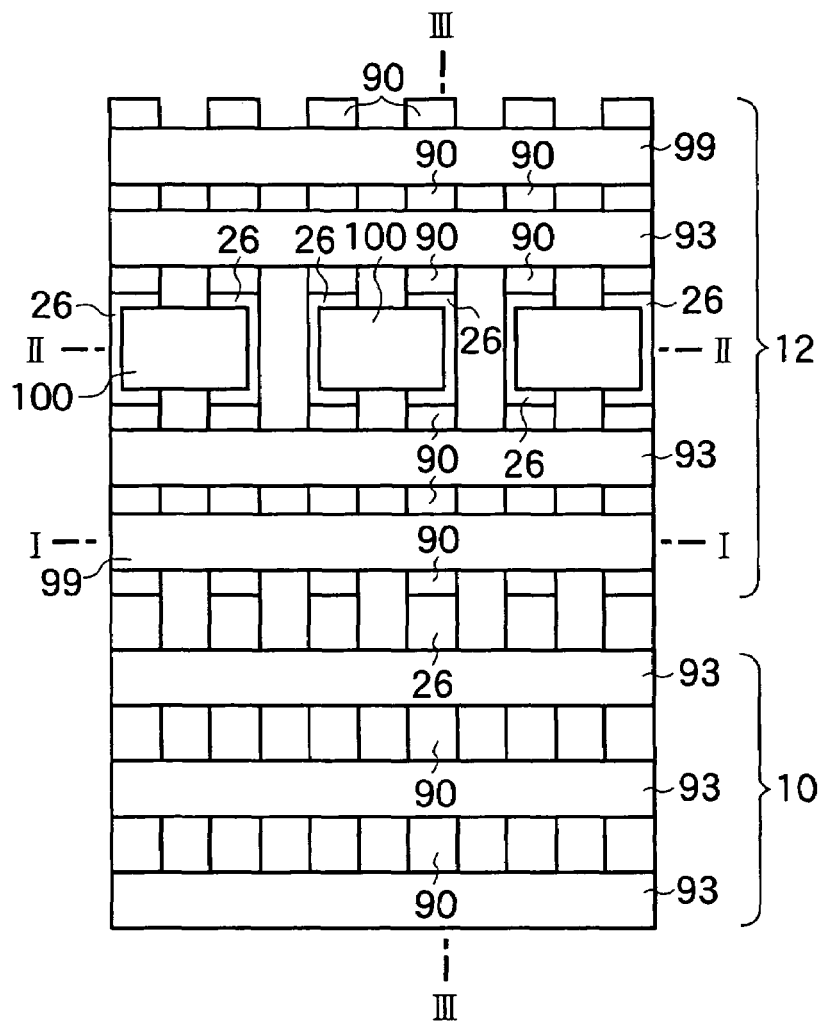
Figure 130:
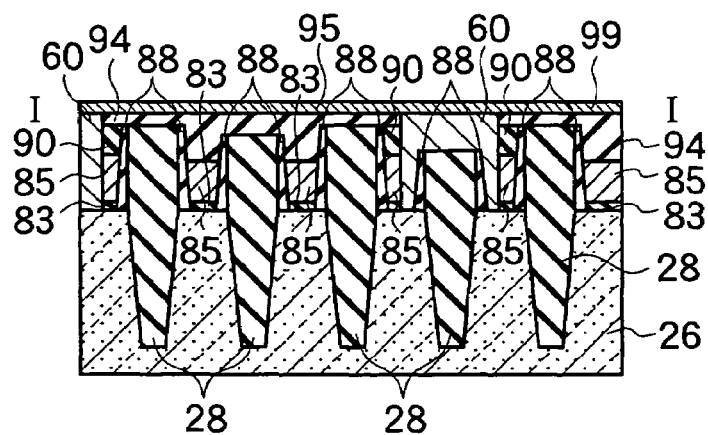
Figure 131:
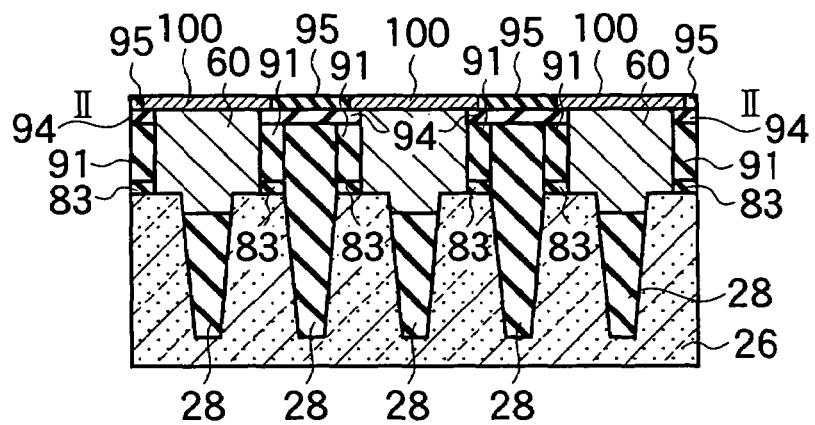
Figure 132:
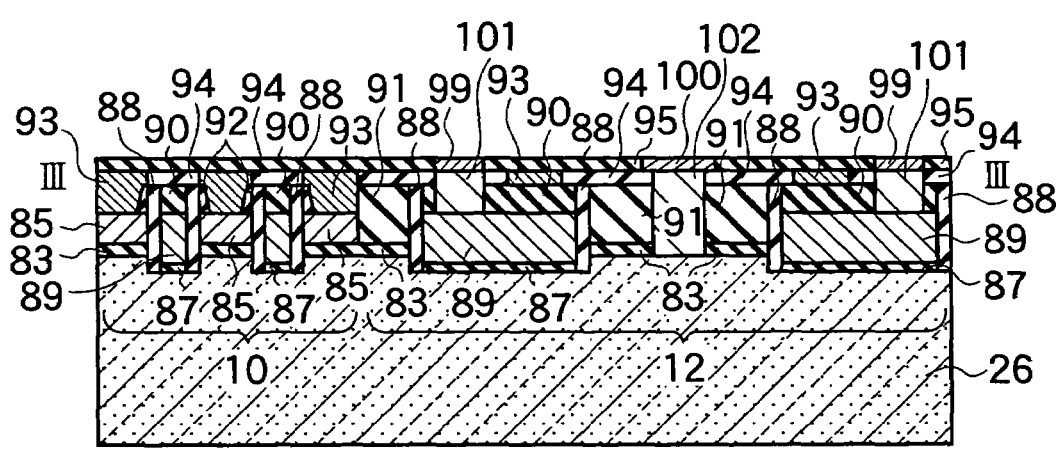
Figure 133:
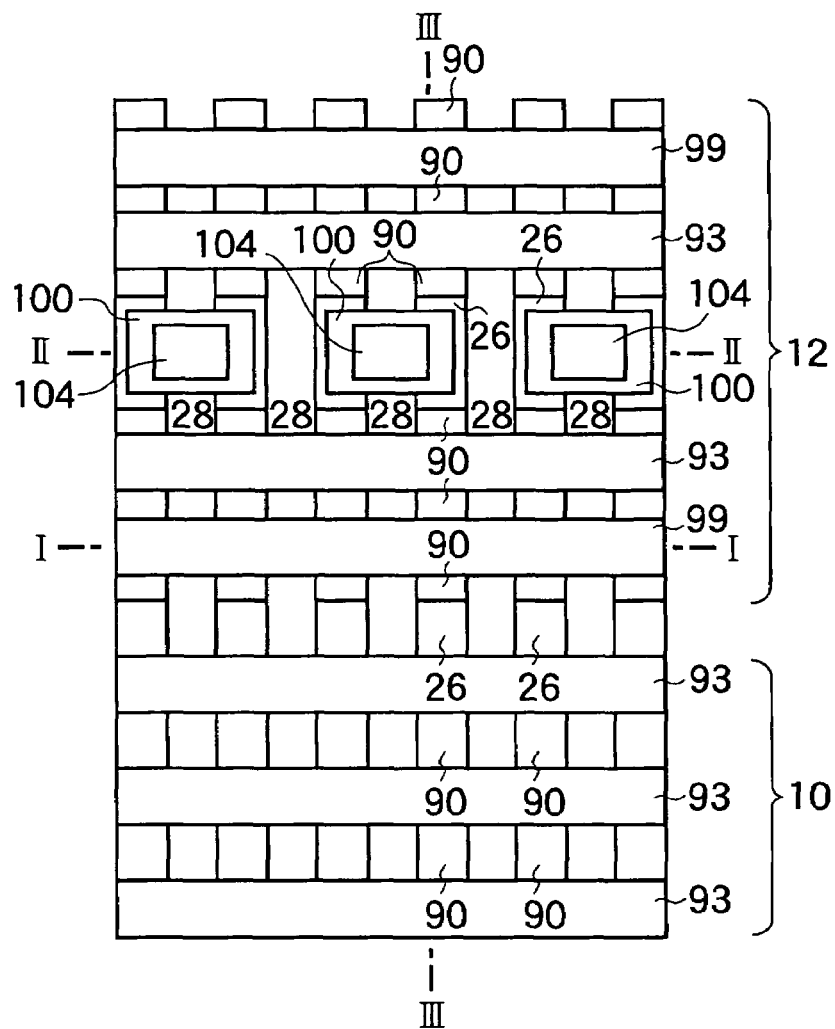
Figure 134:
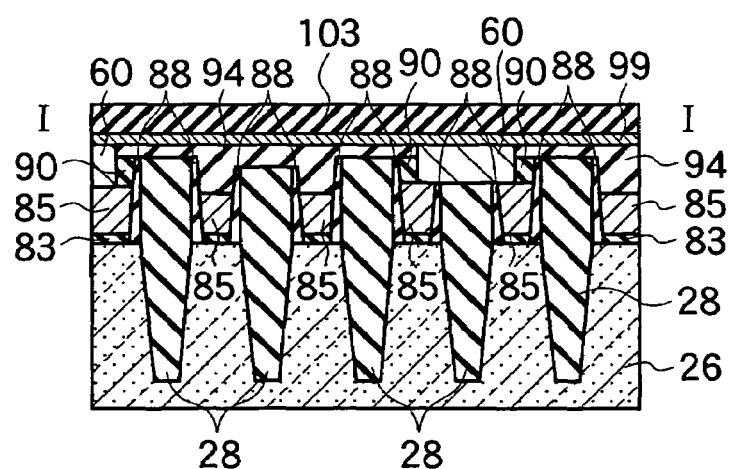
Figure 135:
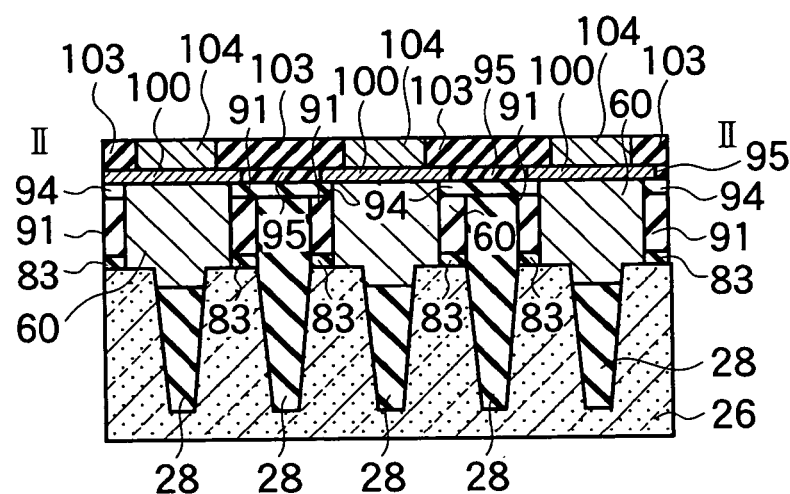
Figure 136:
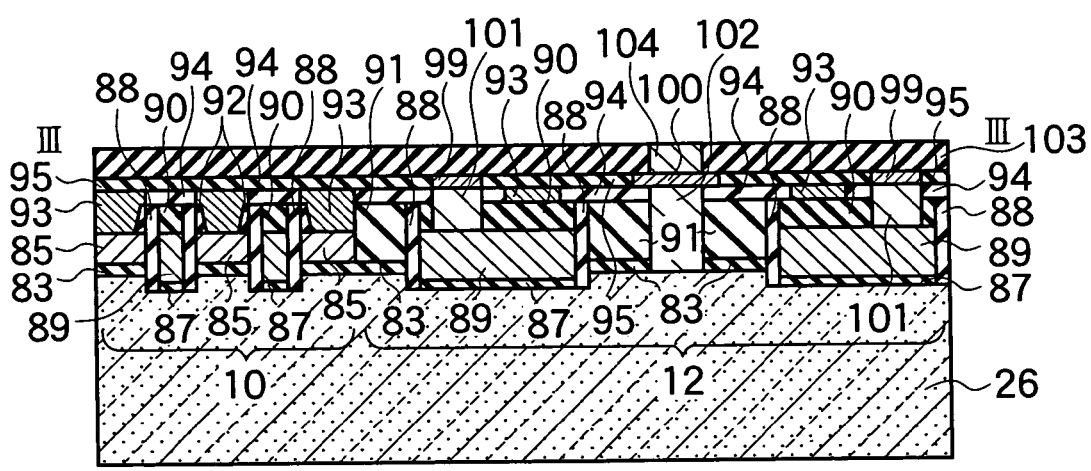
Figure 137:
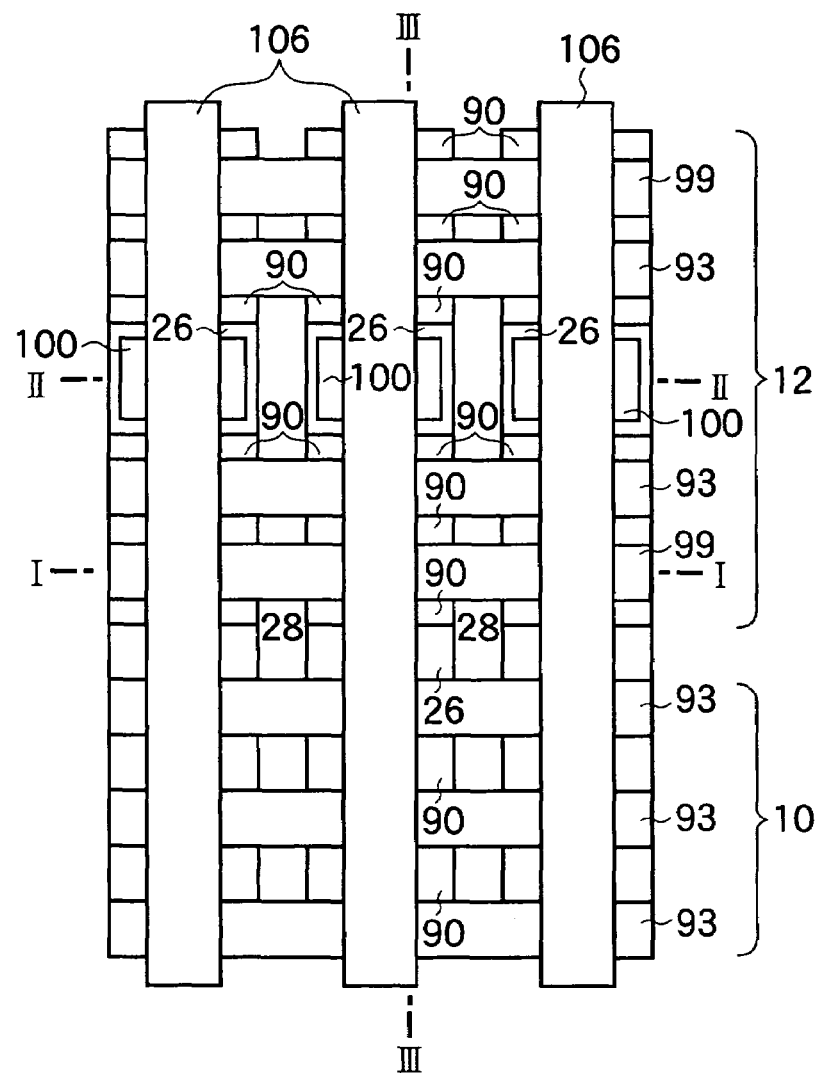
Figure 138:
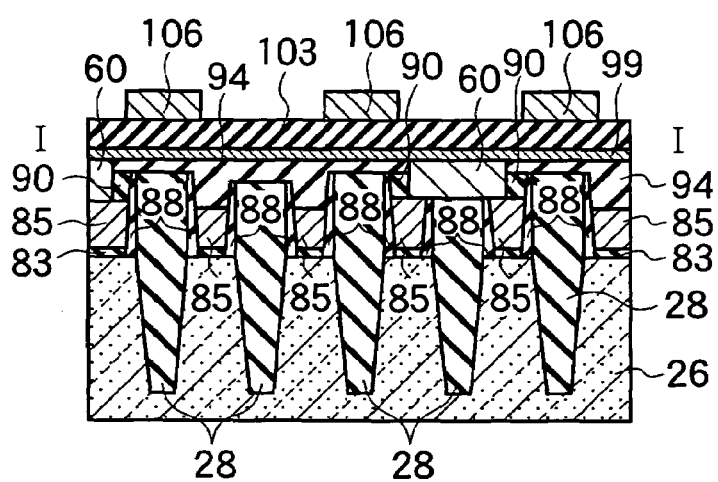
Figure 139:
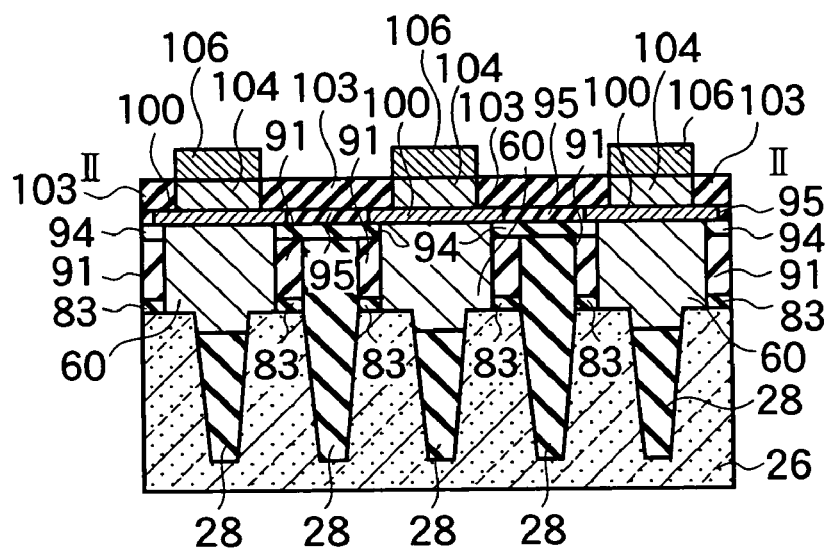
Figure 140:
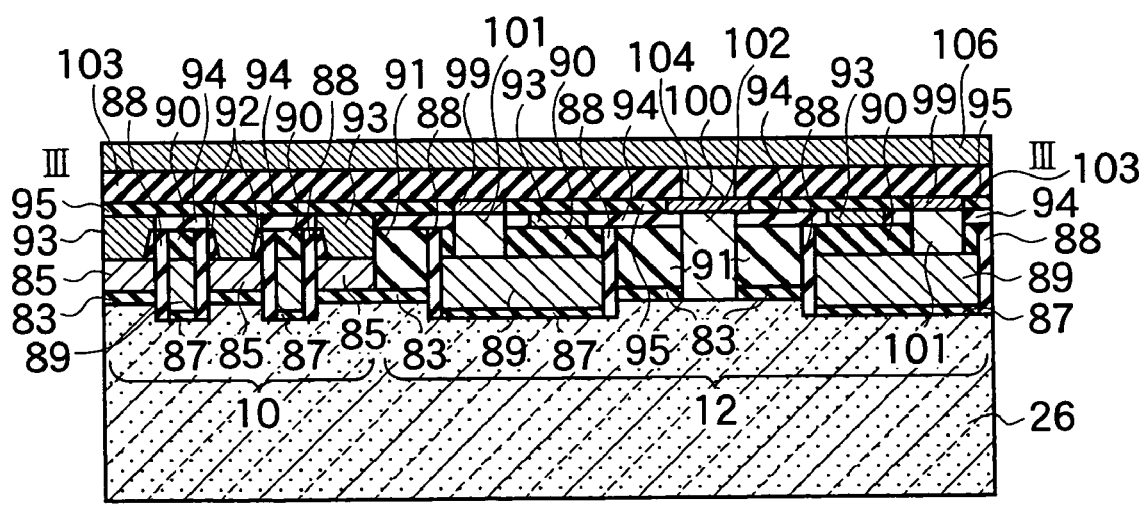
Figure 141:
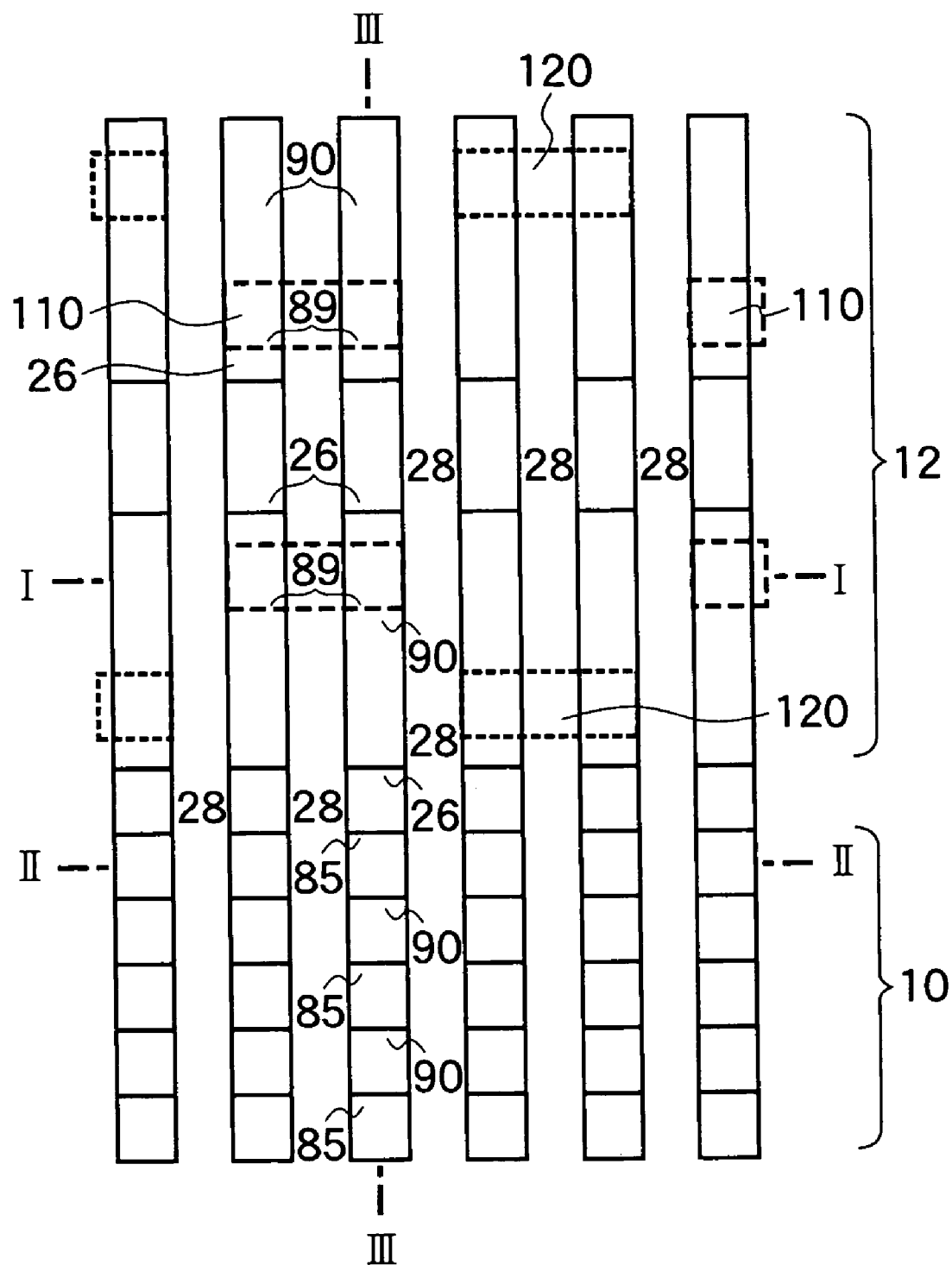
Figure 142:
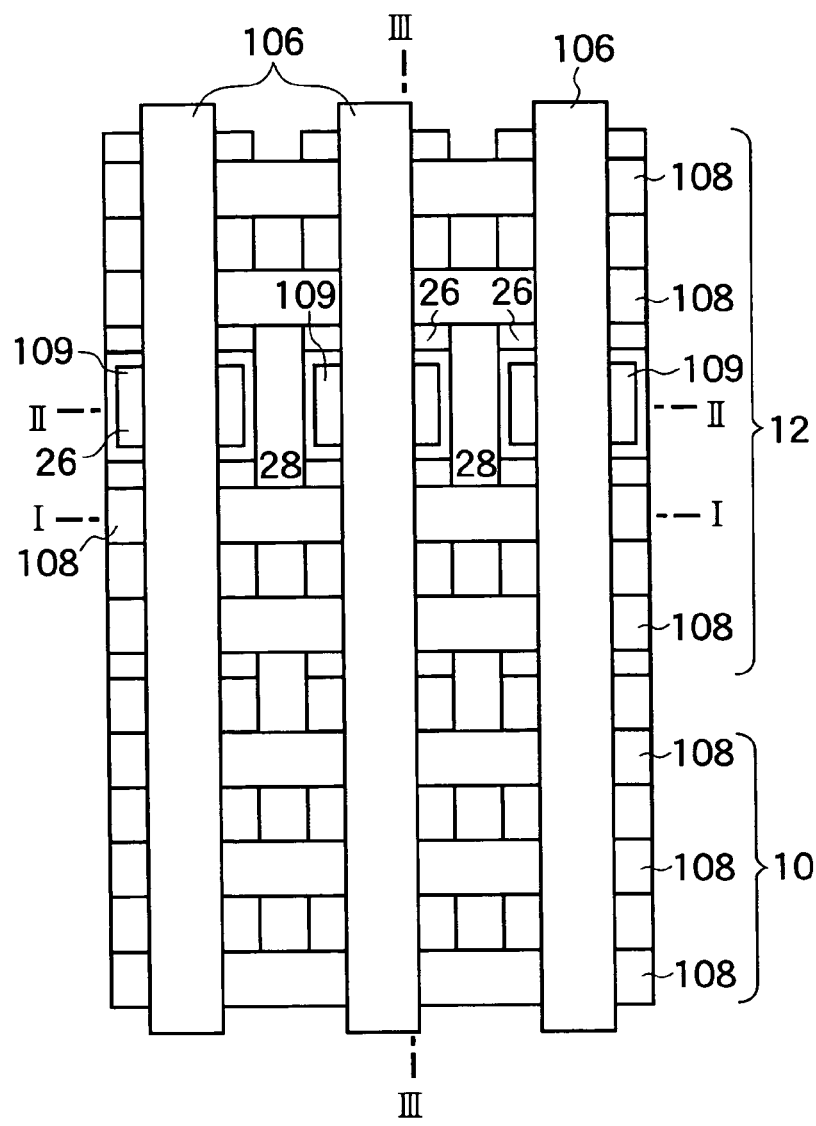
Figure 143:
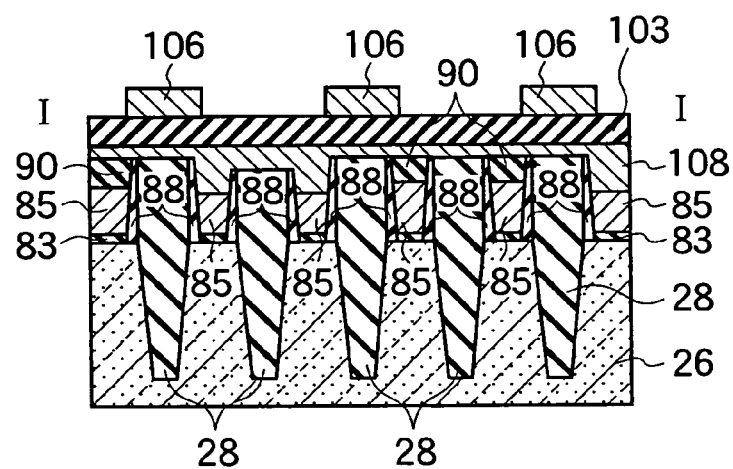
Figure 144:
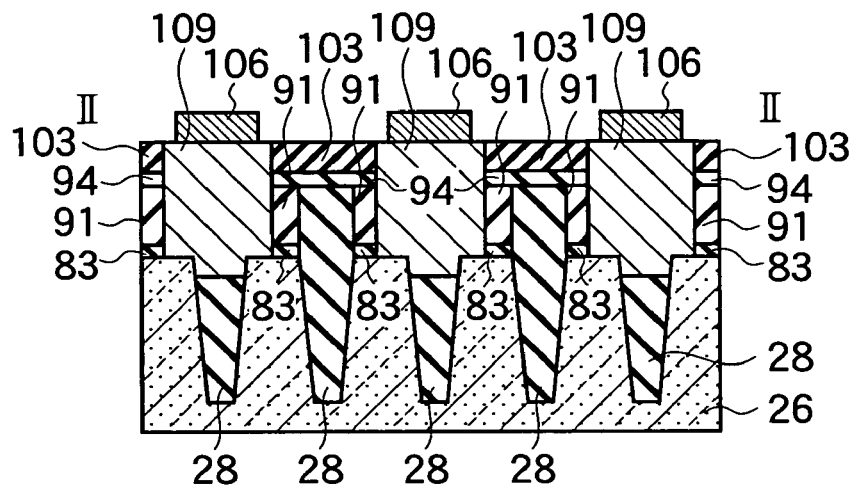
Figure 145:
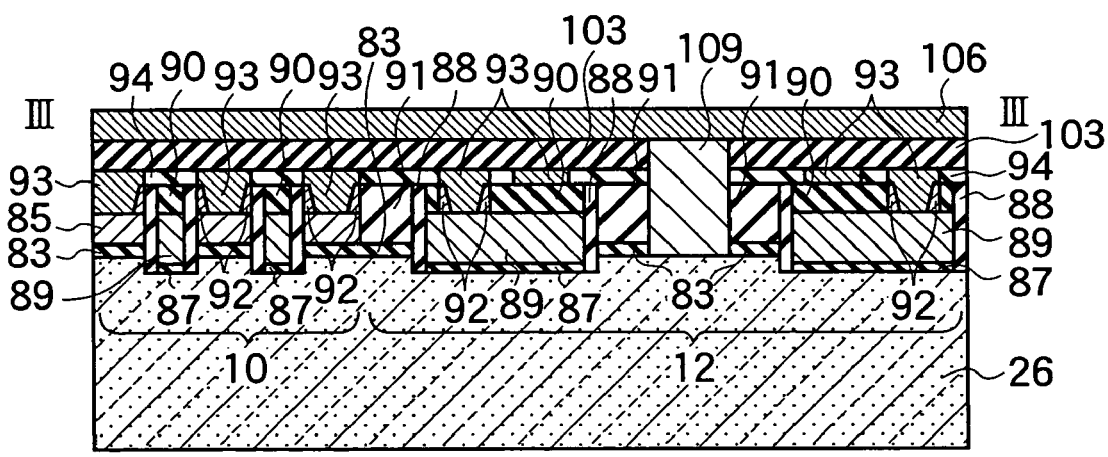
Figure 146:
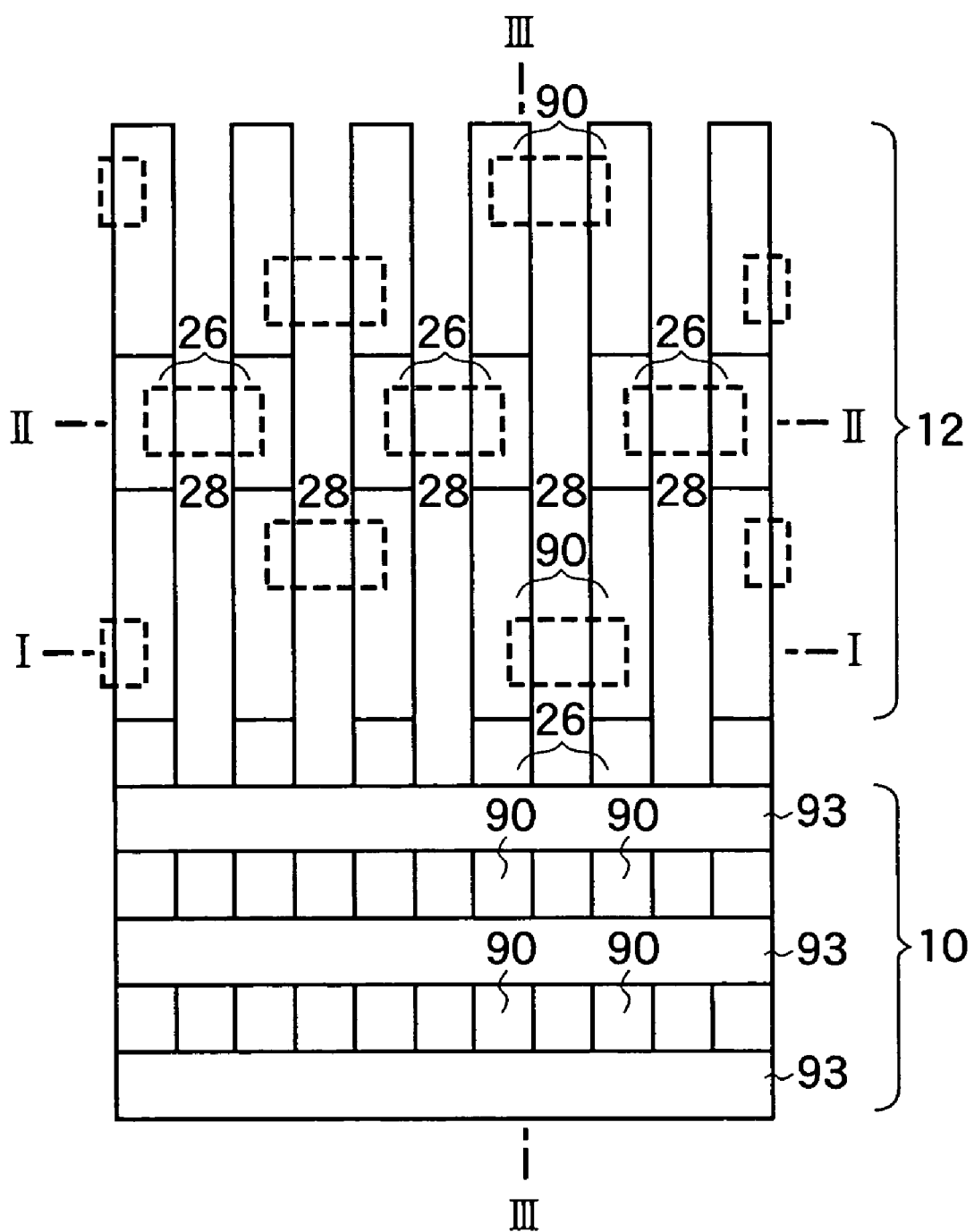
Figure 147:
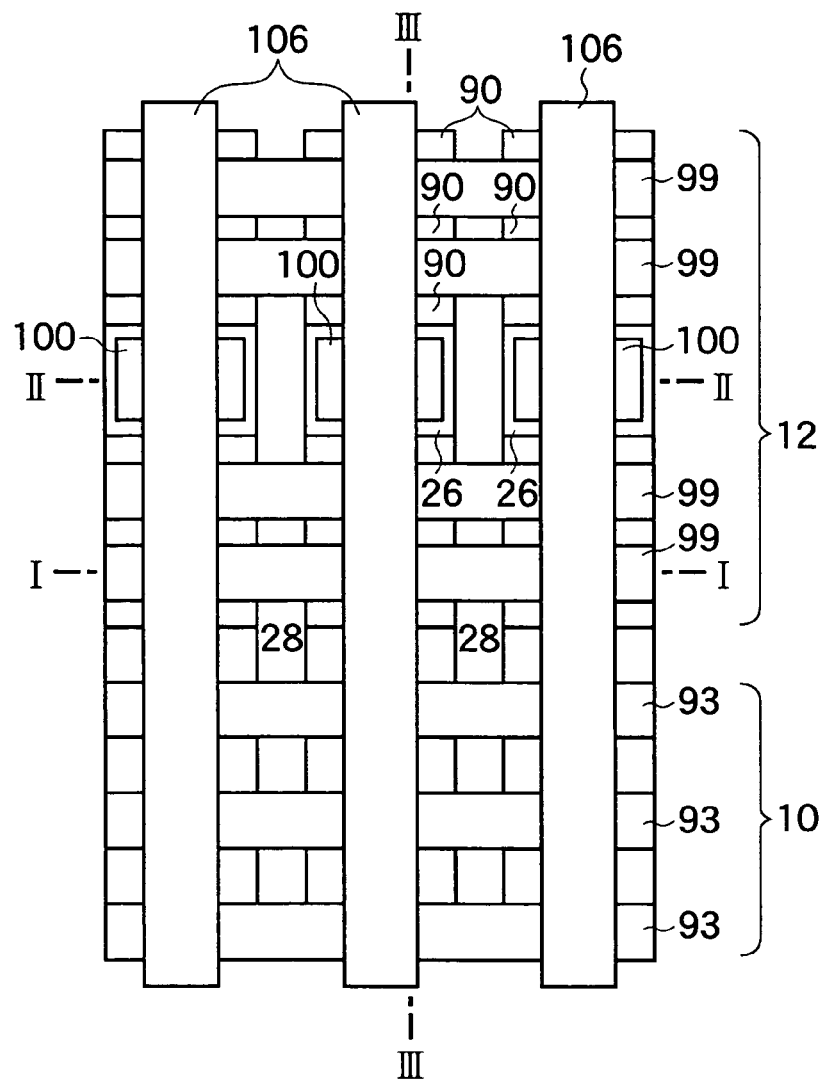
Figure 148:
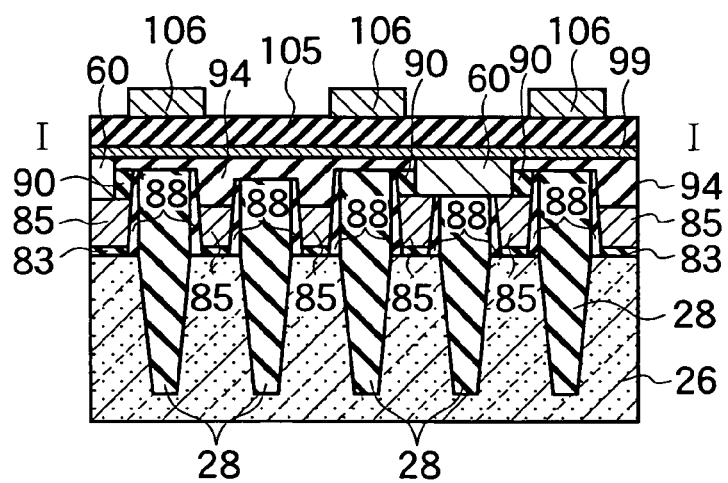
Figure 149:
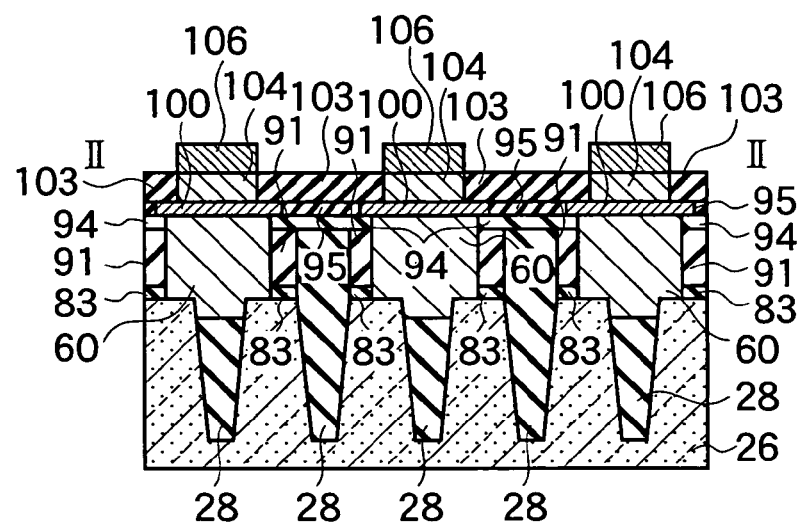
Figure 150:
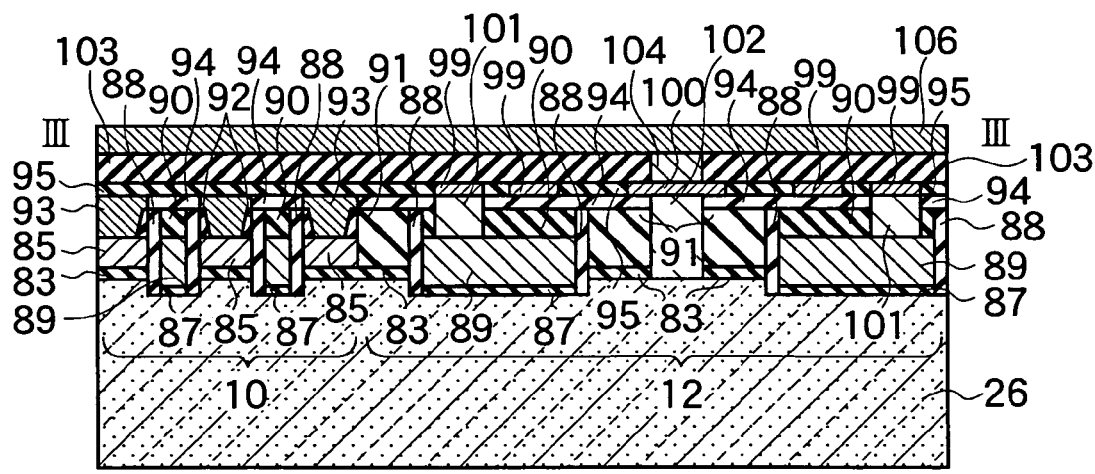
Figure 151:
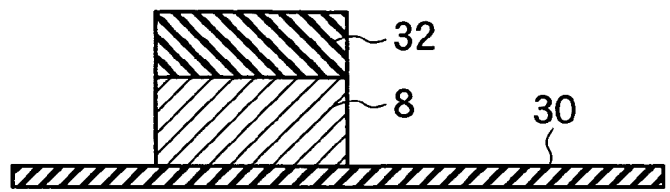
Figure 152:
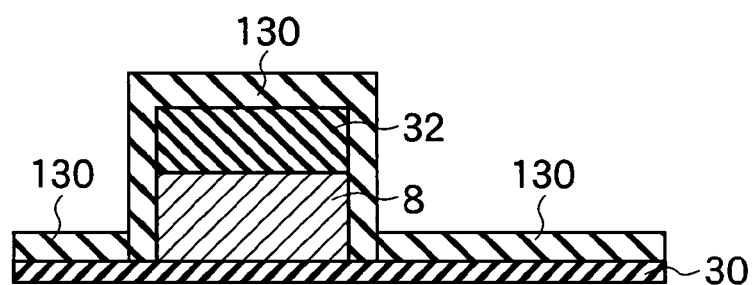
Figure 153:
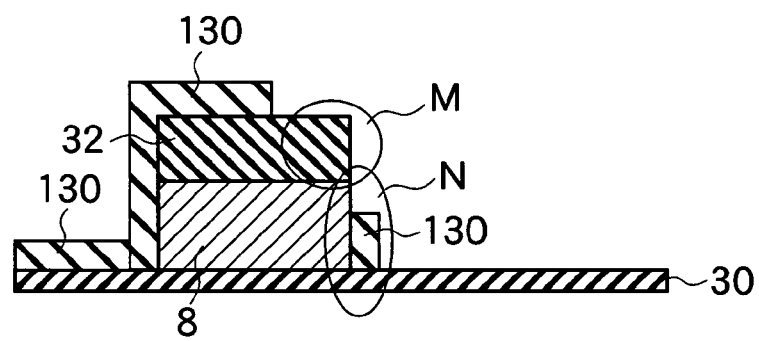
Figure 154:
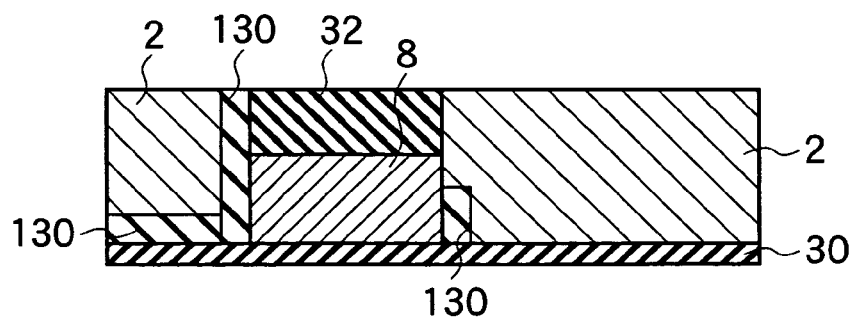
Figure 155:
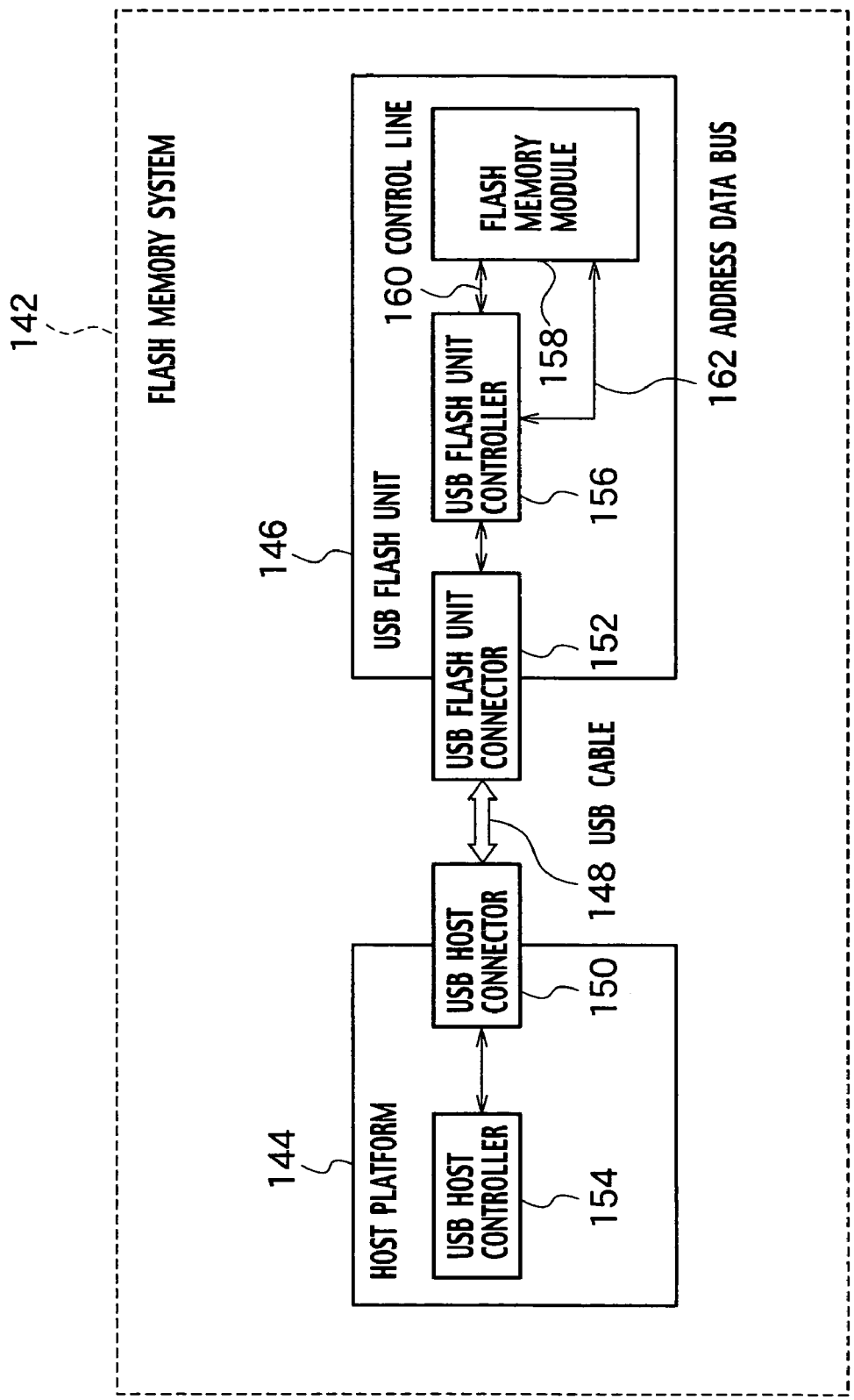

FIG. 121 is a top view of a schematic device pattern in a process of the nonvolatile semiconductor memory fabrication method according to the fifth embodiment of the present invention;

FIG. 122 is a schematic cross-sectional block diagram cut along the line I-I of FIG. 121;

FIG. 123 is a schematic cross-sectional block diagram cut along the line II-II of FIG. 121;

FIG. 124 is a schematic cross-sectional block diagram cut along the line III-III of FIG. 121;

FIG. 125 is a top view of a schematic device pattern in a process of the nonvolatile semiconductor memory fabrication method according to the fifth embodiment of the present invention;

FIG. 126 is a schematic cross-sectional block diagram cut along the line I-I of FIG. 125;

FIG. 127 is a schematic cross-sectional block diagram cut along the line II-II of FIG. 125;

FIG. 128 is a schematic cross-sectional block diagram cut along the line III-III of FIG. 125;

FIG. 129 is a top view of a schematic device pattern in a process of the nonvolatile semiconductor memory fabrication method according to the fifth embodiment of the present invention;

FIG. 130 is a schematic cross-sectional block diagram cut along the line I-I of FIG. 129;

FIG. 131 is a schematic cross-sectional block diagram cut along the line II-II of FIG. 129;

FIG. 132 is a schematic cross-sectional block diagram cut along the line III-III of FIG. 129;

FIG. 133 is a top view of a schematic device pattern in a process of the nonvolatile semiconductor memory fabrication method according to the fifth embodiment of the present invention;

FIG. 134 is a schematic cross-sectional block diagram cut along the line I-I of FIG. 133;

FIG. 135 is a schematic cross-sectional block diagram cut along the line II-II of FIG. 133;

FIG. 136 is a schematic cross-sectional block diagram cut along the line III-III of FIG. 133;

FIG. 137 is a top view of a schematic device pattern in a process of the nonvolatile semiconductor memory fabrication method according to the fifth embodiment of the present invention;

FIG. 138 is a schematic cross-sectional block diagram cut along the line I-I of FIG. 137;

FIG. 139 is a schematic cross-sectional block diagram cut along the line II-II of FIG. 137;

FIG. 140 is a schematic cross-sectional block diagram cut along the line III-III of FIG. 137;

FIG. 141 is a top view of a schematic device pattern in a process of a nonvolatile semiconductor memory fabrication method according to a sixth embodiment of the present invention;

FIG. 142 is a top view of a schematic device pattern in a process of the nonvolatile semiconductor memory fabrication method according to the sixth embodiment of the present invention;

FIG. 143 is a schematic cross-sectional block diagram cut along the line I-I of FIG. 142;

FIG. 144 is a schematic cross-sectional block diagram cut along the line II-II of FIG. 142;

FIG. 145 is a schematic cross-sectional block diagram cut along the line III-III of FIG. 142;

FIG. 146 is a top view of a schematic device pattern in a process of a nonvolatile semiconductor memory fabrication method according to a seventh embodiment of the present invention;

FIG. 147 is a top view of a schematic device pattern in a process of the nonvolatile semiconductor memory fabrication method according to the seventh embodiment of the present invention;

FIG. 148 is a schematic cross-sectional block diagram cut along the line I-I of FIG. 147;

FIG. 149 is a schematic cross-sectional block diagram cut along the line II-II of FIG. 147;

FIG. 150 is a schematic cross-sectional block diagram cut along the line III-III of FIG. 147;

FIG. 151 is a schematic cross-sectional block diagram in a process of a nonvolatile semiconductor memory fabrication method according to an eighth embodiment of the present invention;

FIG. 152 is a schematic cross-sectional block diagram in a process of the nonvolatile semiconductor memory fabrication method according to the eighth embodiment of the present invention;

FIG. 153 is a schematic cross-sectional block diagram in a process of the nonvolatile semiconductor memory fabrication method according to the eighth embodiment of the present invention;

FIG. 154 is a schematic cross-sectional block diagram in a process of the nonvolatile semiconductor memory fabrication method according to the eighth embodiment of the present invention; and FIG. 155 illustrates an application example of the nonvolatile semiconductor memory according to the first to the eighth embodiment of the present invention, and is a ninth embodiment of the present invention.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

In a NAND EEPROM, bit lines BL and bit line contacts CB, each connecting a bit line BL to the diffusion layer of a bit line BL side select gate transistor, are arranged with a pitch that is twice the NAND column pitch, where two NAND columns share a single bit line BL.

FIRST EMBODIMENT

Figure 4:
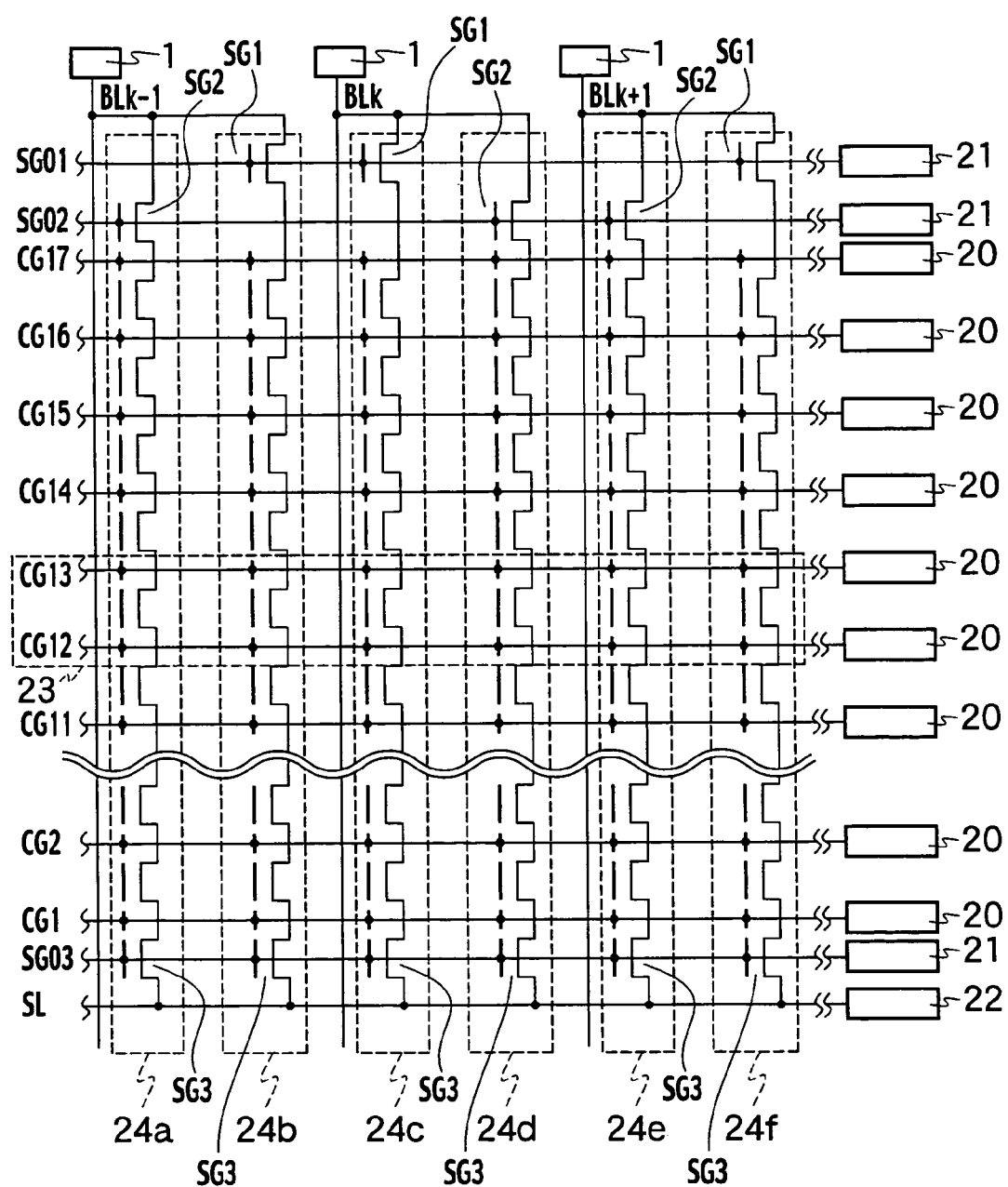
FIG. 4 is a schematic matrix circuit diagram of the nonvolatile semiconductor memory according to the first embodiment of the present invention.

A nonvolatile semiconductor memory according to a first embodiment of the present invention has circuitry and a device cross-sectional configuration as shown in FIGS. 1A and 1B. Memory cells MC have a sidewall control gate configuration where both sides of each floating gate (FG) 8 are sandwiched between control gates (CG) 2. Such memory cells MC are connected in series so as to configure a memory cell column. A select gate transistor SG1 or SG2 is located between such memory cell column and a bit line BLk; and two select gate lines SGD1 and SGD2 are connected in parallel with control gate lines CG0 to CG8. Here, an example of eight NAND columns is shown with the example in FIG. 1. The number of memory cell transistors to be connected to a single NAND column is not limited to 8; and as shown in FIG. 4, there may be 16 NAND columns or there may be 32 NAND columns. The number of NAND columns is merely a matter of design and is not limited in anyway. It should be noted that since each memory cell transistor or primitive element has a sidewall control gate structure, it is also apparent that 9 control gate lines CG are provided for 8 NAND columns, 17 for 16 NAND columns, and 33 for 32 NAND columns. Furthermore, a select gate transistor SG3 is provided between such memory cell column and a source line SL, and a single select gate line SGS is connected in parallel with the control gate lines CG0 to CG8. The memory cell column is connected to the bit line BLk via the select transistor SG1 or SG2 that is adjacent to CG8.

Similarly, the memory cell column is connected to the source line SL via the select gate transistor SG3 that is adjacent to CG0. The select gate lines SGD1, SGD2 and SGS are connected to the respective gates of the select gate transistors SG1, SG2 and SG3. As is apparent from FIG. 1, two memory cell columns are connected to bit line side select gate transistors SG1 and SG2 respectively and alternately, so as to share a single bit line BLk, saving space in the bit line contact CB and improving integration. As is shown in FIG. 1B, the bit line BL side of the memory cell column is connected to a bit line contact region 14 via the select gate line SGD1 or SGD2 of the bit line side select gate transistor SG1 or SG2, and the source line SL side of the memory cell column is connected to a source line contact region 16 via the select gate line SGS of the source line side select gate transistor SG3. Further regarding the memory cell column, a configuration including such source side select gate transistor SG1 or SG2 as well as the bit line side select gate transistor SG3 is called a 'memory cell unit' or 'memory cell block'. The structure in FIG. 1A can be called a 'NAND memory cell unit' or 'NAND memory cell block' since each memory cell column has NAND memory cells connected in series Accordingly, it is apparent that the circuitry of FIG. 1A has a configuration where two columns of NAND memory cell units are illustrated and share a single bit line BLk.

The structure in FIG. 1B corresponds to a schematic cross-sectional configuration of a single NAND memory cell unit within the circuitry of FIG. 1A, as well as a schematic cross-sectional configuration cut along the line IV-IV in the top view of a layout pattern of FIG. 2B hereafter described. N-type diffusion layers 18 formed in a p-well or silicon semiconductor substrate 26 are the source and the drain regions of the memory cell transistors, and the floating gates (FG) 8 are formed and arranged on respective channel regions, which are sandwiched between the source and drain regions, via an insulating film.

With the example described above, an example with two bit line side select gate lines (SGD1 and SGD2) and a single source side select gate line (SGS) is given; however, the present invention is not limited thereto; in short, the present invention only needs to be a structure that reduces the number of bit line contacts, cutting down on the number of contacts. Accordingly, the number of bit line side select gate lines may be three, or may be increased. The source side select gate is also not limited to one, but may be two, as hereafter described. The number of lines may be increased as well.

Figure 3A:
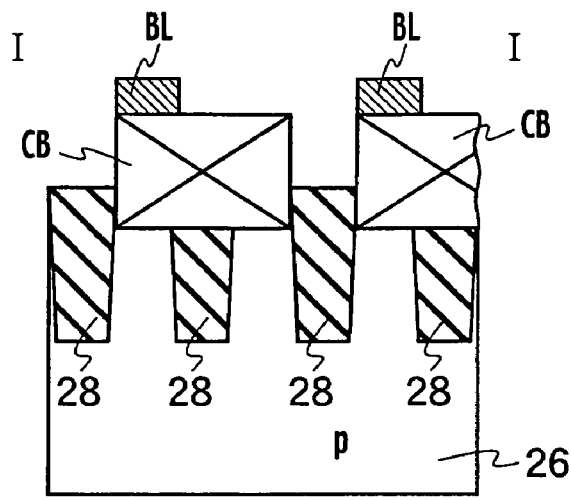
FIG. 3A is a schematic device cross-sectional block diagram of the nonvolatile semiconductor memory according to the first embodiment of the present invention, and is a cross-sectional configuration cut along I-I of FIG. 2B.
Figure 3B:
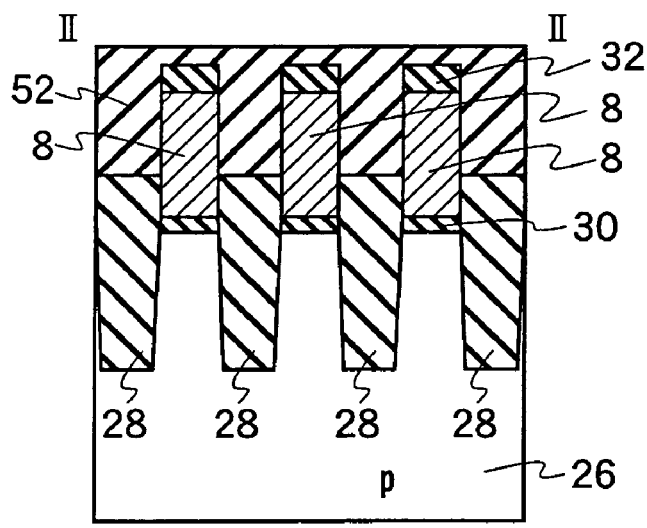
FIG. 3B is a cross-sectional configuration cut along II-II of FIG. 2B.
Figure 3C:
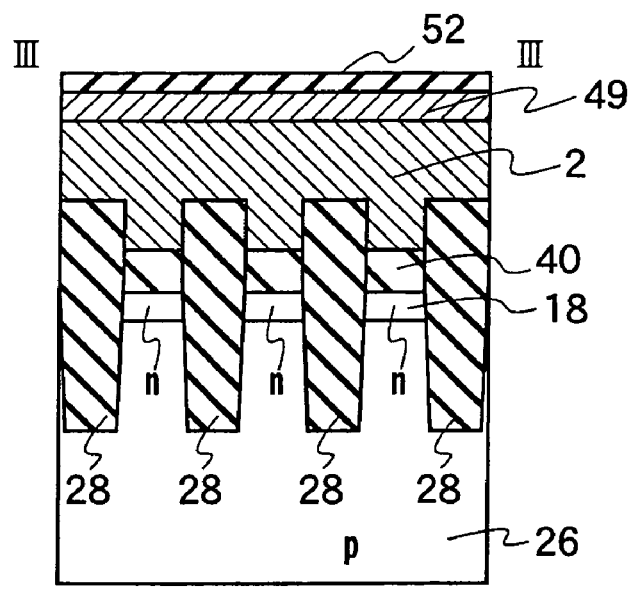
FIG. 3C is a cross-sectional configuration cut along III-III of FIG. 2B.

FIGS. 2A and 2B are a schematic circuit diagram and a top view of a schematic layout pattern of a nonvolatile semiconductor memory according to the first embodiment of the present invention. FIGS. 2A and 2B are depicted as corresponding to each other in which only the arrangement of a single bit line BLk for two NAND memory cell units is necessary since a single bit line contact CB is shared by two NAND memory cell units. The device cross-sectional structures cut along the lines I-I, II-II and III-III of FIG. 2B are as shown in FIGS. 3A, 3B, and 3C, respectively. Furthermore, the device cross-sectional structure cut along the line IV-IV is schematically shown in FIG. 1B. As apparent from FIG. 3A, compared to the case where a bit line contact CB is arranged for each bit line, there can be sufficient space between bit line contacts CB. Particularly, there are problems in a minute nonvolatile semiconductor memory with such a 55 nm scale, where alignment margins are insufficient and the manufacturing yield drops due to very small distances between contact holes that emanate from the bit line contacts CB arrangement. These problems can be resolved by the configuration of the first embodiment of the present invention.

The cross-sectional structure cut along the line II-II of FIG. 2B is a cross-sectional structure of part of floating gates (FG) 8, as is apparent from FIG. 3B. The floating gates (FG) 8 are formed on a first gate insulating film 30, which acts as a tunnel gate insulating film. Channel regions exist within the p-well 26, however, the channel regions are formed sandwiched between device isolating regions 28. A cap insulating film 32 as a second insulating film is formed on the floating gates (FG) 8, and further, a interlayer insulating layer 52 covers the entire surface of the device.

Figure 18:
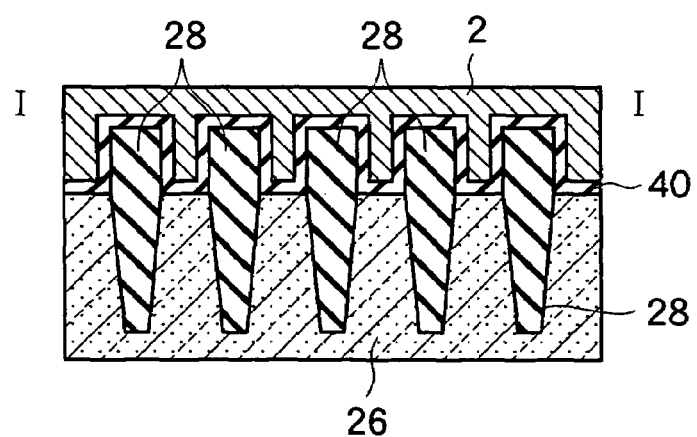
FIG. 18 is a schematic cross-sectional block diagram cut along the line I-I of FIG. 17.
Figure 19:
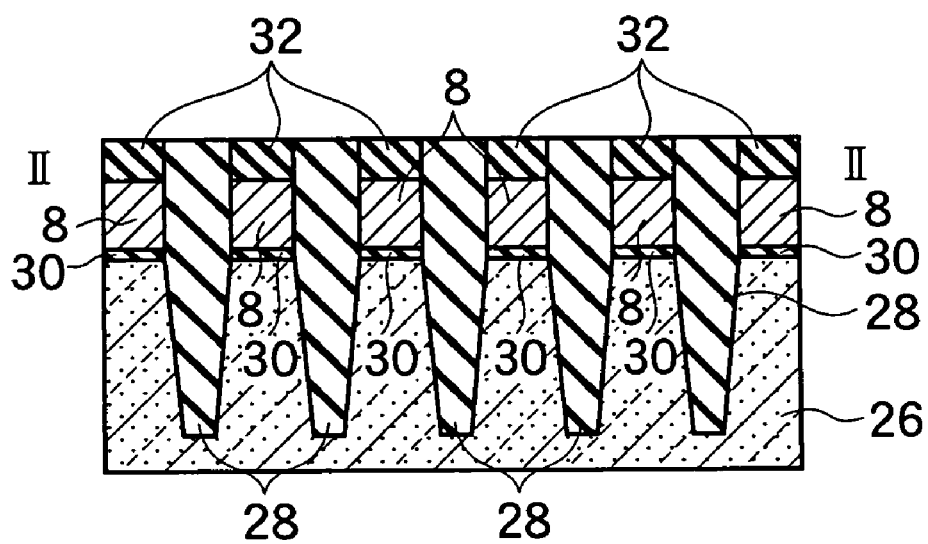
FIG. 19 is a schematic cross-sectional block diagram cut along the line II-II of FIG. 17.

The cross-sectional structure cut along the line III-III of FIG. 2B is a cross-sectional structure of part of a control gate (CG) 2, as is apparent from FIG. 3C. The control gate (CG) 2 is formed on a third insulating film 40, which acts as a inter-gate insulating film. The n-type diffusion layers 18 are the source and the drain regions of the memory cell transistors, however, the diffusion layers 18 are formed sandwiched between the device isolating regions 28. A metal salicide film 49 is formed on the control gate (CG) 2, and further, the interlayer insulating layer 52 covers the entire surface of the device. It should be noted that the third insulating film 40 also acts as an inter-gate insulating film as described below with FIG. 18 and the like. The inter-gate insulating film 40 formed at sidewalls of the control gate 2 in FIG. 3C is omitted for simplification of description. However, for practical purposes, this configuration is described in detail in the following section regarding a fabrication method. Furthermore, since the source line contacts CS shown in FIG. 2B are electrically connected in common to the source line SL, the electrical isolation between the bit line contacts CB is not required between the source line contacts CS.

A matrix circuitry of the nonvolatile semiconductor memory according to the first embodiment of the present invention, as shown in FIG. 4, is configured with six NAND memory cell units 24a to 24f, control gate lines CG1 to CG17, select gate lines SG01 to SG03, bit lines BLk−1, BLk, and BLk+1, a source line SL, bit line drive circuits 1, control gate line drive circuits 20, select gate line drive circuits 21, and a source line drive circuit 22. Each of the NAND memory cell units 24a to 24f in the example of FIG. 4 includes 16 memory cell transistors connected in series, a single bit line side select gate transistor SG1 or SG2 that includes the select gate line SG01 or SG02 located adjacent to the control gate line CG17, and a single source line side select gate transistor SG3 that includes the select gate line SG03 adjacent to the control gate line CG1, and is connected to the bit line BL and the source line SL via the above select gate transistors. Furthermore, in FIG. 4, a single row of memory cells equivalent to one page in a page mode can be defined by all memory cell transistors 23, which are sandwiched between two control gate lines CG12 and CG13, for example.

More generally, as shown in FIG. 4, a nonvolatile semiconductor memory of the first embodiment of the present invention includes: a first memory cell column 24a, 24c, 24e and a second memory cell column 24b, 24d, 24f, each of the memory cell column includes a plurality of memory cell transistors connected in series and a gate structure as a floating gate and a first and a second control gate located at both sides of the floating gate; a first select gate transistor SG2 connected between the first memory cell column 24a and a bit line BLk−1; a second select gate transistor SG1 connected between the second memory cell column 24b and the bit line BLk−1, and bit line contacts connecting a bit line BLk−1 to a diffusion layer of the first and the second select gate transistor SG2, SG1 provided at a pitch twice the pitch of the memory cell column 24a~24f....

As shown in FIG. 4, the nonvolatile semiconductor memory of the first embodiment of the present invention further includes: a plurality of control gate lines CG1~CG17 . . . connected to the first and the second control gate, respectively, and perpendicular to the bit line BLk−1~BLk+1 . . . ; a first select gate line SG02 connected to the gate of the first select gate transistor SG2 and parallel to the plurality of control gate lines CG1~CG17 . . . ; a second select gate line SG01 connected to the gate of the second select gate transistor SG1 and parallel to the plurality of control gate lines CG1~CG17 . . . ; third select gate transistors SG3 connected between the first memory cell column 24a, 24c, 24e, . . . and a source line SL and also between the second memory cell column 24b, 24d, 24f, . . . and the source line SL, respectively; and a third select gate line SG03 connected to the gate of the third select gate transistor SG3 and parallel to the plurality of control gate lines CG1~CG17 . . . .

As shown in FIG. 4, the nonvolatile semiconductor memory of the first embodiment of the present invention further includes: a bit line drive circuit 1 connected to the bit line BLk−1~BLk+1 . . . ; a control gate line drive circuit 20 connected to the control gate line CG1~CG17 . . . ; a select gate line drive circuit 21 connected to the select gate line SG01, SG02, SG03; and a source line drive circuit 22 connected to the source line SL.

Figure 20:
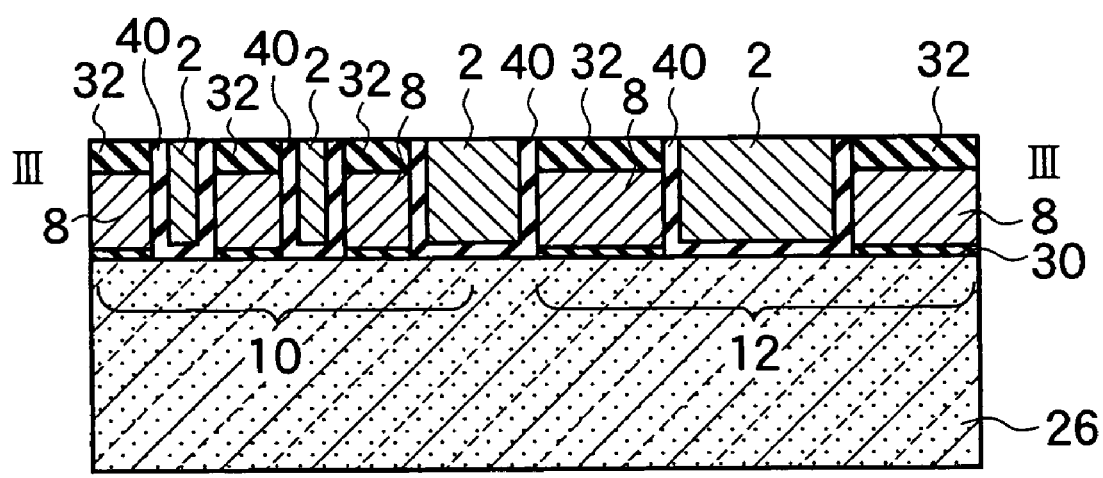
FIG. 20 is a schematic cross-sectional block diagram cut along the line III-III of FIG. 17.
Figure 21:
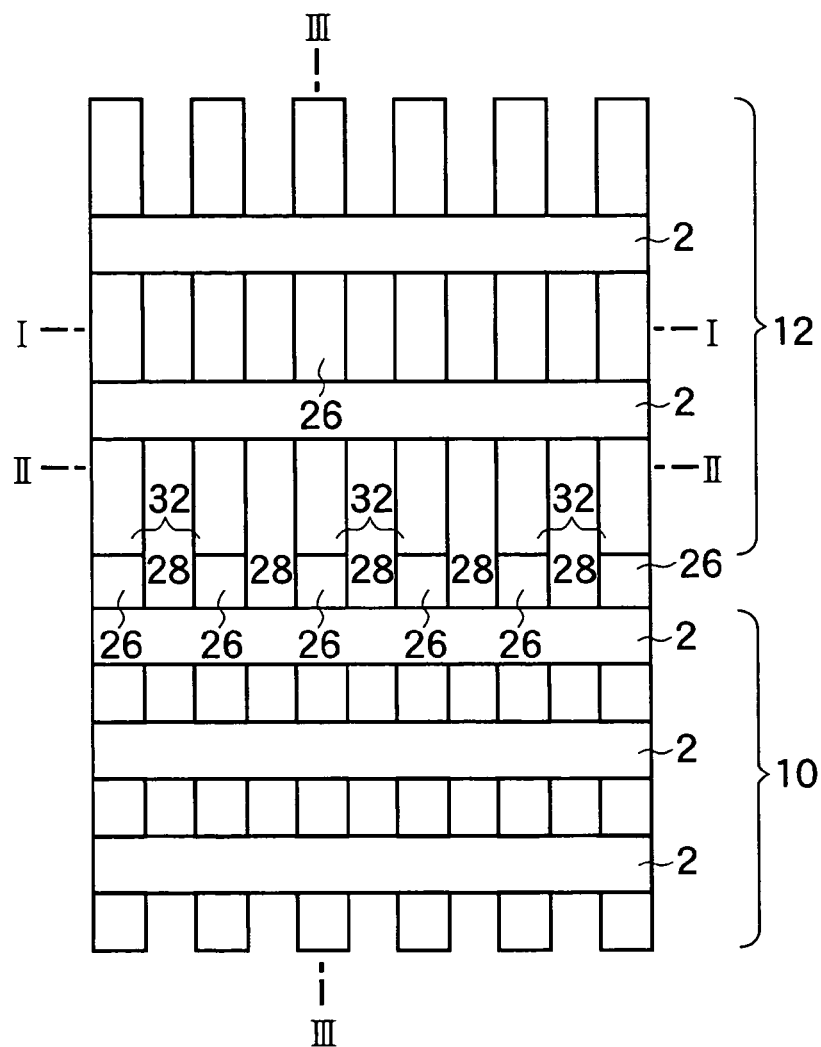
FIG. 21 is a top view of a schematic device pattern in a process of the nonvolatile semiconductor memory fabrication method according to the second embodiment of the present invention.
Figure 22:
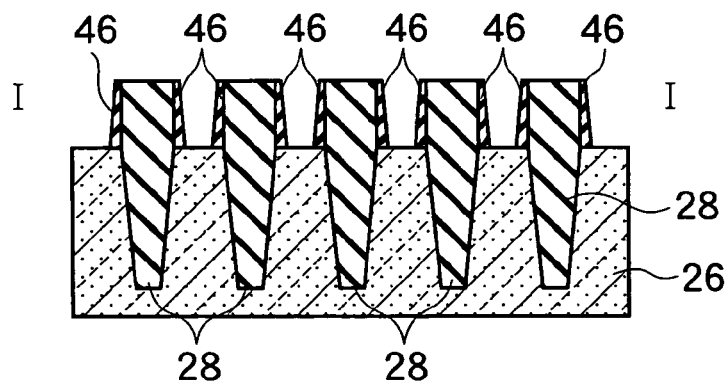
FIG. 22 is a schematic cross-sectional block diagram cut along the line I-I of FIG. 21.
Figure 23:
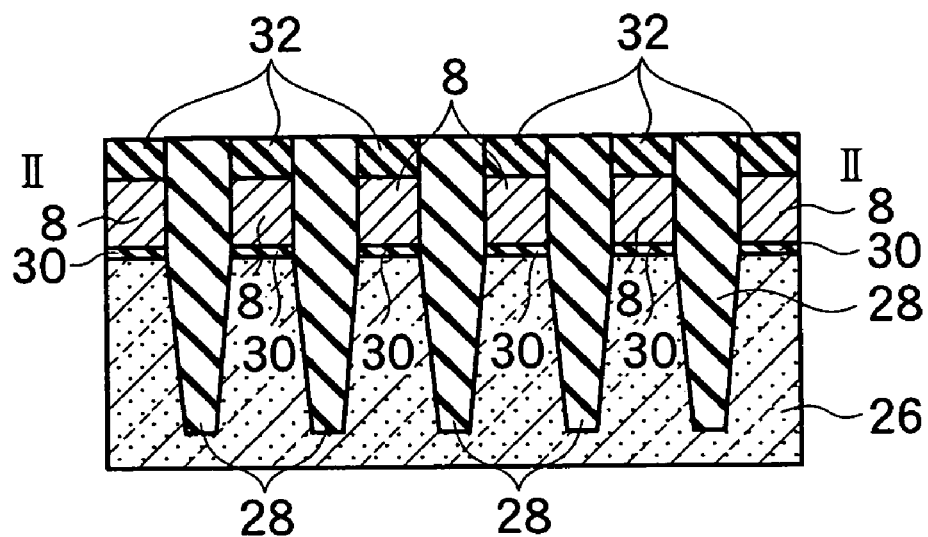
FIG. 23 is a schematic cross-sectional block diagram cut along the line II-II of FIG. 21.
Figure 24:
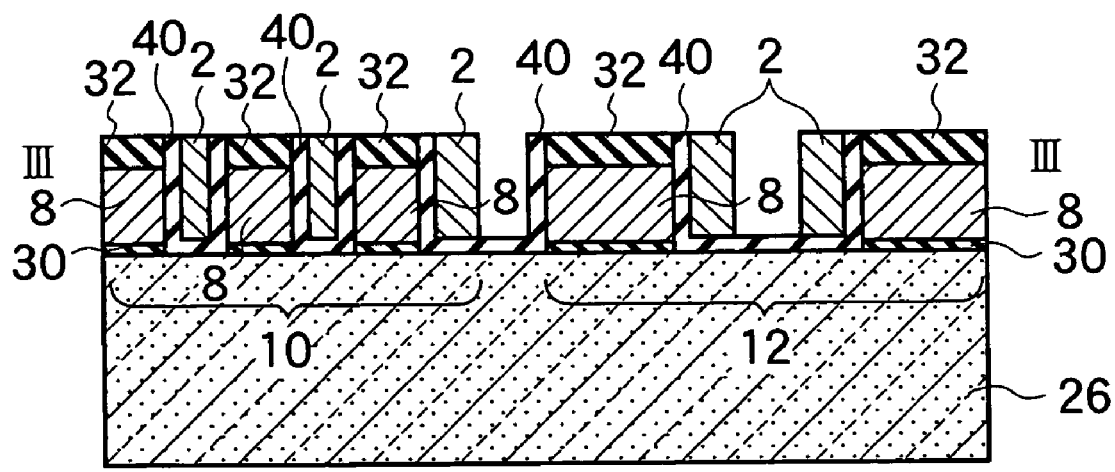
FIG. 24 is a schematic cross-sectional block diagram cut along the line III-III of FIG. 21.
Figure 25:
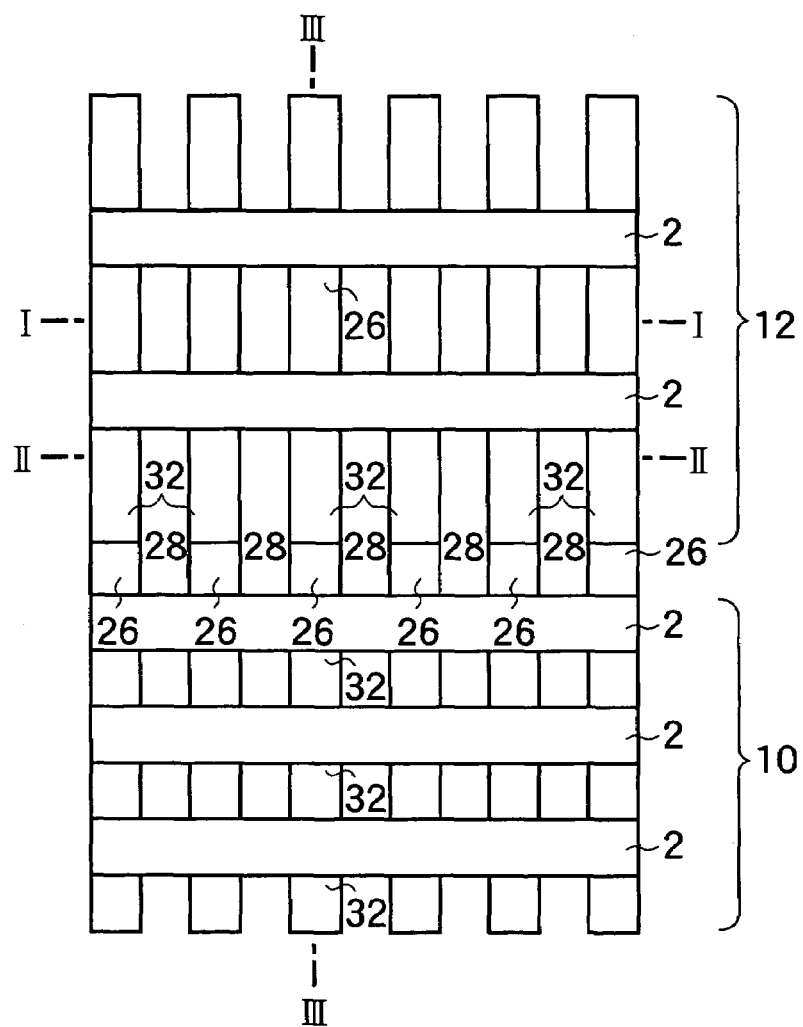
FIG. 25 is a top view of a schematic device pattern in a process of the nonvolatile semiconductor memory fabrication method according to the second embodiment of the present invention.
Figure 26:
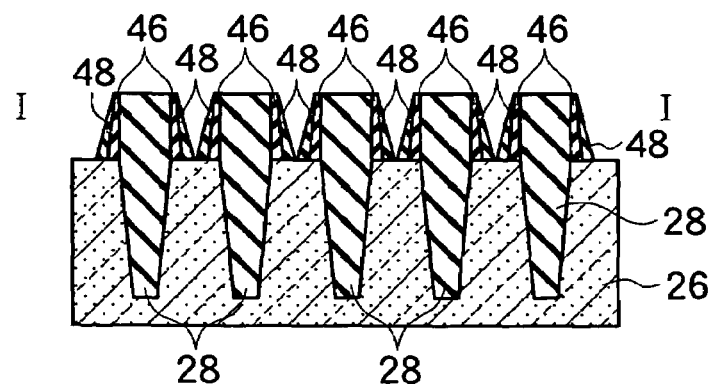
FIG. 26 is a schematic cross-sectional block diagram cut along the line I-I of FIG. 25.
Figure 27:
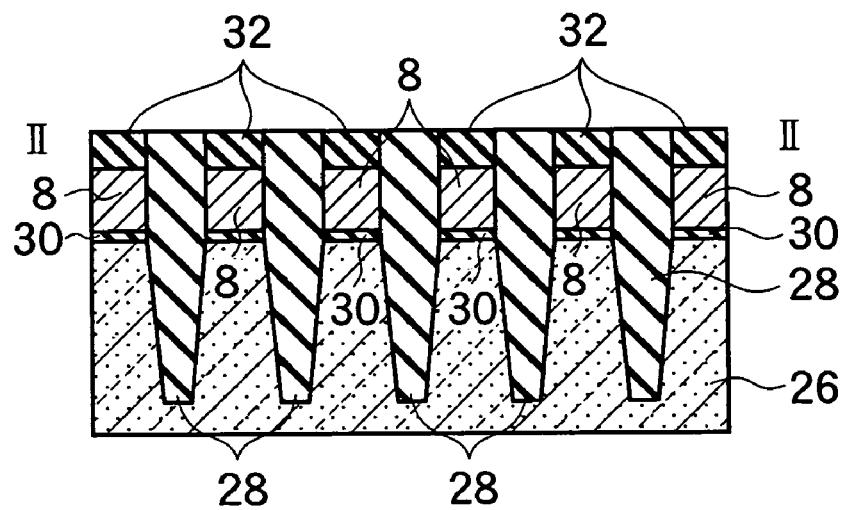
FIG. 27 is a schematic cross-sectional block diagram cut along the line II-II of FIG. 25.
Figure 28:
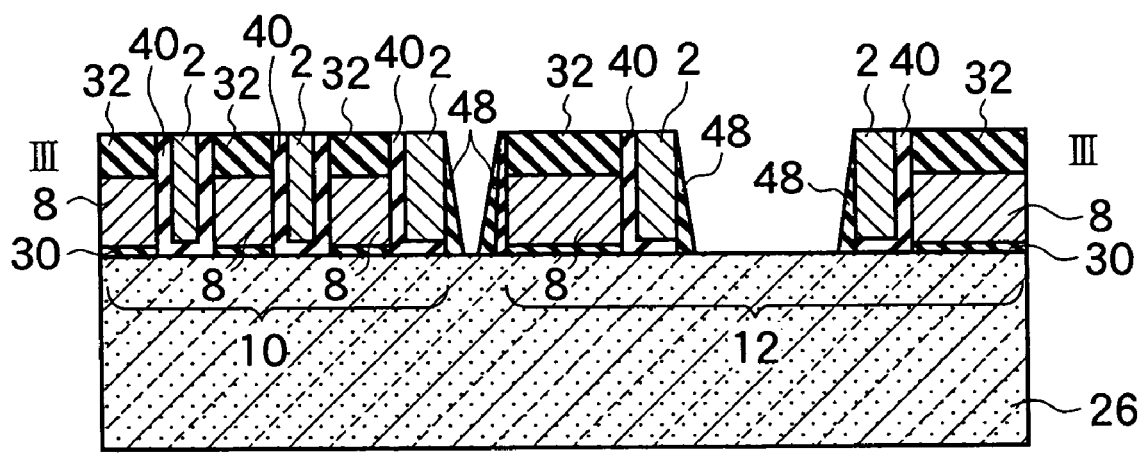
FIG. 28 is a schematic cross-sectional block diagram cut along the line III-III of FIG. 25.
Figure 29:
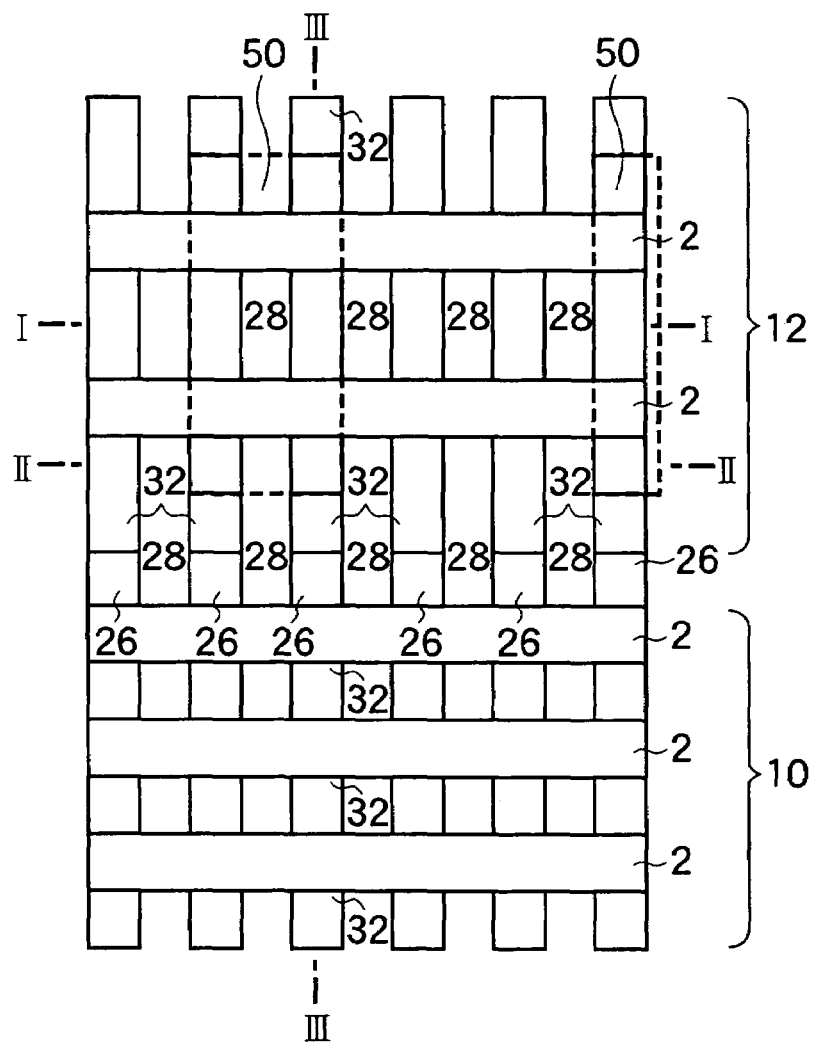
FIG. 29 is a top view of a schematic device pattern in a process of the nonvolatile semiconductor memory fabrication method according to the second embodiment of the present invention.
Figure 30:
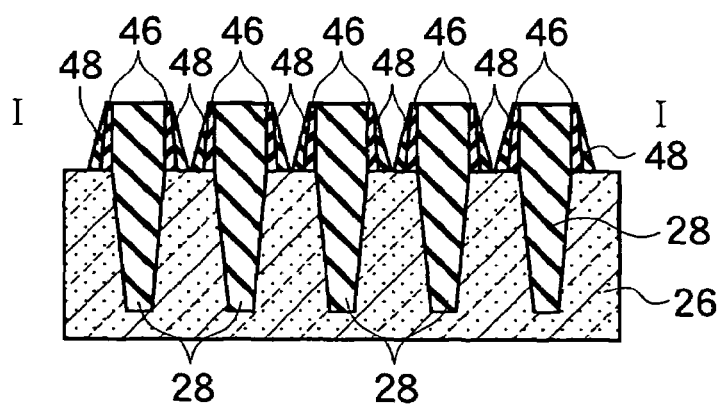
FIG. 30 is a schematic cross-sectional block diagram cut along the line I-I of FIG. 29.
Figure 31:
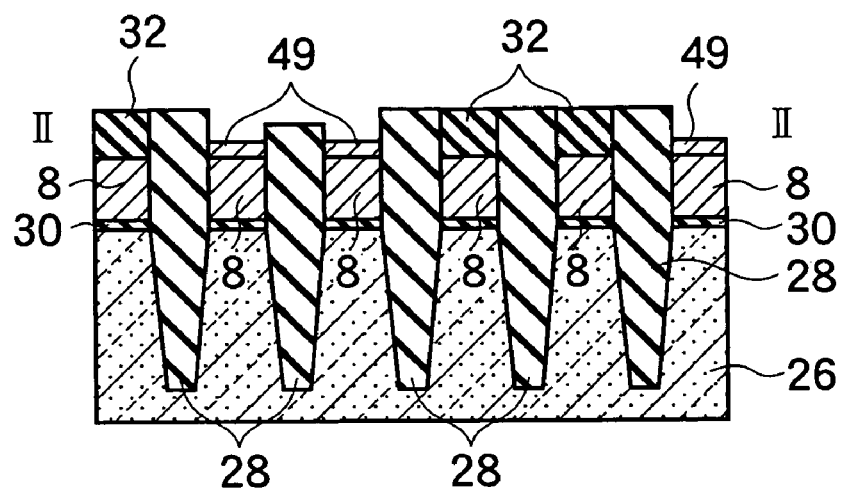
FIG. 31 is a schematic cross-sectional block diagram cut along the line II-II of FIG. 29.
Figure 32:
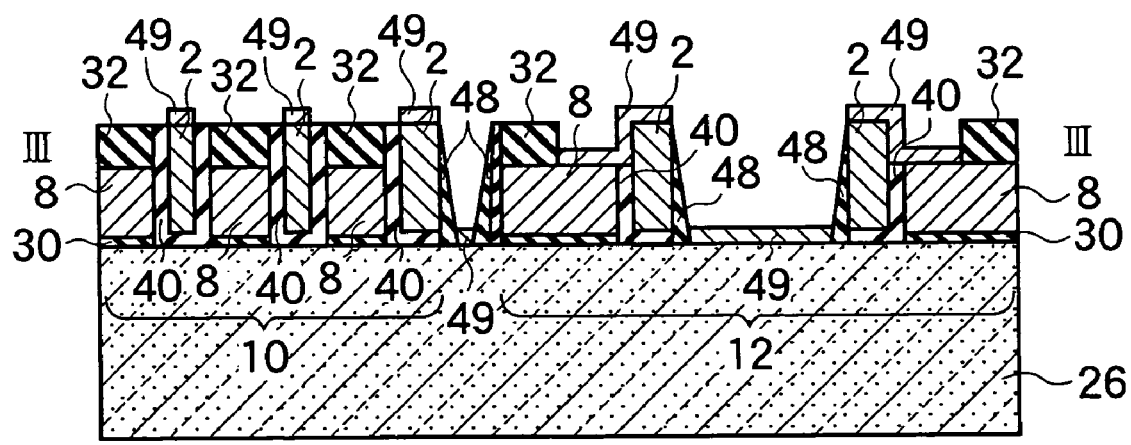
FIG. 32 is a schematic cross-sectional block diagram cut along the line III-III of FIG. 29.
Figure 33:
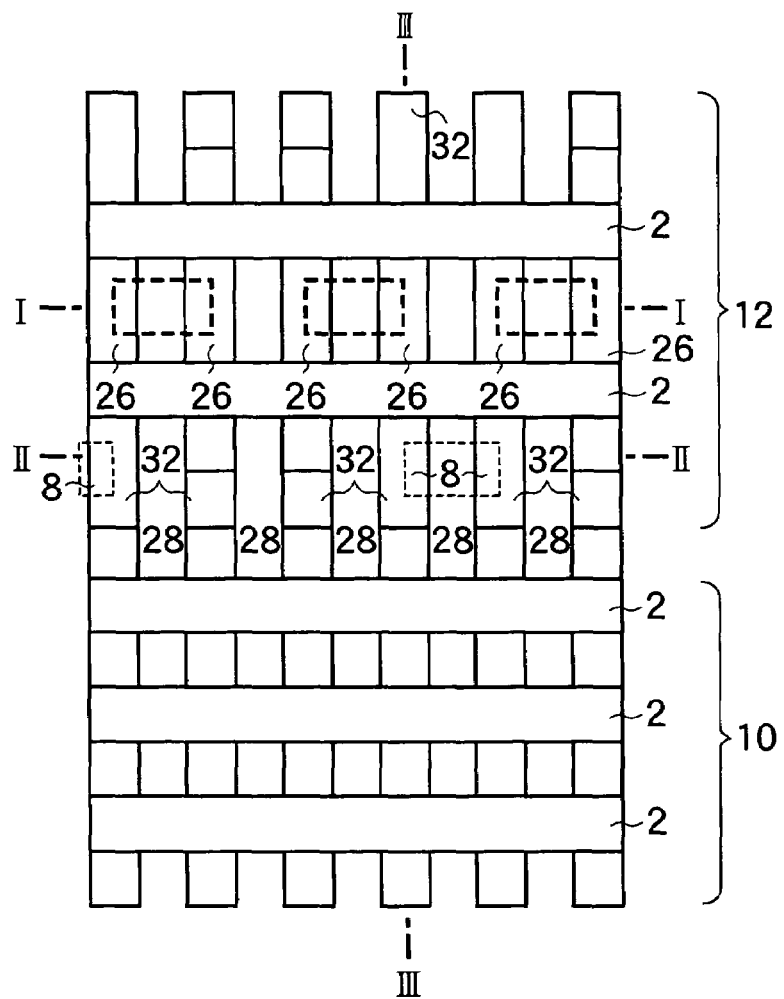
FIG. 33 is a top view of a schematic device pattern in a process of the nonvolatile semiconductor memory fabrication method according to the second embodiment of the present invention.
Figure 34:
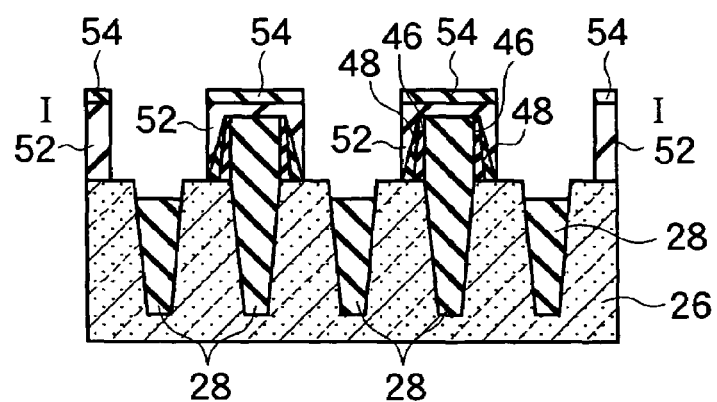
FIG. 34 is a schematic cross-sectional block diagram cut along the line I-I of FIG. 33.
Figure 35:
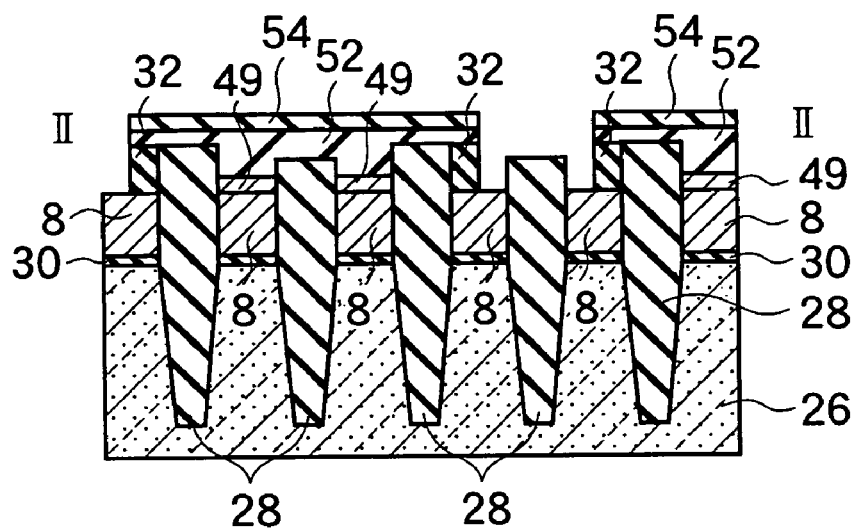
FIG. 35 is a schematic cross-sectional block diagram cut along the line II-II of FIG. 33.
Figure 36:
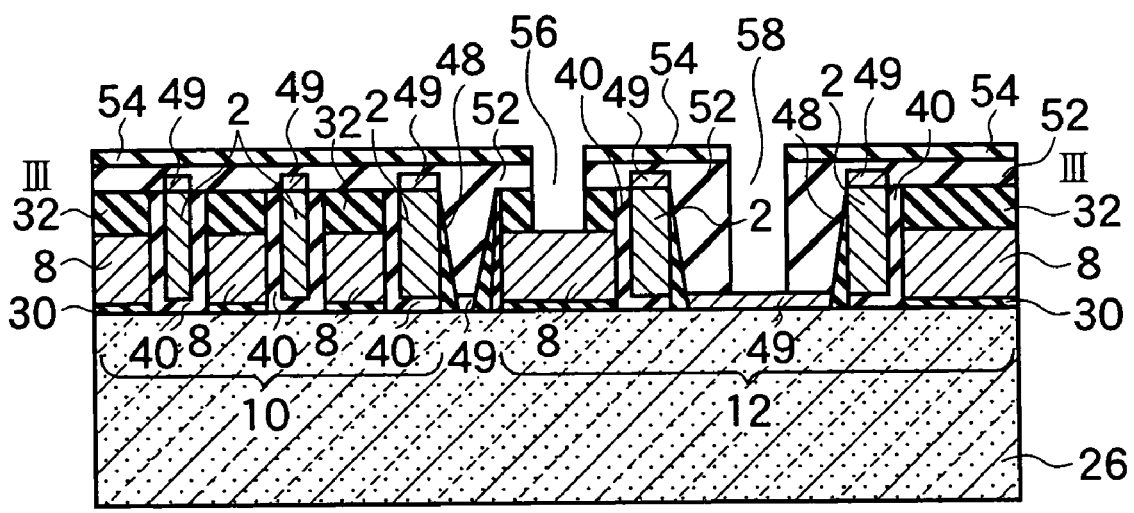
FIG. 36 is a schematic cross-sectional block diagram cut along the line III-III of FIG. 33.

As shown in FIG. 1B, FIG. 3 and FIG. 20, the nonvolatile semiconductor memory according to the first embodiment of the present invention includes: a gate insulating film 30 formed between a semiconductor substrate 26 and the floating gate 8; diffusion layers 18 formed on both sides of the floating gates 8 within the semiconductor substrate 26 so as to be a source or a drain of the memory cell transistor; and
an inter-gate insulating film 40 (as shown in FIG. 20) formed at two sidewalls provided between the floating gate 8 and the first control gate 2 and also between the floating gate 8 and the second control gate 2, where the first and the second control gates 2 face two diffusion layers 18.

(Operation Mode)

An operation method for the nonvolatile semiconductor memory according to the first embodiment of the present invention is described forthwith using FIGS. 5A, 5B, to FIGS. 8A, 8B. In this case, in order to simplify the description, the NAND memory cell units 24a to 24f of FIG. 4 are referred to as NAND column 1 to NAND column 6, respectively. Each of the diagrams of FIGS. 5A, 5B to FIGS. 8A, 8B show voltage waveforms for the bit lines BLk−1, BLk and BLk+1, gate voltage waveforms for the select gate transistors SG1, SG2 and SG3, and the voltage waveforms for selected and unselected word lines (control gate lines) WL.

(Write-in Operation Mode)

Figure 5A:
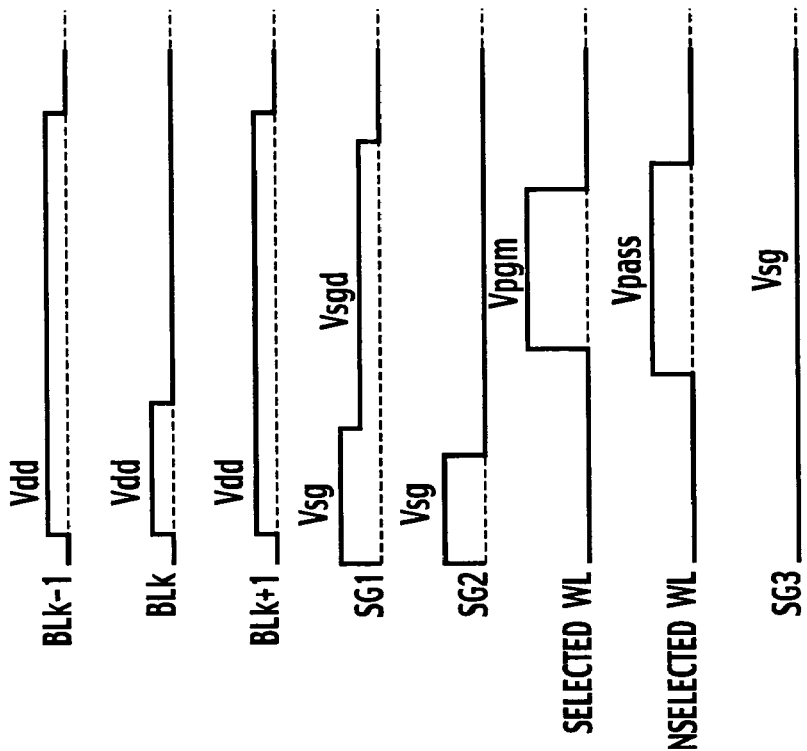
FIG. 5A is a diagram showing operation waveforms when writing to a specific memory cell in NAND column 3 of FIG. 4.
Figure 5B:
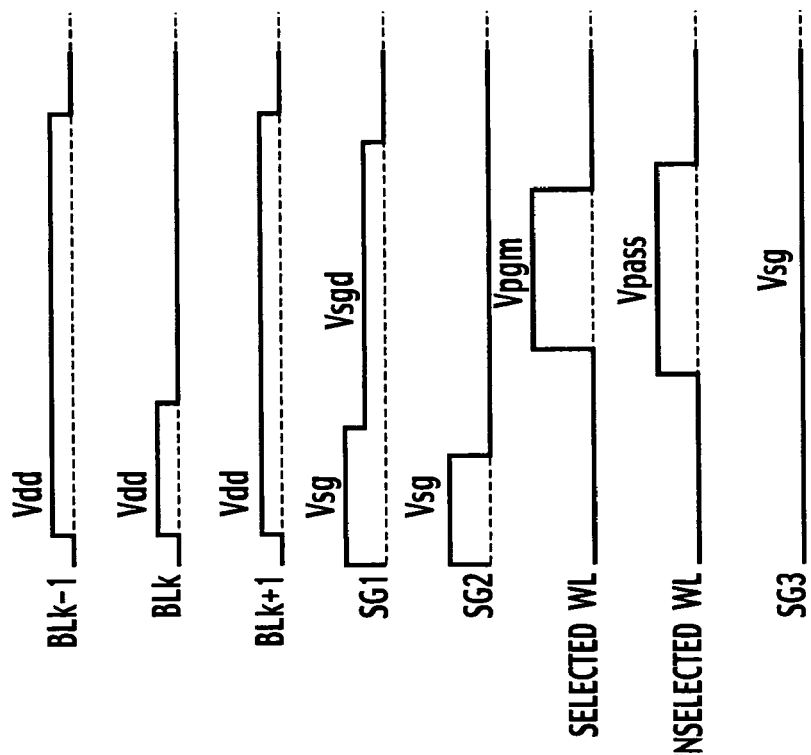
FIG. 5B is a diagram showing operation waveforms when writing to a specific memory cell in NAND column 4 of FIG. 4.

Operation waveforms when writing to a specific memory cell in NAND column 3 are shown in FIG. 5A. In addition, operation waveforms when writing to a specific memory cell in NAND column 4 are shown in FIG. 5B.

NAND column 3 is provided as written NAND memory cells, and NAND columns 1, 2, 4, 5, and 6 are provided given as write-restricted NAND columns.

As shown in FIG. 5A, a voltage Vdd−Vth (SG) is applied through the bit line BL to NAND columns 1, 2, 3, 4, 5, and 6 by applying the gate voltage waveforms to the bit line BL side select gate transistors SG1 and SG2, thereby increasing the channel potential. The channel potential of the memory cell transistor in NAND column 3 is then sufficiently reduced by applying the voltage waveforms to the bit line BLk and the select gate transistor SG1, so as to perform write-in. However, Vsgd is set to a voltage that can appropriately turn off the transistors as opposed to Vbl. Since the select gate transistors SG1 and SG2 turn off, the channel potentials of the memory cell transistors in NAND columns 1, 2, 3, 4, 5, and 6 further increase due to capacitive coupling to the control gate plus a voltage of Vdd−Vth (SG). Therefore, write-in is not performed.

(Read-out Operation Mode)

(Using Shielded Bit Lines)

A read-out operation using shielded bit lines is described referencing FIGS. 6A and 6B and FIGS. 7A and 7B. In addition, a read-out operation not using shielded bit line is described with reference to FIGS. 8A and 8B.

Figure 6A:
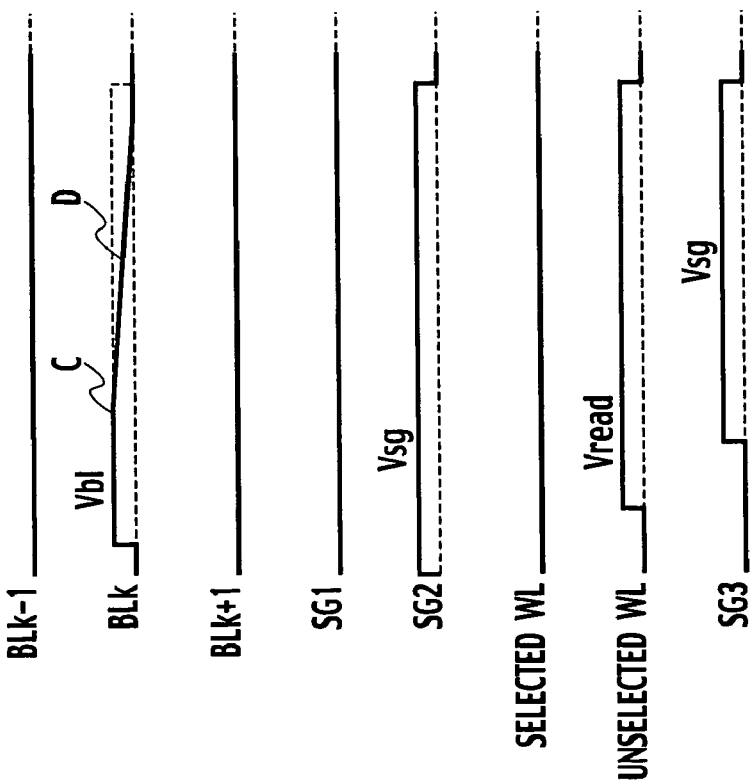
FIG. 6A is a diagram showing operation waveforms when reading a specific memory cell in NAND column 3 of FIG. 4, and relates to a read-out operation using a shielded bit line.

Operation waveforms when reading a specific memory cell in NAND column 3 are shown in FIG. 6A. Furthermore, operation waveforms when reading a specific memory cell in NAND column 4 are shown in FIG. 6B.

In FIG. 6A, marker A denotes a bit line BLk charge level, and marker B denotes a bit line BLk discharge level with the select gate transistor SG3 in an open state (Vsg) when the selected memory cell is a written memory cell. In addition, the waveform on the charged bit line BLk is indicated by the dotted line.

Figure 6B:
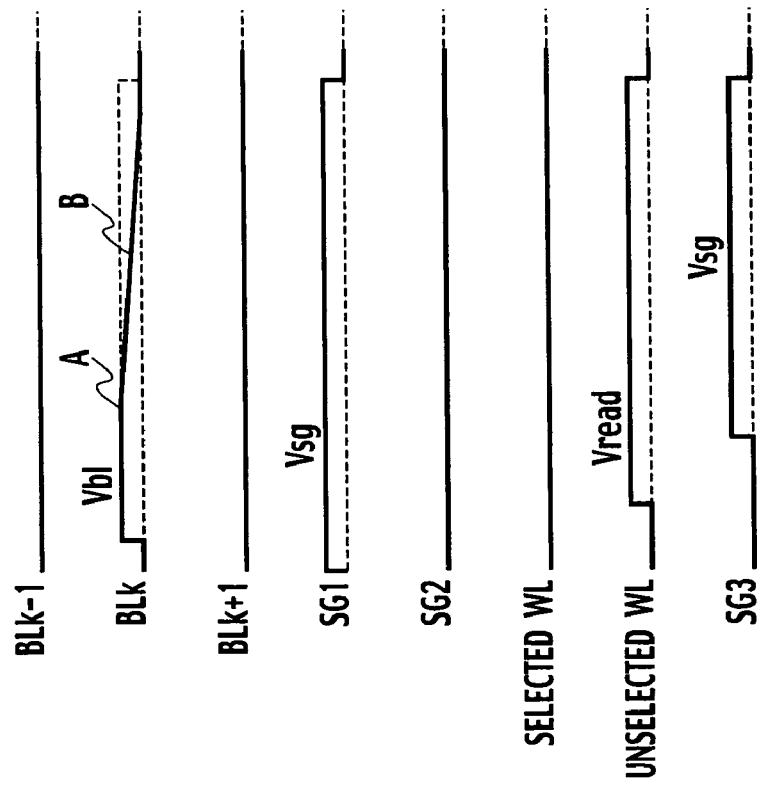
FIG. 6B is a diagram showing operation waveforms when reading a specific memory cell in NAND column 4 of FIG. 4.

In FIG. 6B, marker C denotes a bit line BLk charge level, and marker D denotes a bit line BLk discharge level with the select gate transistor SG3 in an open state (Vsg) when the memory cell to be read is a written memory cell. In addition, the waveform on the charged bit line BLk is indicated by the dotted line.

Figure 7A:
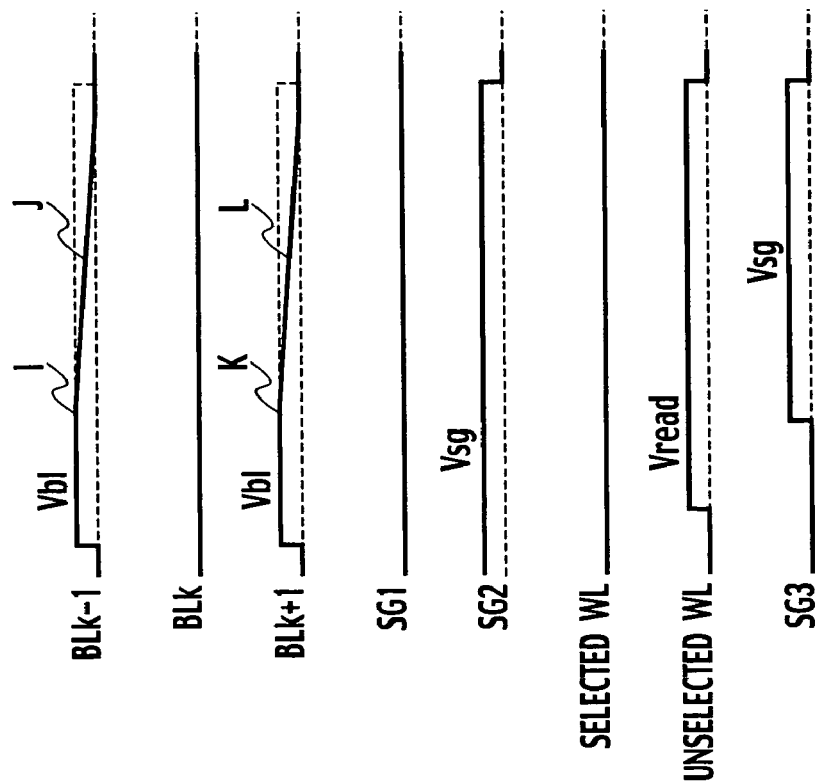
FIG. 7A is a diagram showing operation waveforms when reading specific memory cells in NAND columns 2 and 6 of FIG. 4, and relates to a read-out operation using a shielded bit line.

Operation waveforms when reading specific memory cells in NAND columns 2 and 6 are shown in FIG. 7A. Furthermore, operation waveforms when reading specific memory cells in NAND columns 1 and 5 are shown in FIG. 7B.

In FIG. 7A, marker E denotes a bit line BLk−1 charge level, and marker F denotes a bit line BLk−1 discharge level with the select gate transistor SG3 in an open state (Vsg) when the selected memory cell is a written memory cell. Furthermore, marker G denotes a bit line BLk+1 charge level, and marker H denotes a bit line BLk+1 discharge level with the select gate transistor SG3 in an open state (Vsg) when the selected memory cell is a written memory cell. In addition, the waveform on the charge bit line BLk−1 is indicated by the dotted line. Furthermore, the waveform on the charge bit line BLk+1 is indicated by the dotted line.

Figure 7B:
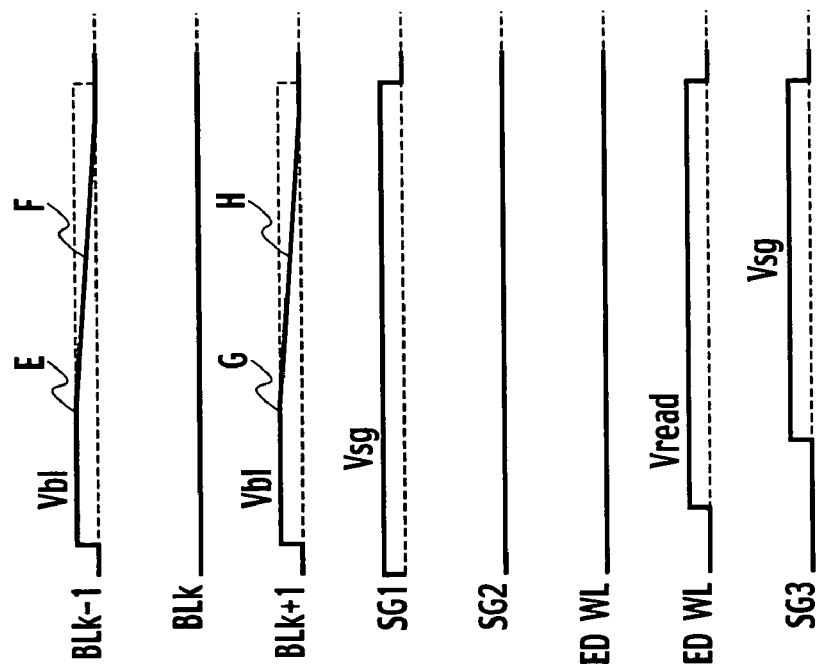
FIG. 7B is a diagram showing operation waveforms when reading specific memory cells in NAND columns 1 and 5 of FIG. 4.

In FIG. 7B, marker I denotes a bit line BLk−1 charge level, and marker J denotes a bit line BLk−1 discharge level with the select gate transistor SG3 in an open state (Vsg) when the selected memory cell is a written memory cell. Furthermore, marker K denotes a bit line BLk+1 charge level, and marker L denotes a bit line BLk+1 discharge level with the select gate transistor SG3 in an open state (Vsg) when the selected memory cell is a written memory cell. In addition, the waveform on the charge bit line BLk−1 is indicated by the dotted line. Furthermore, the waveform on the charge bit line BLk+1 is indicated by the dotted line.

(Not Using Shielded Bit Lines)

A read-out operation not using shielded bit lines is described with reference to FIGS. 8A and 8B.

Operation waveforms when reading specific memory cells deployed in NAND column 1, 3 and 5 are shown in FIG. 8A. Furthermore, operation waveforms when reading specific memory cells in NAND column 2, 4 and 6 are shown in FIG. 8B. A read-out operation is performed simultaneously for neighboring bit lines since shielded bit lines are not used as is apparent from the operation waveforms in FIG. 8.

In FIG. 8A, marker A denotes a bit line BLk charge level, and marker B denotes a bit line BLk discharge level with the select gate transistor SG3 in an open state (Vsg) when the selected memory cell is a written memory cell. In addition, the waveform on the charged bit line BLk is indicated by the dotted line. Marker E denotes a bit line BLk−1 charge level, and marker F denotes a bit line BLk−1 discharge level with the select gate transistor SG3 in an open state (Vsg) when the selected memory cell is a written memory cell. Furthermore, marker G denotes a bit line BLk+1 charge level, and marker H denotes a bit line BLk+1 discharge level with the select gate transistor SG3 in an open state (Vsg) when the selected memory cell is a written memory cell. In addition, the waveform on the charged bit line BLk−1 is indicated by the dotted line. Furthermore, the waveform on the charged bit line BLk+1 is indicated by the dotted line.

In FIG. 8B, marker C denotes a bit line BLk charge level, and marker D denotes a bit line BLk discharge level with the select gate transistor SG3 in an open state (Vsg) when the memory cell to be read is a written memory cell. In addition, the waveform on the charged bit line BLk is indicated by the dotted line. Marker I denotes a bit line BLk−1 charge level, and marker J denotes a bit line BLk−1 discharge level with the select gate transistor SG3 in an open state (Vsg) when the selected memory cell is a written memory cell. Furthermore, marker K denotes a bit line BLk+1 charge level, and marker L denotes a bit line BLk+1 discharge level with the select gate transistor SG3 in an open state (Vsg) when the selected memory cell is a written memory cell. In addition, the waveform on the charged bit line BLk−1 is indicated by the dotted line. Furthermore, the waveform on the charged bit line BLk+1 is indicated by the dotted line. In the case of not using shielded bit lines, memory cell arrays may be effectively operated within the operating range allowing suppression of mutual interference between neighboring bit lines. Furthermore, there is an advantage that randomly applying a voltage to a bit line is possible when not using shielded bit lines.

MODIFIED EXAMPLE OF THE FIRST EMBODIMENT

A modified example of the nonvolatile semiconductor memory according to the first embodiment of the present invention, as shown in FIG. 9, is configured with a memory cell array 24 including the NAND memory cell units 24a to 24f, two select gate lines SG01 and SG02, two source line side select gate lines SG03 and SG04, exemplary bit lines BLk−1, BLk, and BLk+1, the bit line drive circuits 1, the control gate line drive circuits 20, the select gate line drive circuits 21, and the source line drive circuit 22. In the structure of FIG. 9, unselected control gate lines CG and selected control gate line CG are shown differentiated, however, it is similar to FIG. 4 in that they are connected to the control gate line drive circuits 20, respectively.

The modified example of the first embodiment, in comparison to the first embodiment illustrated in FIG. 4, is characteristic of an extra source side select gate line, arranging two lines as SG03 and SG04 as shown in FIG. 9. According to such configuration, the bit line side and the source line side of the circuitry may be configured almost symmetrically, simplifying the pattern layout configuration. Furthermore, flexibility in circuit operations may be increased, and as will be hereafter described, there are advantages that, for example, the write-in time may be shortened and the load for disabling read-out may be reduced.

More generally, as shown in FIG. 9, a nonvolatile semiconductor memory of the modified example of the first embodiment of the present invention includes: a first and a second memory cell column 24a~24f . . . having a plurality of memory cell transistors connected in series and a gate structure as a floating gate and a first and a second control gate located at both sides of the floating gate; a first select gate transistor SG2 connected between the first memory cell column 24a and a bit line BLk−1; a second select gate transistor SG1 connected between the second memory cell column 24b and the bit line BLk−1, and bit line contacts connecting a bit line BLk−1~BLk+1 . . . to a diffusion layer of the first and the second select gate transistor SG2, SG1 provided at a pitch twice the pitch of the memory cell column 24a~24f . . . .

As shown in FIG. 9, the nonvolatile semiconductor memory of the modified example of the first embodiment of the present invention further includes: a plurality of control gate lines CG . . . connected to the first and the second control gate of the memory cell, respectively, and perpendicular to the bit line BLk−1~BLk+1 . . . ; a first select gate line SG02 connected to the gate of the first select gate transistor SG2 and parallel to the plurality of control gate lines CG . . . ; a second select gate line SG01 connected to the gate of the second select gate transistor SG1 and parallel to the plurality of control gate lines CG . . . ; a third select gate transistor SG3 connected between the first memory cell column 24a and a source line SL; a fourth select gate transistor SG4 connected between the second memory cell column 24b and the source line SL; a third select gate line SG03 connected to the gate of the third select gate transistor SG3 and parallel to the plurality of control gate lines CG . . . ; and a fourth select gate line SG04 connected to the gate of the fourth select gate transistor SG4 and parallel to the plurality of control gate lines CG . . . .

As shown in FIG. 9, the nonvolatile semiconductor memory of the modified example of the first embodiment of the present invention further includes: a bit line drive circuit 1 connected to the bit line BLk−1~BLk+1 . . . ; a control gate line drive circuit 20 connected to the control gate line CG; a select gate line drive circuit 21 connected to the select gate line SG01, SG02, SG03, SG04; and a source line drive circuit 22 connected to the source line SL.

As shown in FIG. 1B, FIG. 3 and FIG. 20, the nonvolatile semiconductor memory according to the modified example of the first embodiment of the present invention includes: a gate insulating film 30 formed between a semiconductor substrate 26 and the floating gate 8; diffusion layers 18 formed on both sides of the floating gates 8 within the semiconductor substrate 26 so as to be a source or a drain of the memory cell transistor; and an inter-gate insulating film 40 (as shown in FIG. 20) formed at two sidewalls provided between the floating gate 8 and the first control gate 2 and also between the floating gate 8 and the second control gate 2, where the first and the second control gates 2 face two diffusion layers 18.

(Operation Mode)

An operation method for the nonvolatile semiconductor memory according to the modified example of the first embodiment of the present invention is described forthwith using FIGS. 10A and 10B, to FIGS. 13A and 13B. Each of the diagrams of FIGS. 10A, 10B to FIGS. 13A, 13B shows voltage waveforms for the bit lines BLk−1, BLk and BLk+1, gate voltage waveforms for the select gate transistors SG1, SG2 and SG3, and the voltage waveforms for selected and unselected word lines (control gate lines) WL.

(Write-in Operation Mode)

Figure 10A:
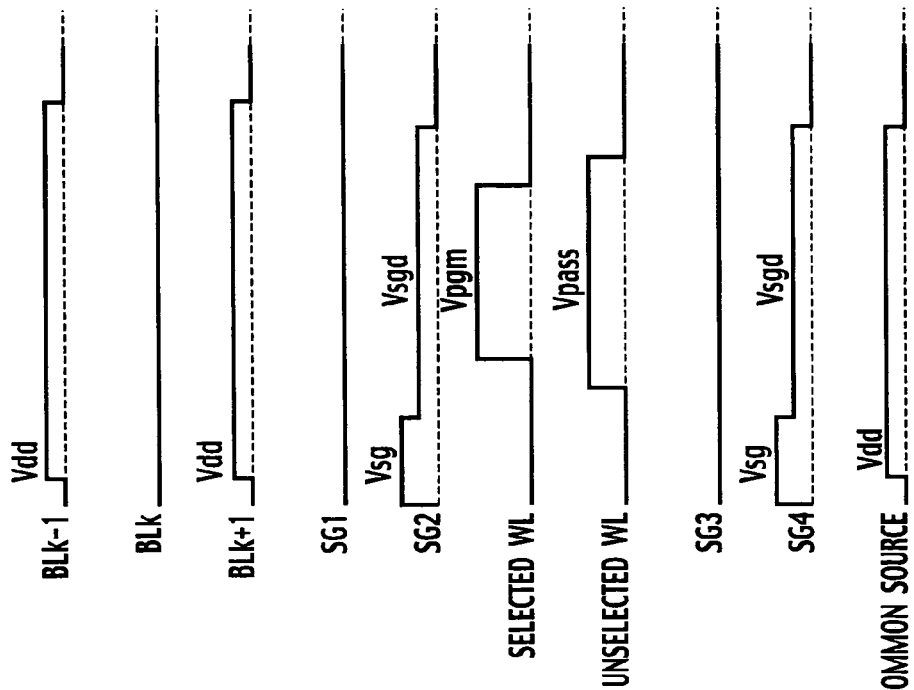
FIG. 10A is a diagram showing operation waveforms when writing to a specific memory cell in NAND column 3 of FIG. 9.

Operation waveforms when writing to a specific memory cell in NAND column 3 are shown in FIG. 10A. In addition, operation waveforms when writing to a specific memory cell in NAND column 4 are shown in FIG. 10B.

As shown in FIG. 10A, a voltage Vdd-Vth (SG) is applied through the bit line BL to NAND columns 2 and 6, and 0V is applied through the bit line BL to NAND column 3 by applying the gate voltage waveforms to the bit line BL side select gate transistor SG1. A voltage Vdd-Vth (SG) is applied through the common source line SL to NAND columns 1, 4 and 5 by applying the gate voltage waveforms to the common source line SL side select gate transistor SG3.

Figure 10B:
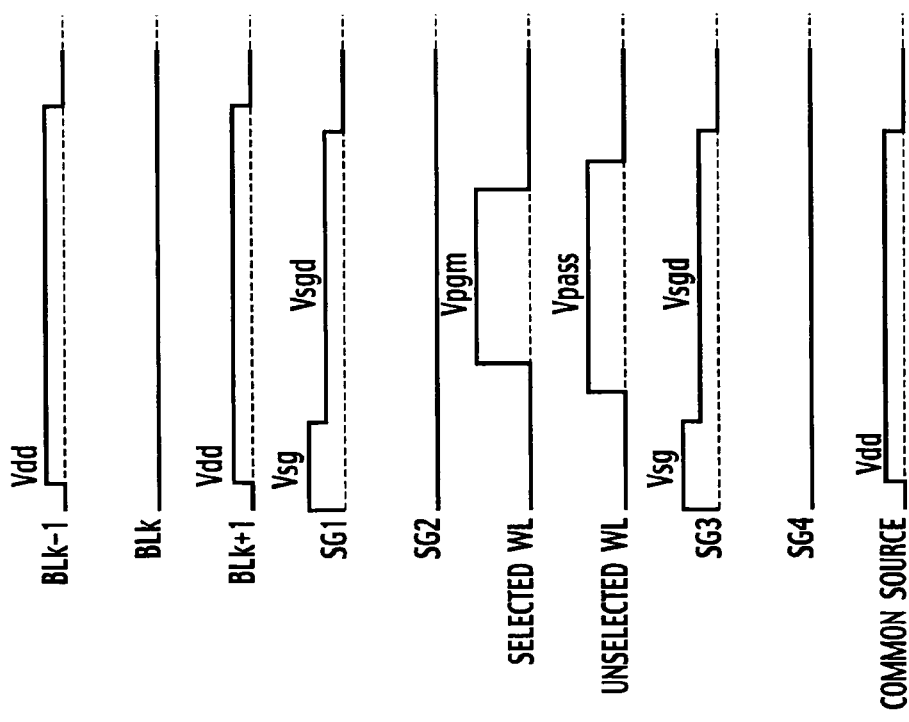
FIG. 10B is a diagram showing operation waveforms when writing to a specific memory cell in NAND column 4 of FIG. 9.

As shown in FIG. 10B, a voltage Vdd-Vth (SG) is applied through the bit line BL to NAND columns 1 and 5, and 0V is applied through the bit line BL to NAND column 4 by applying the gate voltage waveforms to the bit line BL side select gate transistor SG2. Vdd-Vth (SG) is applied through the common source line SL to NAND columns 2, 3 and 6 by applying the gate voltage waveforms to the common source line SL side select gate transistor SG4.

In the first embodiment having the circuitry shown in FIG. 4, in order to prevent erroneous write-in, a voltage Vdd-Vth (SG) is applied to a NAND column of write-restricted memory cells prior to write-in, thereby raising the channel potential. As a result, a NAND column of written memory cells requires decreasing the channel potential by discharging the charged voltage of Vdd-Vth (SG). In contrast, in the modified example of the first embodiment having the circuitry shown in FIG. 9, by having two source side select gate lines and a total of four lines in combination with the bit line side select gate lines, simultaneously applying a voltage of Vdd-Vth (SG) to a NAND column of write-restricted memory cells and 0 (V) to a NAND column of written memory cells is possible, thereby achieving a shortened write-in time.

(Read-out Operation Mode)

Figure 11A:
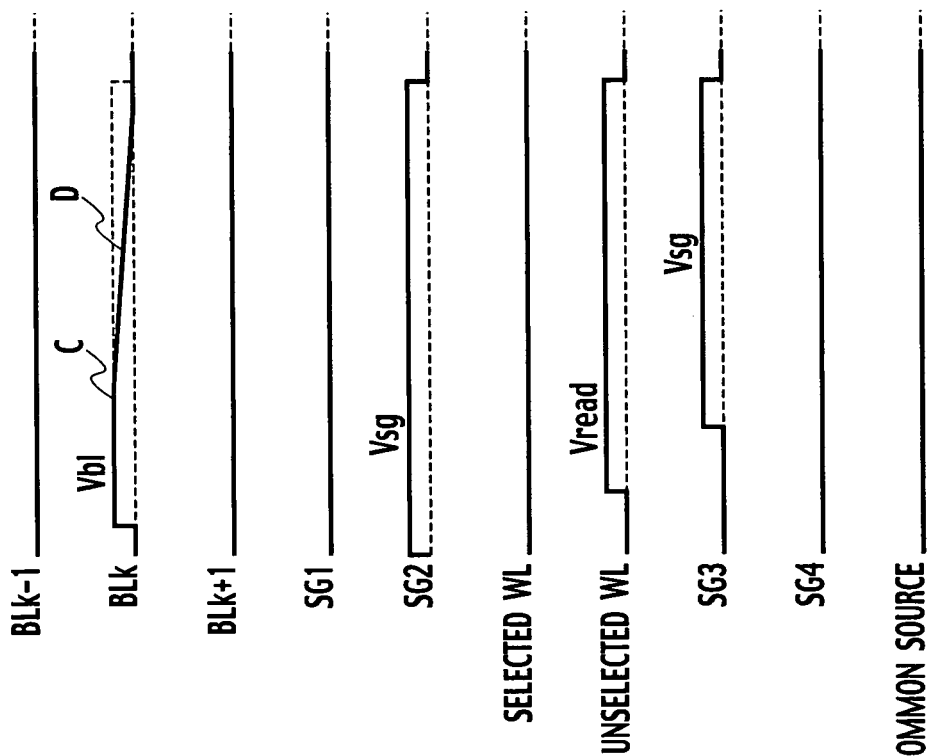
FIG. 11A is a diagram showing operation waveforms when reading a specific memory cell in NAND column 3 of FIG. 9.

Operation waveforms when reading a specific memory cell in NAND column 3 are shown in FIG. 11A. Furthermore, operation waveforms when reading a specific memory cell in NAND column 4 are shown in FIG. 11B.

In FIG. 11A, marker A denotes a bit line BLk charged level, and marker B denotes a bit line BLk discharging level with the select gate transistor SG4 in an open state (Vsg) when the selected memory cell is a written memory cell. Namely, the NAND column 3 charged potential given through the bit line BLk is discharged to the common source line SL in conformity with the operation waveforms applied to the source line side select gate line SG04. In addition, the waveform on the charged bit line BLk is indicated by the dotted line.

Figure 11B:
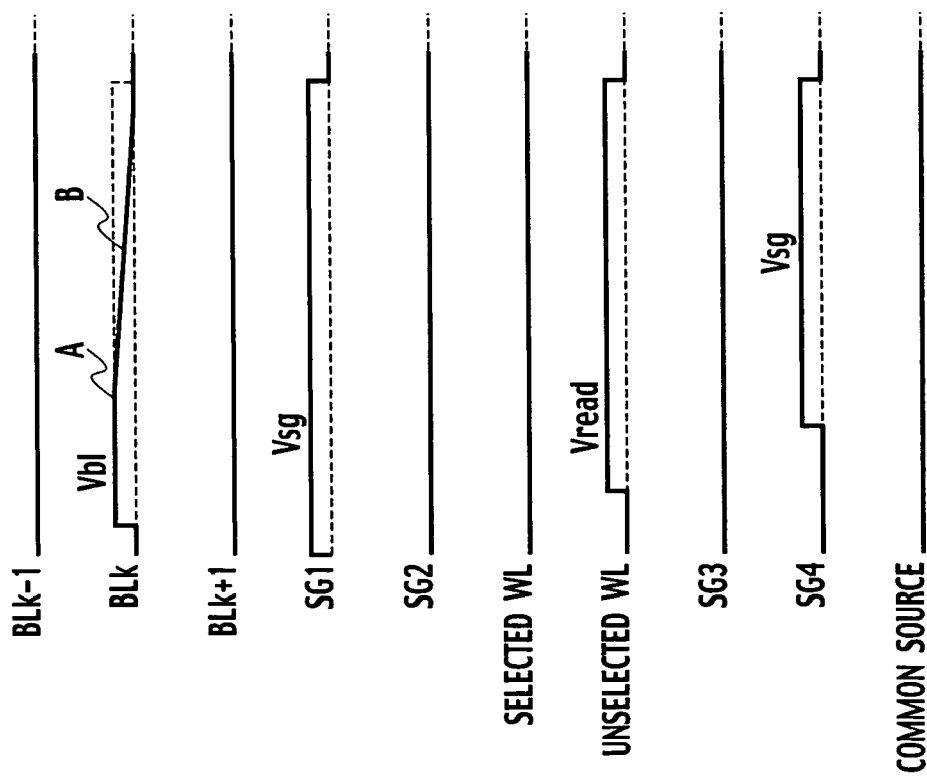
FIG. 11B is a diagram showing operation waveforms when reading a specific memory cell in NAND column 4 of FIG. 9.

In FIG. 11B, marker C denotes a bit line BLk charged level, and marker D denotes a bit line BLk discharging level with the select gate transistor SG3 in an open state (Vsg) when the selected memory cell is a written memory cell. Namely, the NAND column 4 charged potential given through the bit line BLk is discharged to the common source line SL in conformity with the operation waveforms applied to the source line side select gate line SG03. In addition, the waveform on the charged bit line BLk is indicated by the dotted line.

Figure 12A:
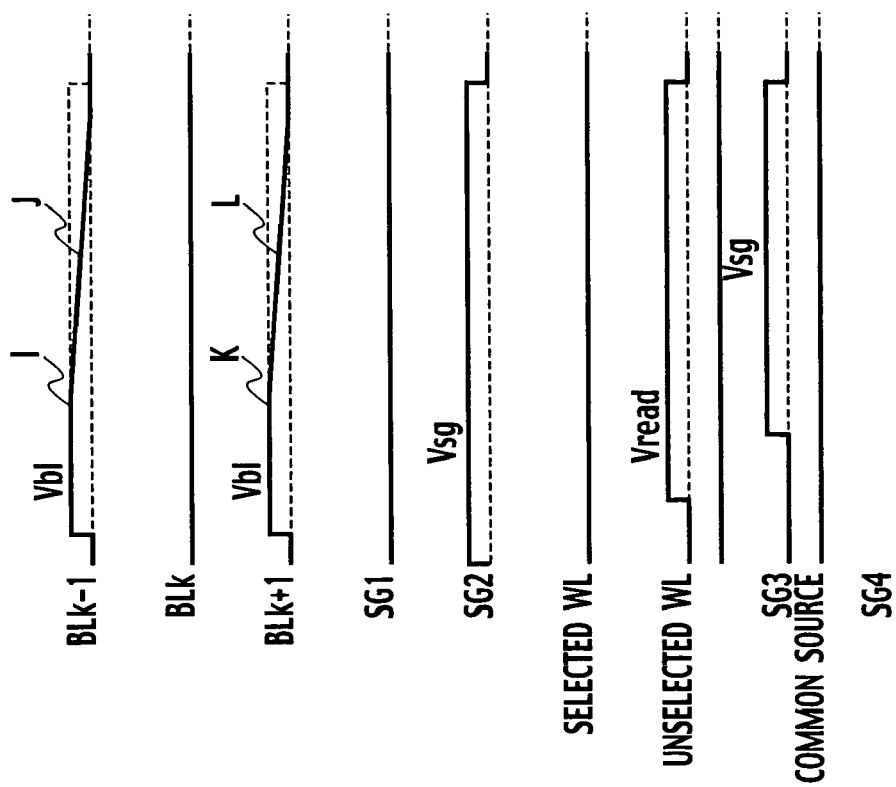
FIG. 12A is a diagram showing operation waveforms when reading specific memory cells in NAND columns 2 and 6 of FIG. 9.

Operation waveforms when specific reading memory cells in NAND columns 2 and 6 are shown in FIG. 12A. Furthermore, operation waveforms when reading specific memory cells in NAND columns 1 and 5 are shown in FIG. 12B.

In FIG. 12A, marker E denotes a bit line BLk−1 charged level, and marker F denotes a bit line BLk−1 discharging level with the select gate transistor SG4 in an open state (Vsg) when the selected memory cell is a written memory cell. Furthermore, marker G denotes a bit line BLk+1 charged level, and marker H denotes a bit line BLk+1 discharging level with the select gate transistor SG4 in an open state (Vsg) when the selected memory cell is a written memory cell. Namely, the NAND columns 2 and 6 charged potentials given through the bit line BLk are discharged to the common source line SL in conformity with the operation waveforms applied to the source line side select gate line SG04. In addition, the waveform on the charged bit line BLk−1 is indicated by the dotted line. Furthermore, the waveform on the charged bit line BLk+1 is indicated by the dotted line.

Figure 12B:
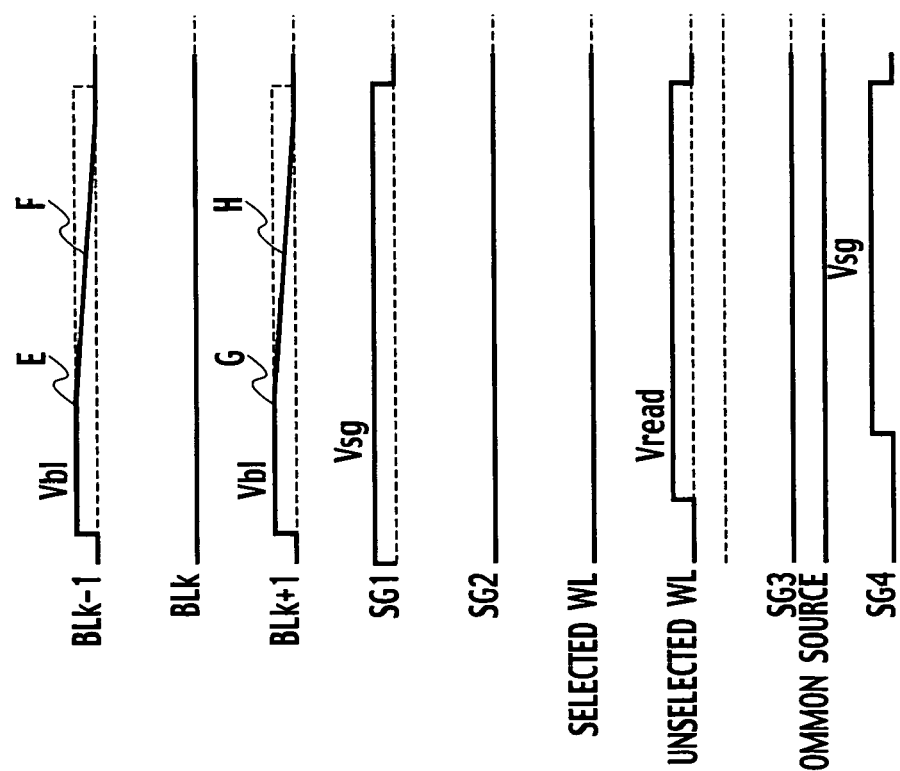
FIG. 12B is a diagram showing operation waveforms when reading specific memory cells in NAND columns 1 and 5 of FIG. 9.
Figure 13:
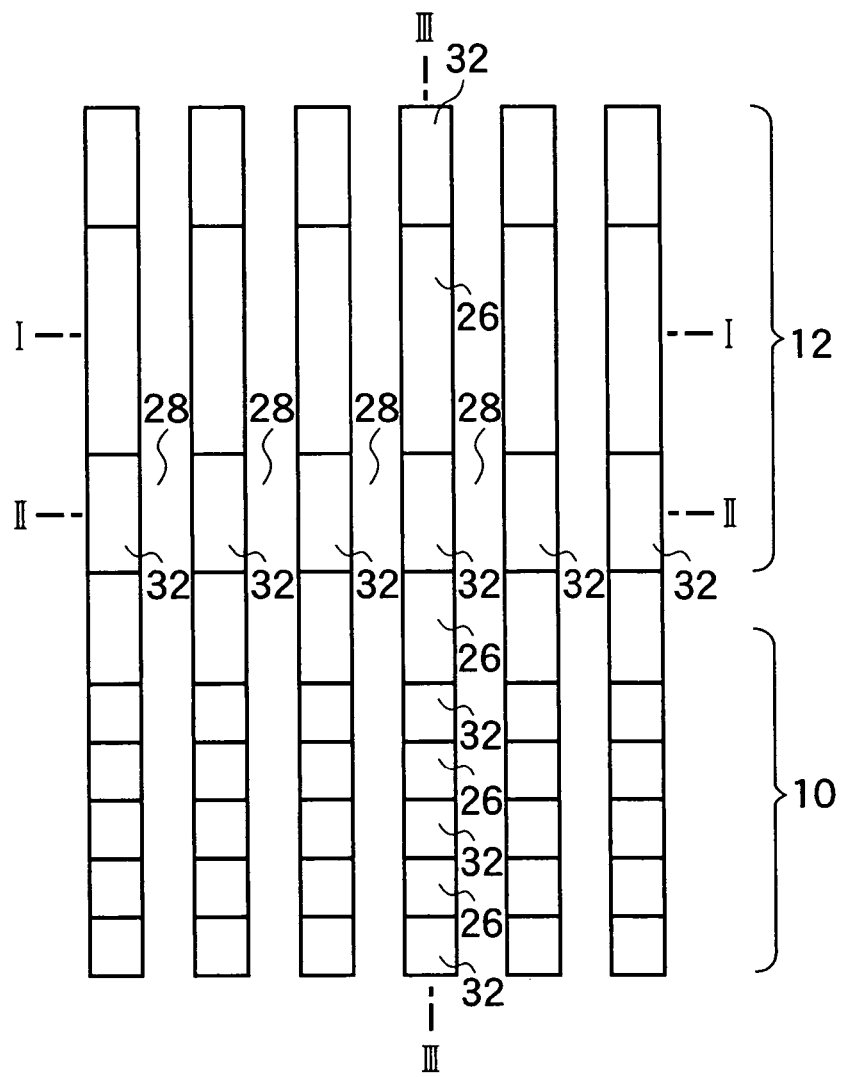
FIG. 13 is a top view of a schematic device pattern in a process of a nonvolatile semiconductor memory fabrication method according to a second embodiment of the present invention.
Figure 14:
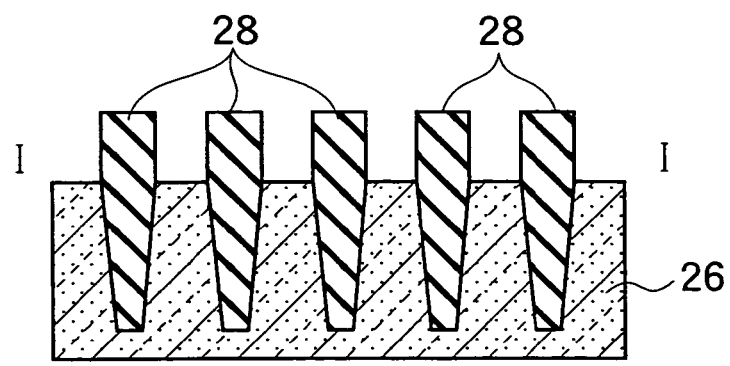
FIG. 14 is a schematic cross-sectional block diagram cut along the line I-I of FIG. 13.
Figure 15:
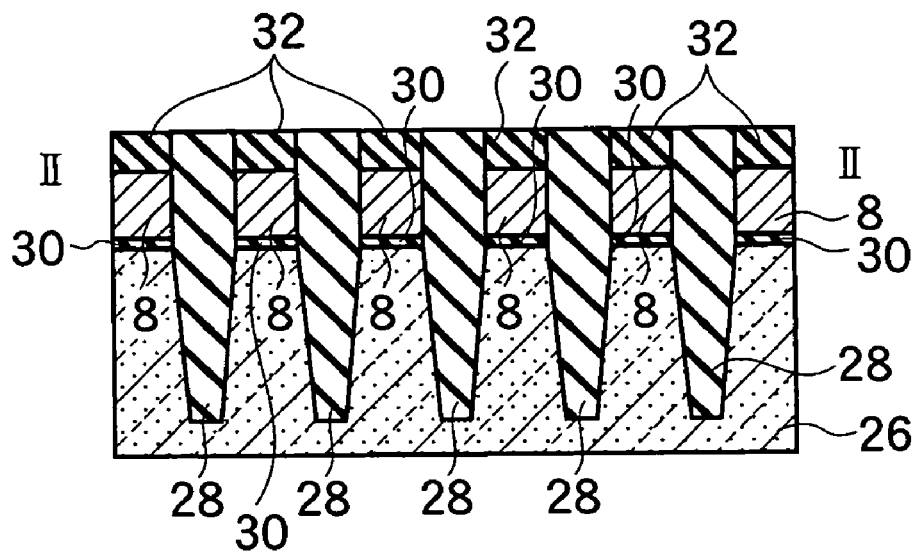
FIG. 15 is a schematic cross-sectional block diagram cut along the line II-II of FIG. 13.
Figure 16:
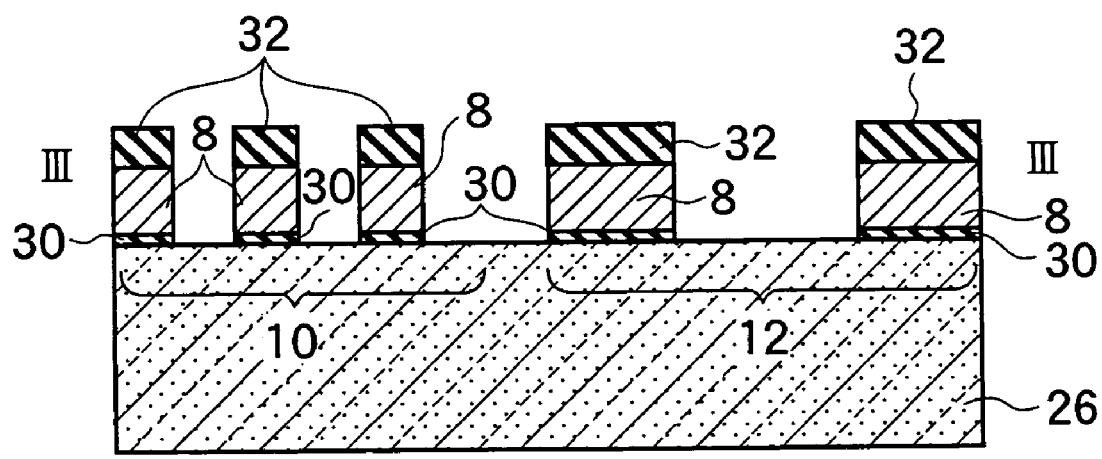
FIG. 16 is a schematic cross-sectional block diagram cut along the line III-III of FIG. 13.
Figure 17:
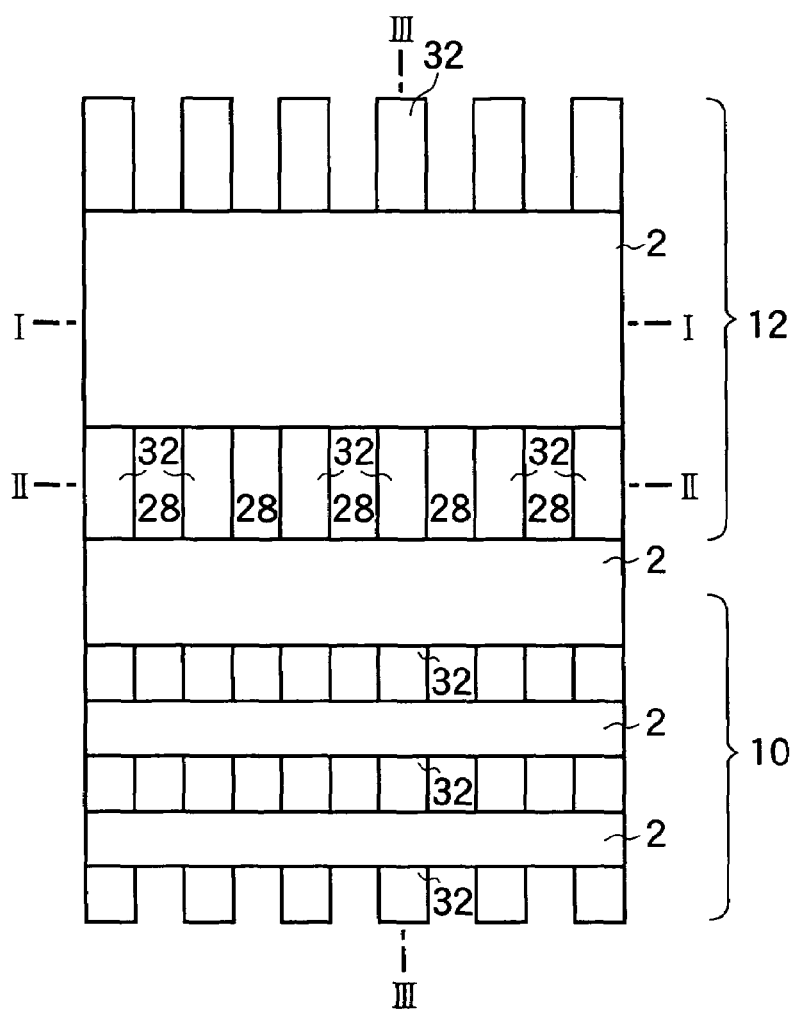
FIG. 17 is a top view of a schematic device pattern in a process of the nonvolatile semiconductor memory fabrication method according to the second embodiment of the present invention.

In FIG. 12B, marker I denotes a bit line BLk−1 charged level, and marker J denotes a bit line BLk−1 discharging level with the select gate transistor SG3 in an open state (Vsg) when the selected memory cell is a written memory cell. Furthermore, marker K denotes a bit line BLk+1 charged level, and marker L denotes a bit line BLk+1 discharging level with the select gate transistor SG3 in an open state (Vsg) when the selected memory cell is a written memory cell. Namely, the NAND columns 1 and 5 charged potentials given through the bit line BLk are discharged to the common source line SL in conformity with the operation waveforms applied to the source line side select gate line SG03. In addition, the waveform on the charged bit line BLk−1 is indicated by the dotted line. Furthermore, the waveform on the charged bit line BLk+1 is indicated by the dotted line.

With the first embodiment having the circuitry in FIG. 4, the common source line SL potential 0 (V) is applied to all NAND columns when the source side select gate transistor SG3 is open (Vsg), and as a result, the channel potentials of all of the NAND columns become 0 (V), increasing the load for disabling read-out. However, if the control gate line CG for a memory cell which is to be written in a read-disabled NAND column is selected (0V), the channel potentials from the source side select gate line SG03 to that memory cell is 0 (V). To the contrary, in the modified example of the first embodiment having the circuitry shown in FIG. 9, by having two source side select gate lines and a total of four lines in combination with the bit line side select gate lines, the number of the NAND columns to which 0 (V) is applied when the source line side select gate line (SG03 or SG04) is open may be reduced by half, and the load for disabling read-out may be reduced since the channel potentials of the NAND columns connected to the unselected select gate line (SG03 or SG04) enter a floating state.

It should be noted that with the read-out operation shown in FIG. 11 and FIG. 12, the case of using shielded bit lines has been described. However, it is apparent that the same operation may be performed as with the above description of FIG. 8 even when shielded bit lines are not used. The operation is the same as with the waveforms shown in FIG. 8, and description thereof is omitted. In the case of not using shielded bit lines, memory cell arrays may be effectively operated within the operating range allowing suppression of mutual interference between neighboring bit lines. Furthermore, there is an advantage that randomly applying a voltage to a bit line is possible when shielded bit lines are not used.

According to the first embodiment of the present invention, it can provides a nonvolatile semiconductor memory, which provides a highly integrated NAND EEPROM, and allows bit line contacts CB, each connecting a bit line BL to the diffusion layer of a bit line BL side select gate transistor, to be arranged with a pitch that is twice the NAND column pitch, where two NAND columns share a single bit line BL in NAND EEPROM.

SECOND EMBODIMENT

Using FIG. 13 to FIG. 48, a fabrication method of forming a NAND EEPROM memory cell region 10, a select gate transistor region 12 and a bit line BL of a nonvolatile semiconductor memory according to a second embodiment of the present invention are described with an aerial view of a layout pattern, cross sections cut along the line I-I, cross sections cut along the line II-II, and cross sections cut along the line III-III.

(a) A first insulating film 30, which becomes a tunnel insulating film for memory cell transistors, and a gate insulating film for select gate transistors, is formed on a silicon semiconductor substrate 26. A first gate electrode 8 film, which becomes floating gates 8 for memory cell transistors and gate electrodes for select gate transistors, is deposited across the entire surface of the substrate. A cap insulating film 32 as a second insulating film is then deposited. As to selectivity for the cap insulating film 32, a predetermined sufficient selective etching ratio relative to the floating gate electrode 8 film is a minimum requirement; however, it is further preferable that the insulating film should be one that allows sufficient selective polishing ratio for the chemical and mechanical polishing (CMP) for a device isolating region 28 insulating film hereafter described and control gate electrodes 2. Subsequently, device isolating trenches are formed using lithography and etching techniques, and the device isolating region 28 insulating film is deposited across the entire surface. The device isolating regions 28 are then formed using CMP techniques. The structures shown in FIG. 13 to FIG. 16 are then formed using lithography and etching techniques.

(b) Subsequently, an inter-gate insulating film 40 between the memory cell transistor floating gates 8 and the control gates 2, is deposited, and a control gate electrode 2 film, for memory cell transistors and gate interconnects for select gate transistors, is deposited so as to form the structures shown in FIG. 17 to FIG. 20.

(c) Next, the structures shown in FIG. 21 to FIG. 24 are formed as a part of the process of forming the select gate transistor region 12 using lithography and etching techniques.

(d) Next, a salicide control insulating film 48 used for a metal salicide film 49 is deposited and formed across the entire surface, and using selectively etching techniques, the salicide control insulating film 48 is removed from the top surface of the control gate electrodes 2 and the exposed surface of the silicon semiconductor substrate 26 so as to form the structures shown in FIG. 25 to FIG. 28. As to selectivity for the salicide control insulating film 48, an insulating film allowing sufficient etch selectivity relative to the floating gate electrode 8 film and the control gate electrode 2 film is utilized.

(e) Next, the cap insulating film 32 within a first opening region 50 is removed using lithography and etching techniques. At this time, the inter-gate insulating film 40 within the first opening region 50 is similarly removed, and in a metal salicide process hereafter described, the floating gate electrode 8 film and the control gate electrode 2 film, which adjacent to each other via the inter-gate insulating film 40 within the first opening region 50, can be electrically connected via a metal salicide film 49. Subsequently, a thin metal film is formed across the entire surface and heated, and by utilizing the cap insulating film 32 and the salicide control insulating film 48, it is possible to form the metal salicide film 49 only on the top surface of the control gate electrode 2 film, the top surface of the floating gate electrode 8 film within the first opening region 50, and the exposed surface of the silicon semiconductor substrate 26 (FIG. 29 to FIG. 32).

(f) Next, an interlayer insulating film 52 is deposited across the entire surface. The interlayer insulating film 52 is planarized using CMP and chemical dry etching (CDE) techniques, and a mask insulating film 54 is then deposited across the entire surface. A first contact trench 56 and a second contact trench 58 are then formed using lithography and etching techniques so as to form the structures shown in FIG. 33 to FIG. 36.

Figure 37:
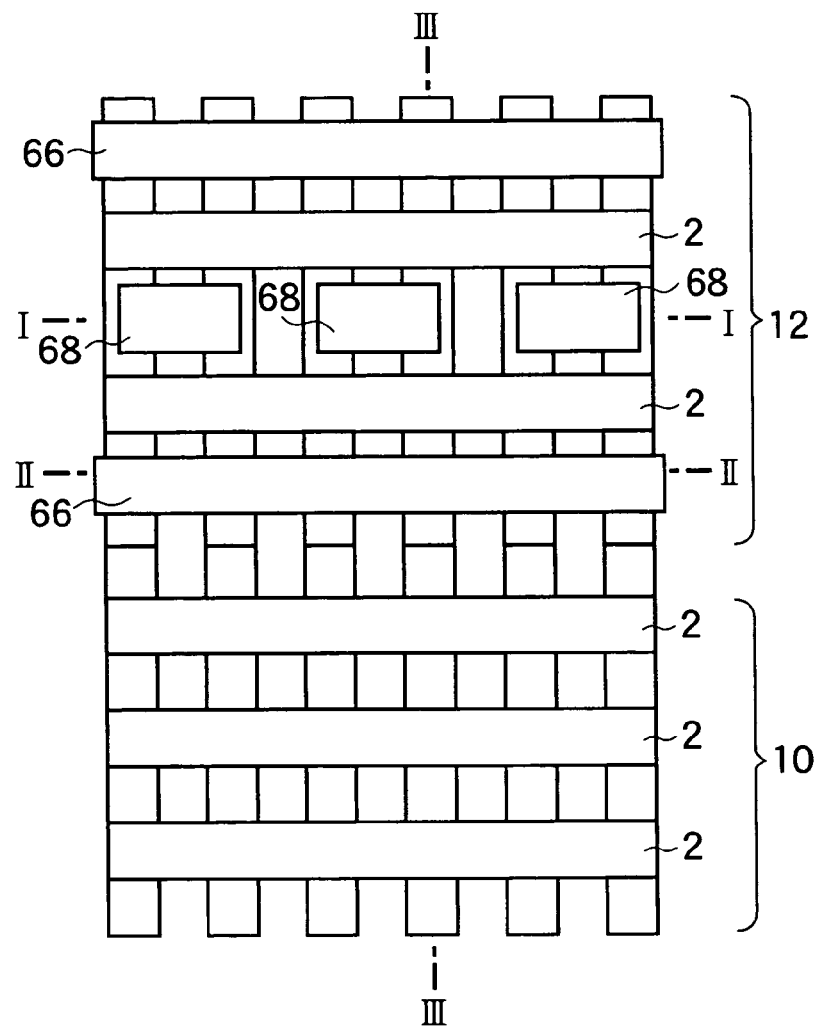
FIG. 37 is a top view of a schematic device pattern in a process of the nonvolatile semiconductor memory fabrication method according to the second embodiment of the present invention.
Figure 38:
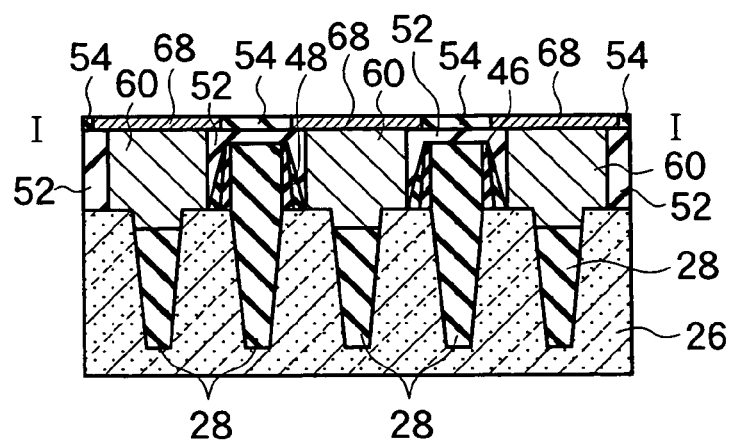
FIG. 38 is a schematic cross-sectional block diagram cut along the line I-I of FIG. 37.
Figure 39:
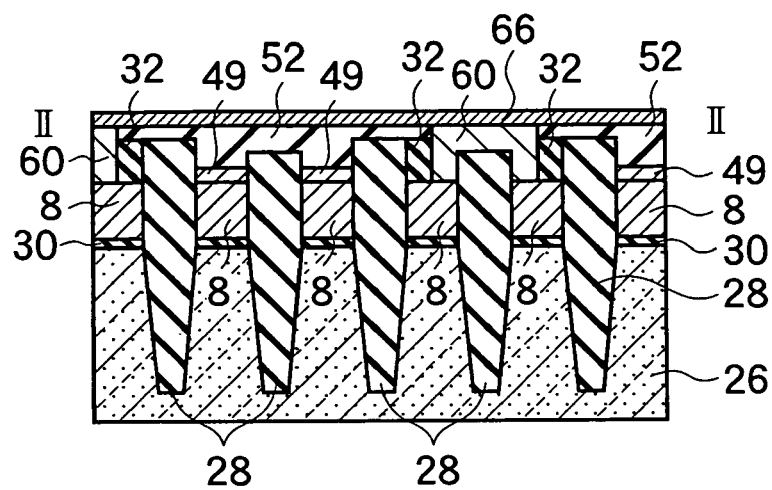
FIG. 39 is a schematic cross-sectional block diagram cut along the line II-II of FIG. 37.
Figure 40:
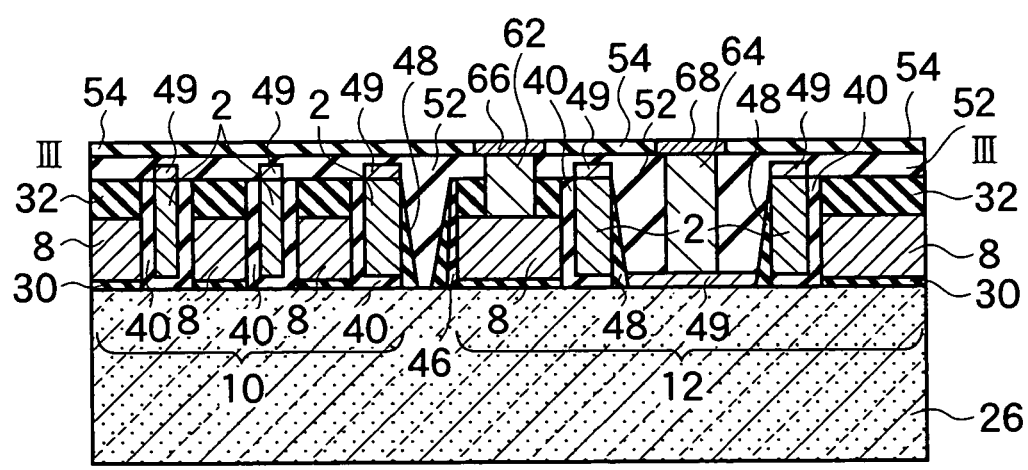
FIG. 40 is a schematic cross-sectional block diagram cut along the line III-III of FIG. 37.

(g) Next, as shown in FIG. 37 and FIG. 40, using lithography and etching techniques, once part of only the mask insulating film 54 is removed and a first interconnect trench and a second interconnect trench are formed, a first metal film 60 is deposited across the entire surface, and then using CMP techniques, a first contact 62, a second contact 64, a first interconnect 66 and a second interconnect 68 are formed by polishing the deposited first metal film 60 until exposing the surface of the mask insulating film 54. At this time, neighboring floating gates 8 exposed to the first contact 62 are electrically connected via the first contact 62. The first contact 62 and the first interconnect 66 are electrically connected. The second contact 64 is electrically connected to the source and drain of the select gate transistor that is exposed to the second contact 64, and two neighboring NAND columns are electrically connected as a result. The second contact 64 and the second interconnect 68 are electrically connected. At this time, the first contact 62 and the first interconnect 66, and the second contact 64 and the second interconnect 68 are electrically independent, respectively (FIG. 37 to FIG. 40).

Figure 41:
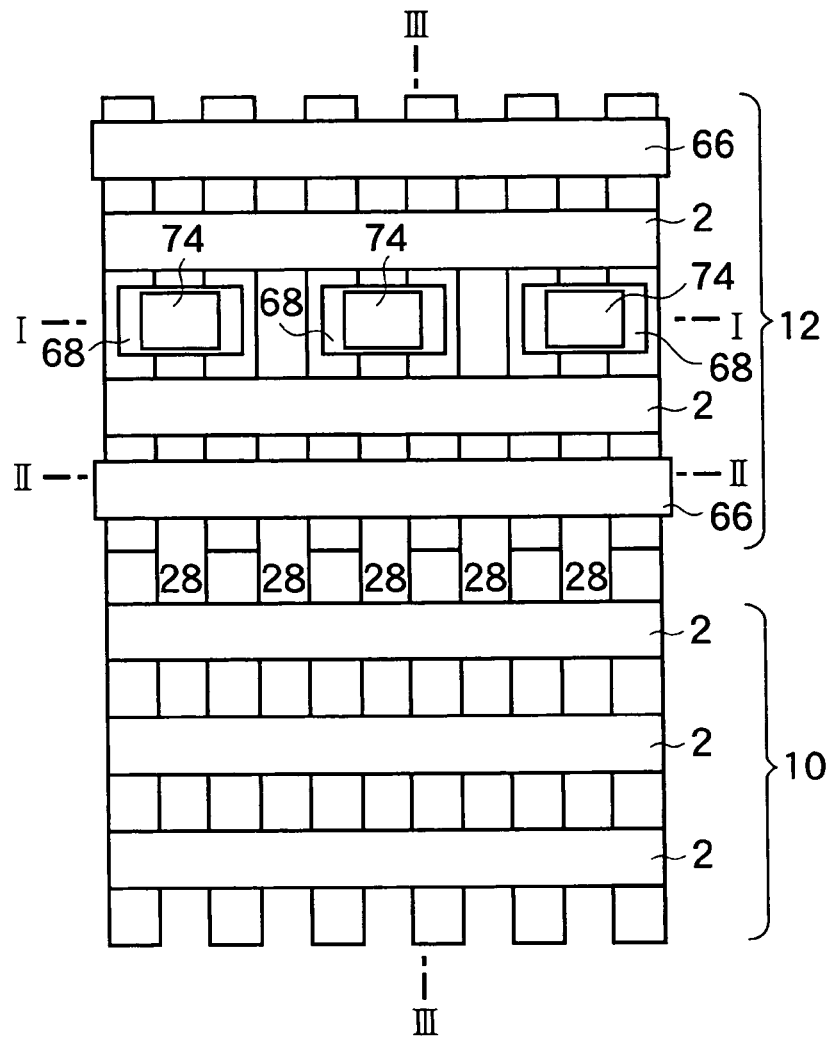
FIG. 41 is a top view of a schematic device pattern in a process of the nonvolatile semiconductor memory fabrication method according to the second embodiment of the present invention.
Figure 42:
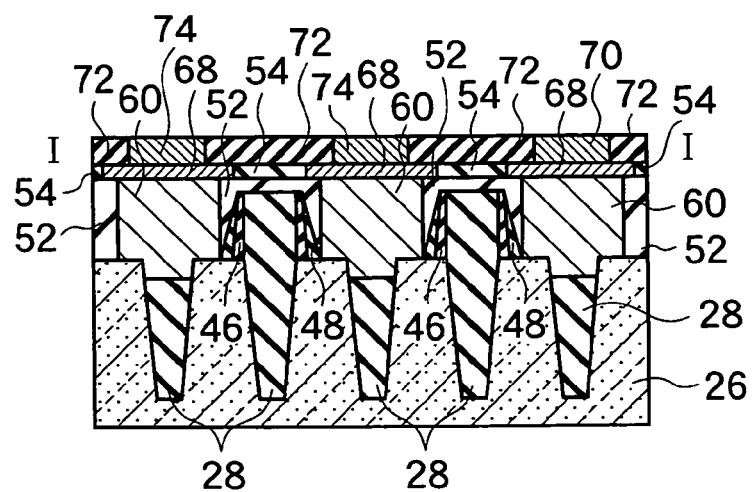
FIG. 42 is a schematic cross-sectional block diagram cut along the line I-I of FIG. 41.
Figure 43:
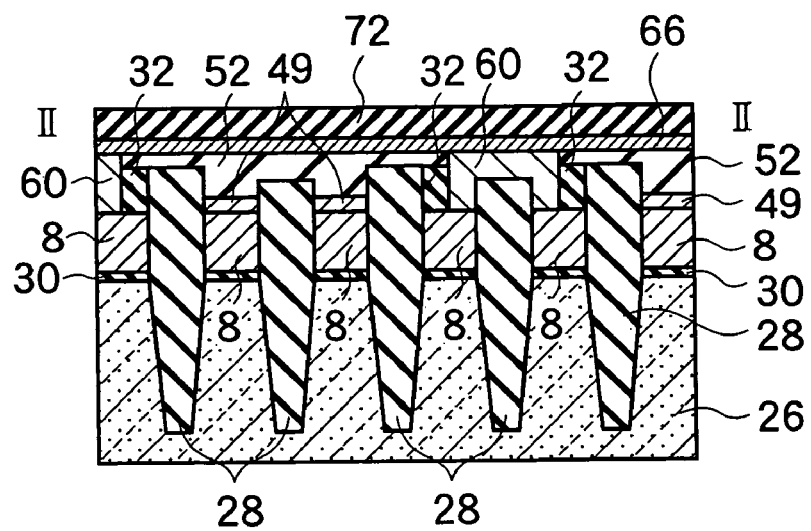
FIG. 43 is a schematic cross-sectional block diagram cut along the line II-II of FIG. 41.
Figure 44:
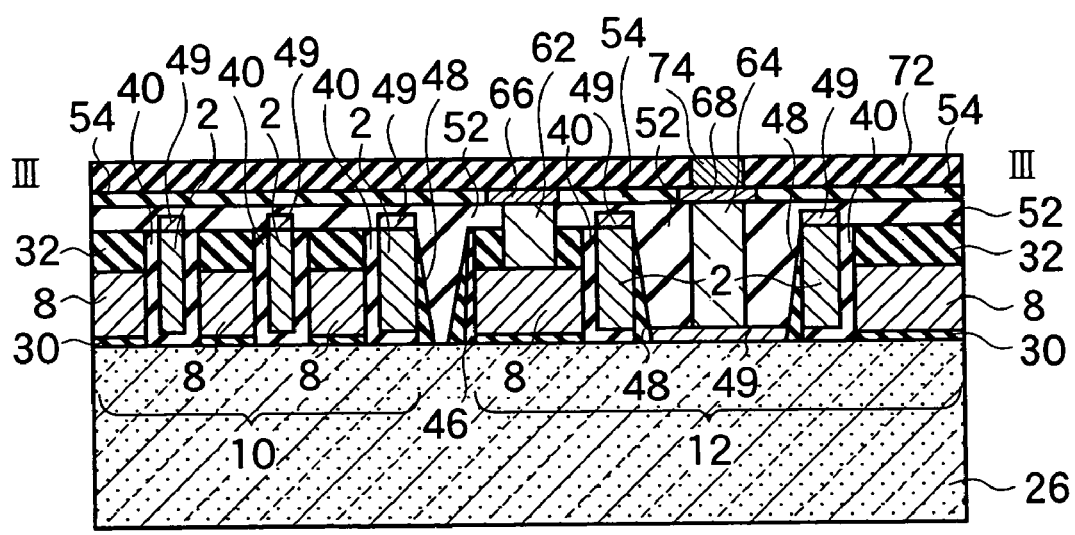
FIG. 44 is a schematic cross-sectional block diagram cut along the line III-III of FIG. 41.
Figure 45:
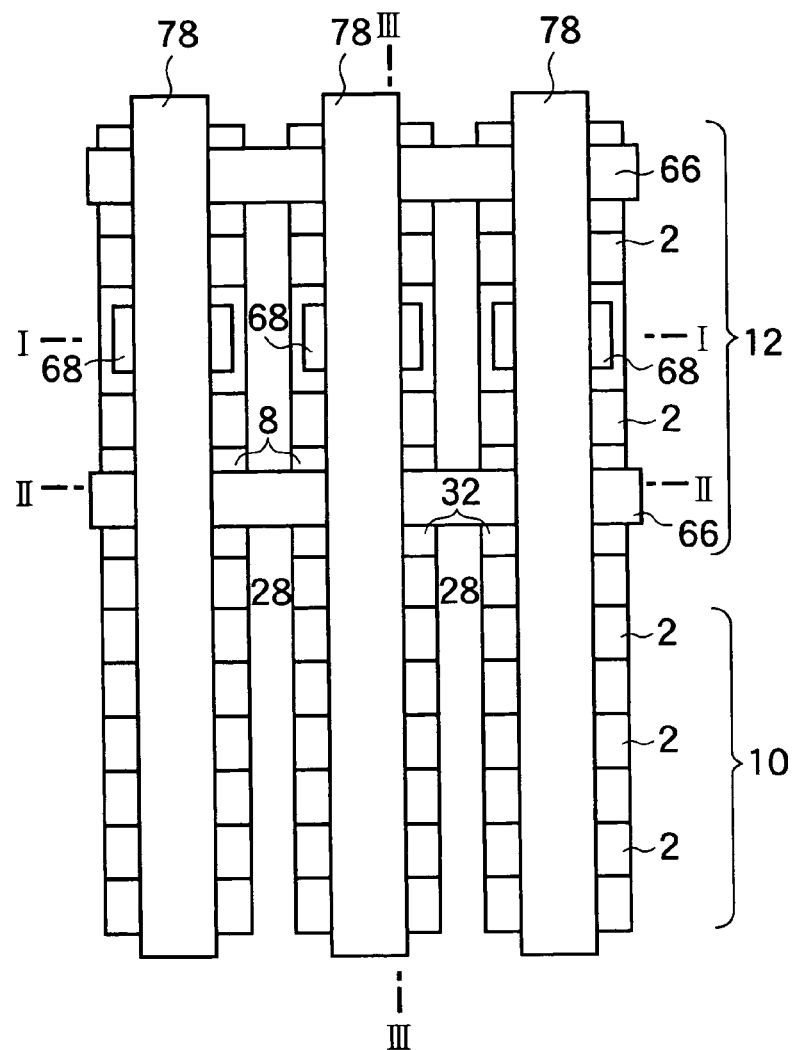
FIG. 45 is a top view of a schematic device pattern in a process of the nonvolatile semiconductor memory fabrication method according to the second embodiment of the present invention.
Figure 46:
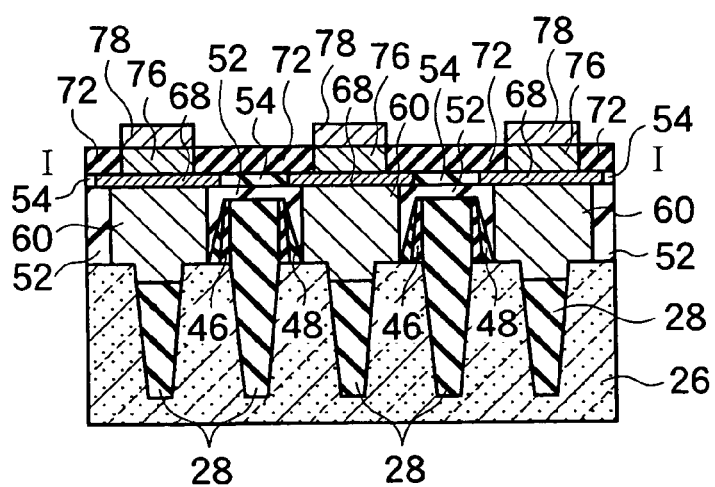
FIG. 46 is a schematic cross-sectional block diagram cut along the line I-I of FIG. 45.
Figure 47:
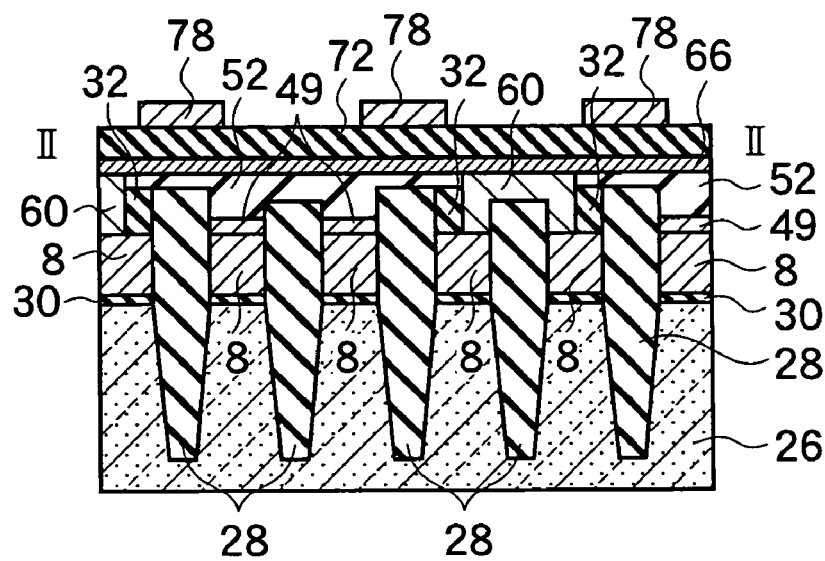
FIG. 47 is a schematic cross-sectional block diagram cut along the line II-II of FIG. 45.
Figure 48:
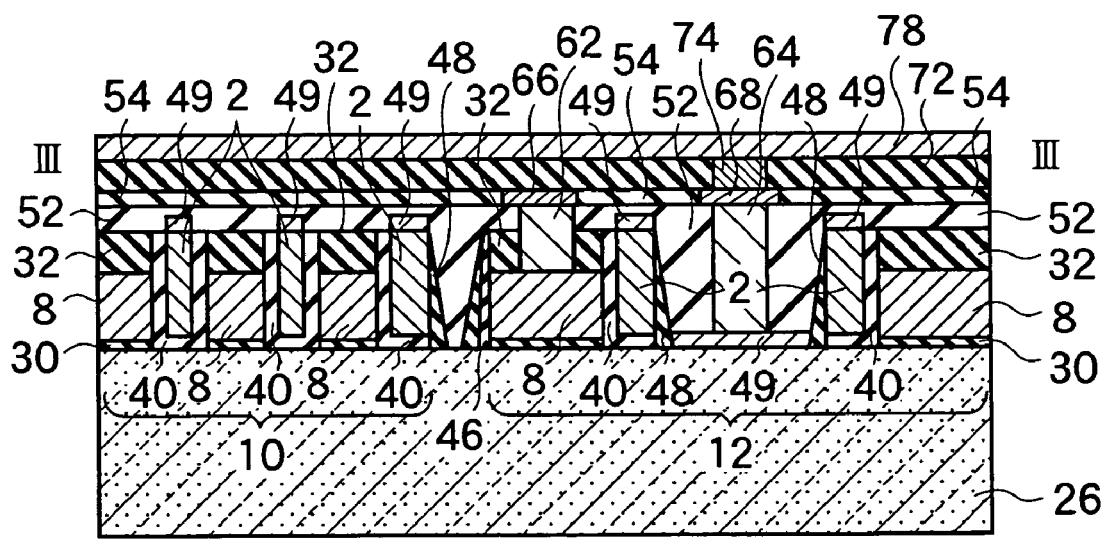
FIG. 48 is a schematic cross-sectional block diagram cut along the line III-III of FIG. 45.
Figure 49:
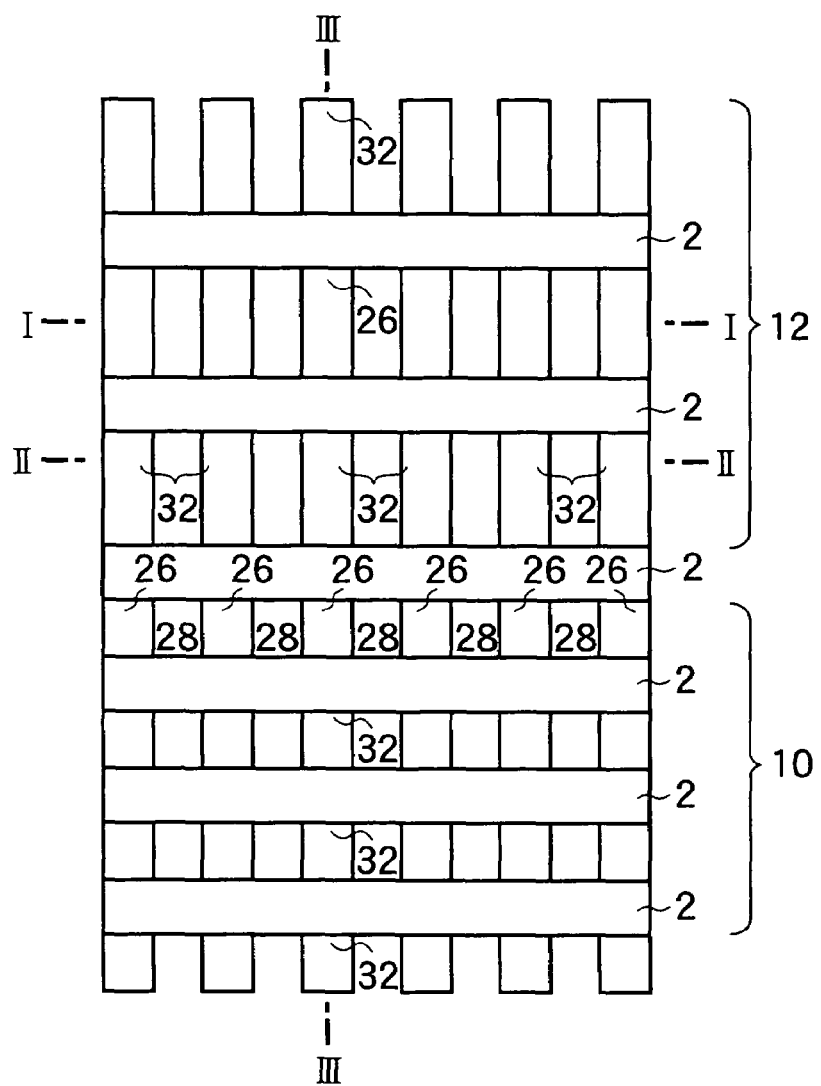
FIG. 49 is a top view of a schematic device pattern in a process of a nonvolatile semiconductor memory fabrication method according to a third embodiment of the present invention.
Figure 50:
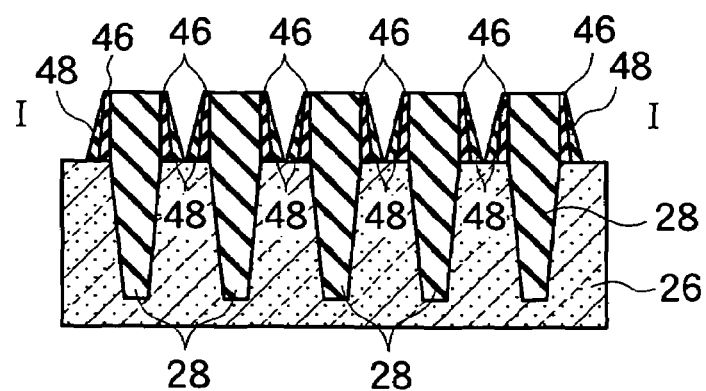
FIG. 50 is a schematic cross-sectional block diagram cut along the line I-I of FIG. 49.
Figure 51:
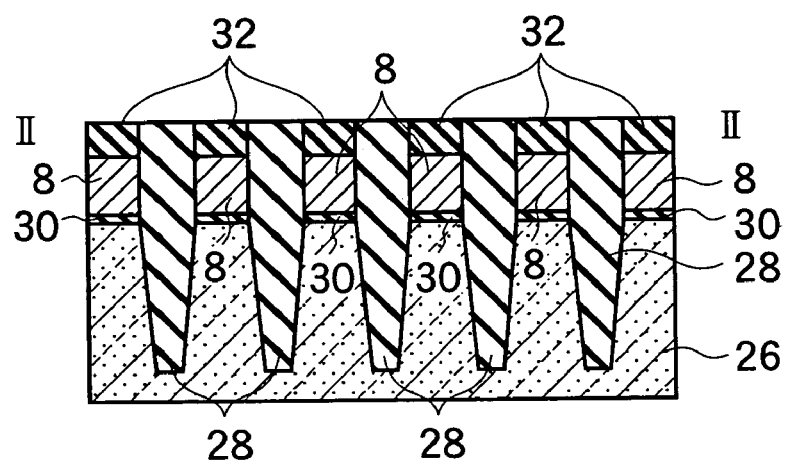
FIG. 51 is a schematic cross-sectional block diagram cut along the line II-II of FIG. 49.
Figure 52:
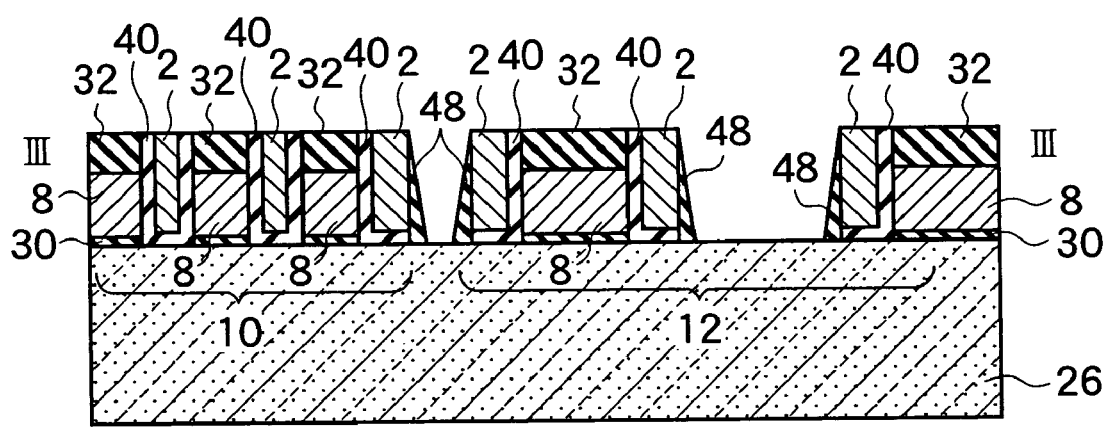
FIG. 52 is a schematic cross-sectional block diagram cut along the line III-III of FIG. 49.
Figure 53:
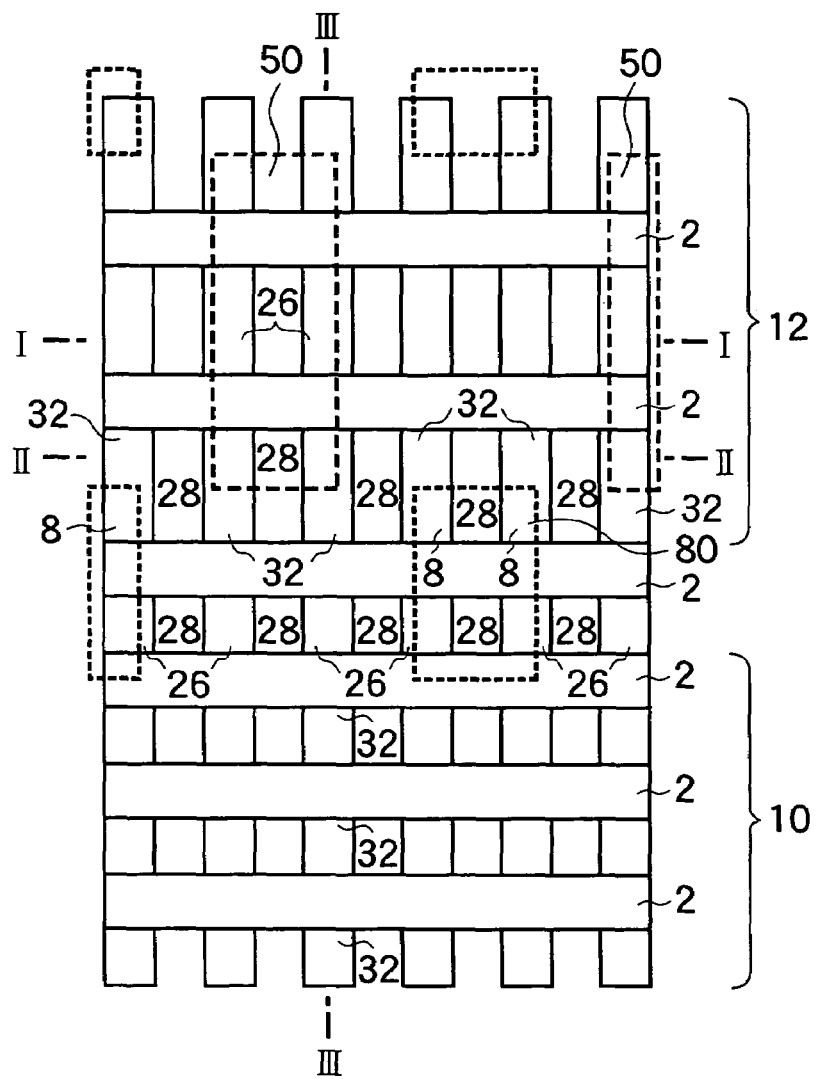
FIG. 53 is a top view of a schematic device pattern in a process of the nonvolatile semiconductor memory fabrication method according to the third embodiment of the present invention.
Figure 54:
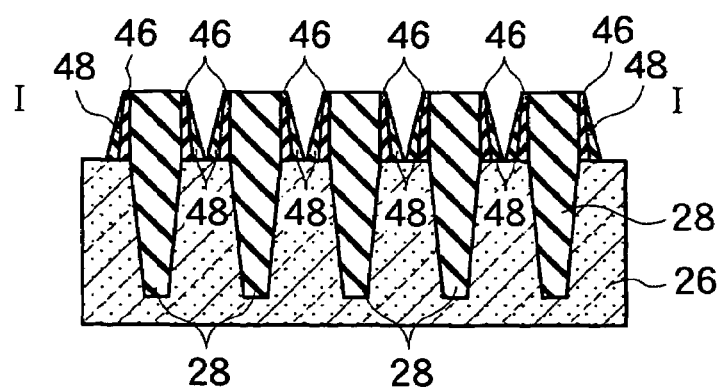
FIG. 54 is a schematic cross-sectional block diagram cut along the line I-I of FIG. 53.
Figure 55:
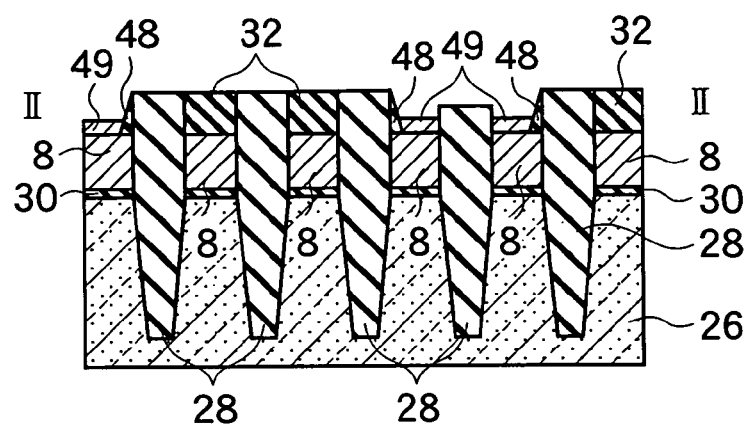
FIG. 55 is a schematic cross-sectional block diagram cut along the line II-II of FIG. 53.
Figure 56:
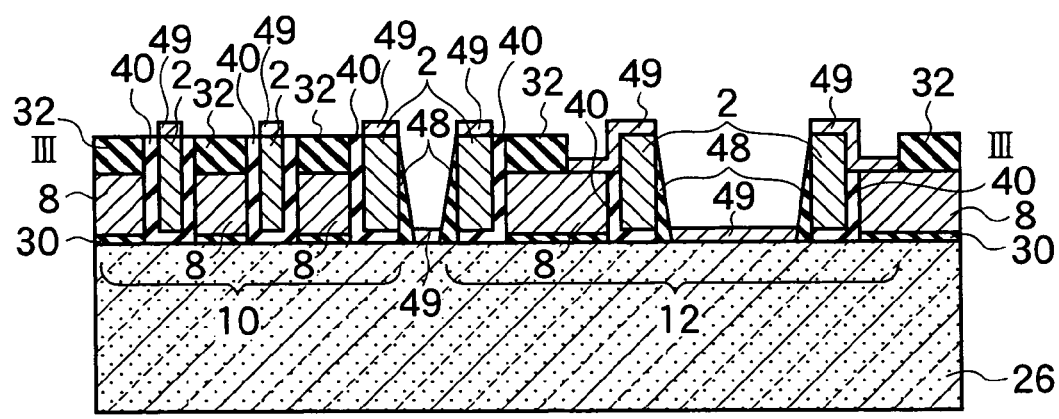
FIG. 56 is a schematic cross-sectional block diagram cut along the line III-III of FIG. 53.
Figure 57:
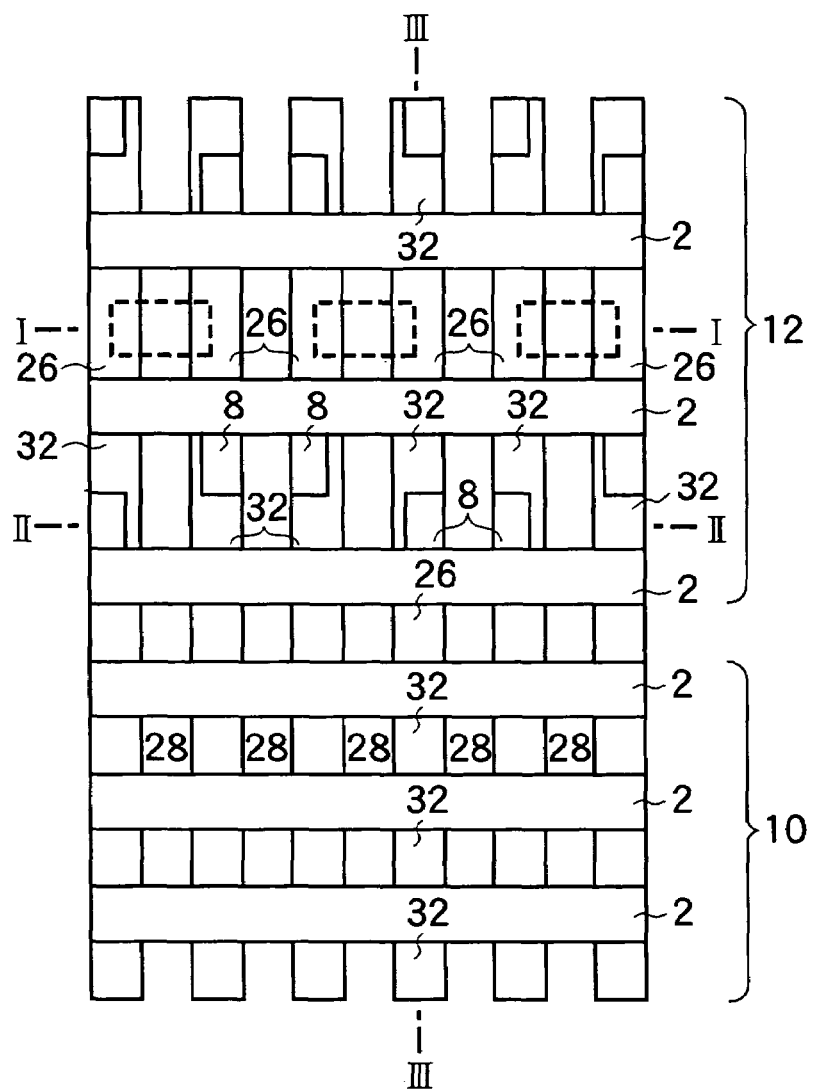
FIG. 57 is a top view of a schematic device pattern in a process of the nonvolatile semiconductor memory fabrication method according to the third embodiment of the present invention.
Figure 58:
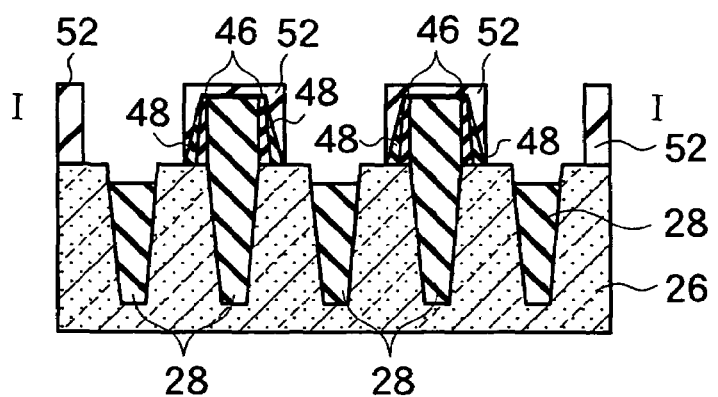
FIG. 58 is a schematic cross-sectional block diagram cut along the line I-I of FIG. 57.
Figure 59:
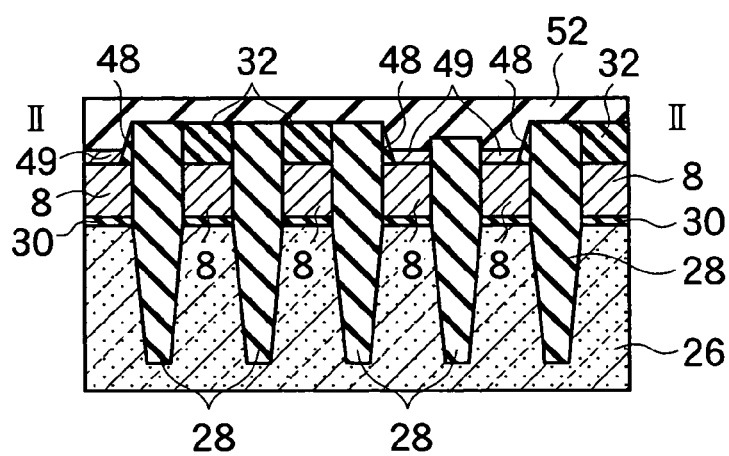
FIG. 59 is a schematic cross-sectional block diagram cut along the line II-II of FIG. 57.
Figure 60:
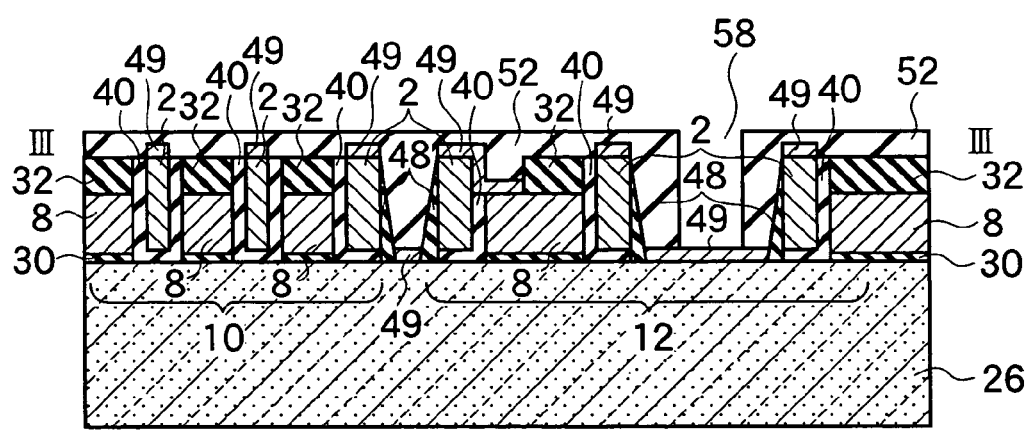
FIG. 60 is a schematic cross-sectional block diagram cut along the line III-III of FIG. 57.
Figure 61:
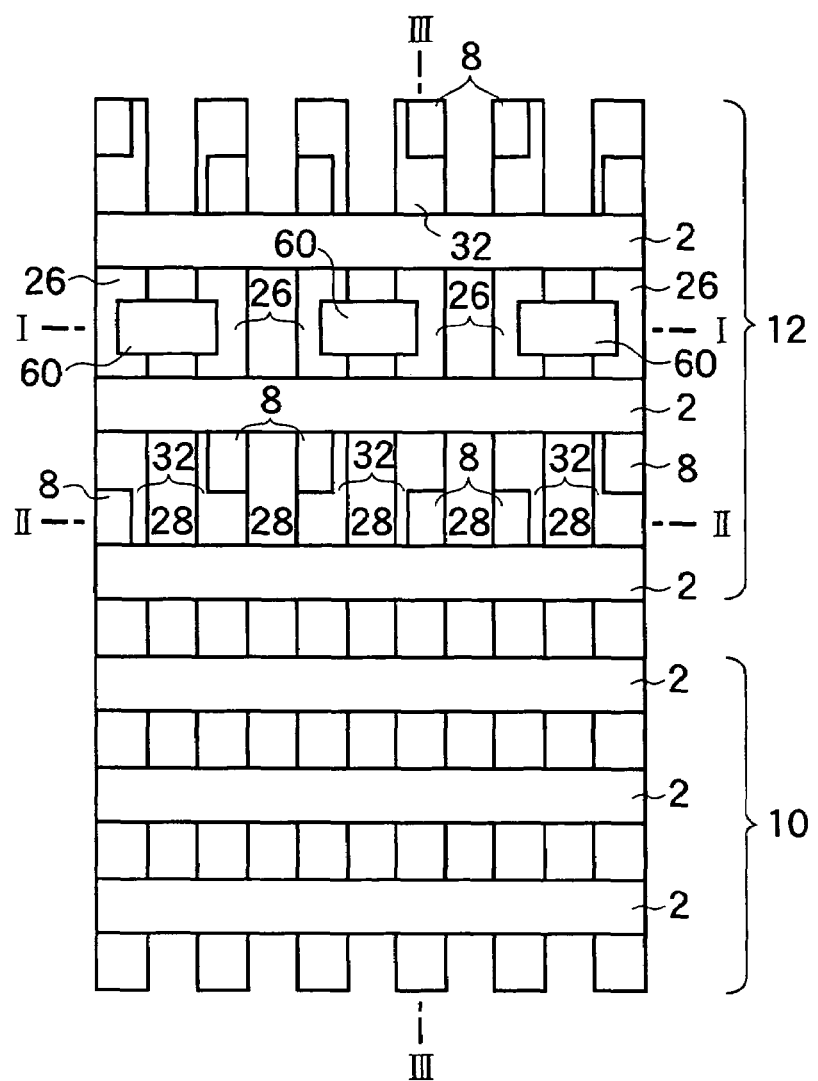
FIG. 61 is a top view of a schematic device pattern in a process of the nonvolatile semiconductor memory fabrication method according to the third embodiment of the present invention.
Figure 62:
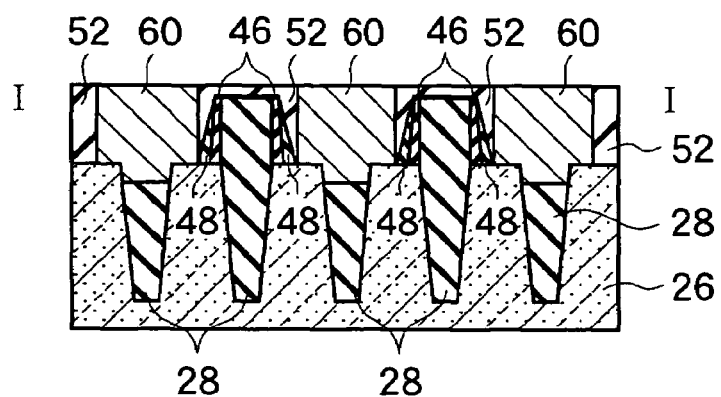
FIG. 62 is a schematic cross-sectional block diagram cut along the line I-I of FIG. 61.
Figure 63:
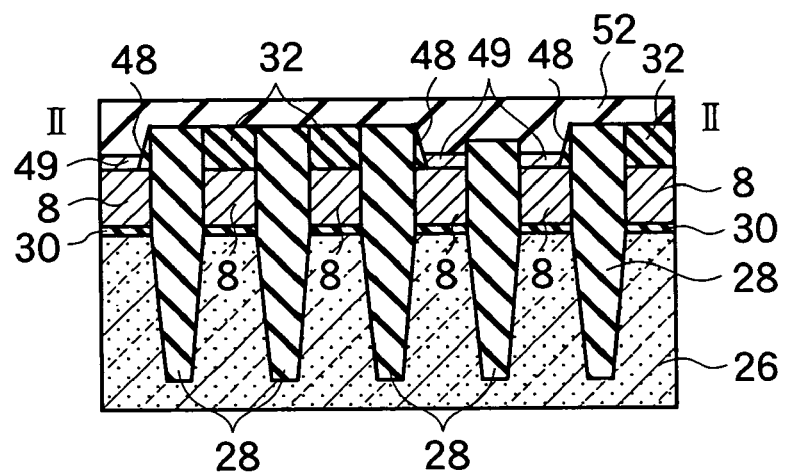
FIG. 63 is a schematic cross-sectional block diagram cut along the line II-II of FIG. 61.
Figure 64:
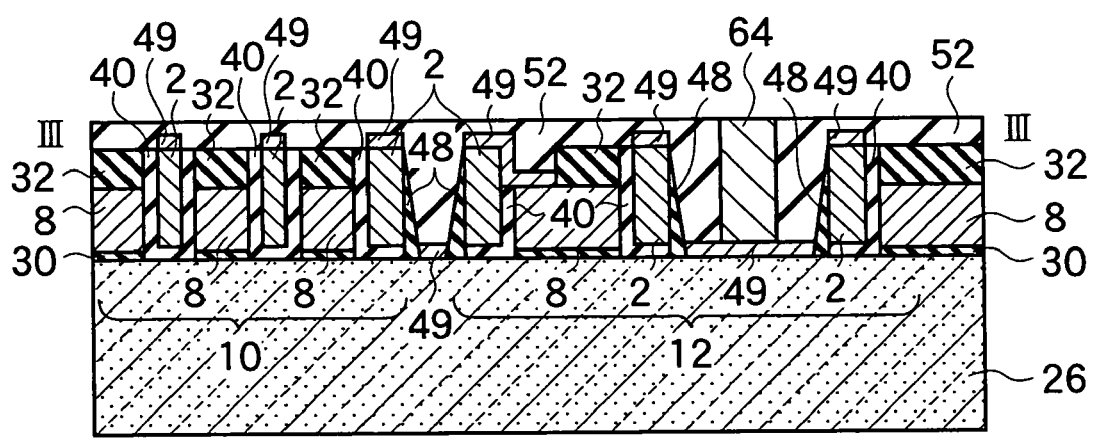
FIG. 64 is a schematic cross-sectional block diagram cut along the line III-III of FIG. 61.
Figure 65:
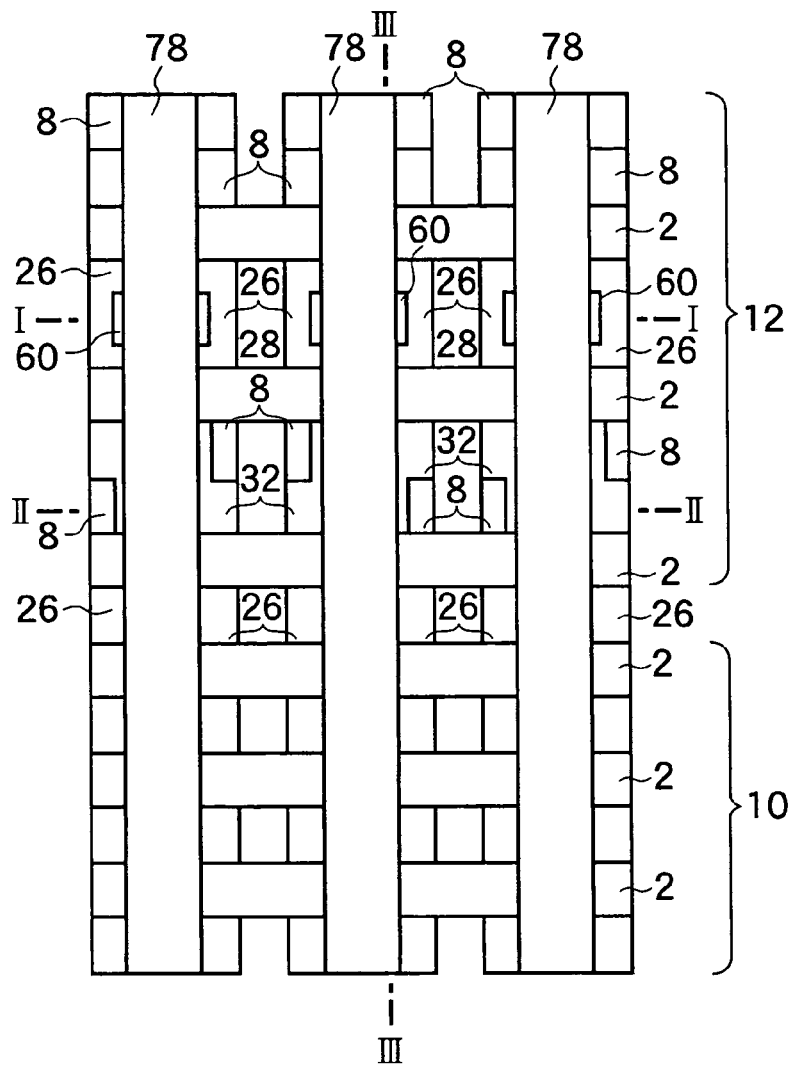
FIG. 65 is a top view of a schematic device pattern in a process of the nonvolatile semiconductor memory fabrication method according to the third embodiment of the present invention.
Figure 66:
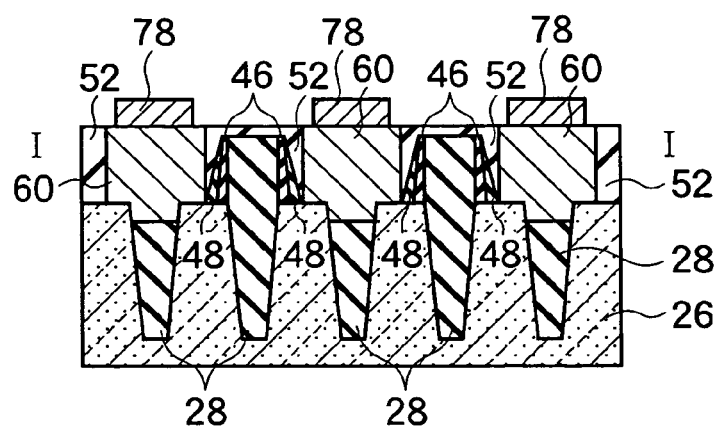
FIG. 66 is a schematic cross-sectional block diagram cut along the line I-I of FIG. 65.
Figure 67:
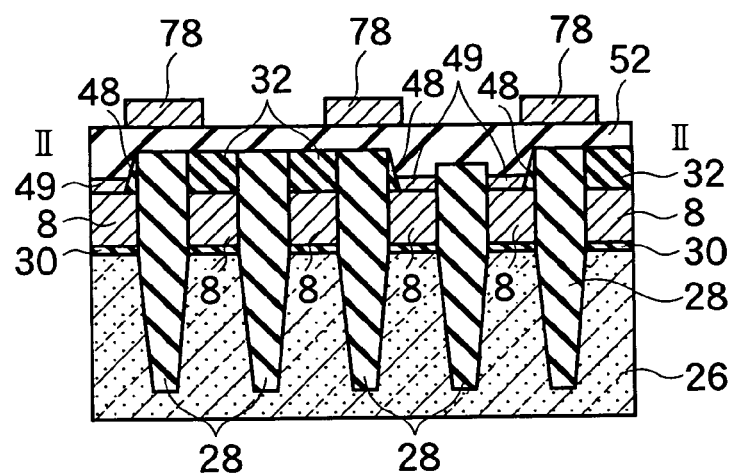
FIG. 67 is a schematic cross-sectional block diagram cut along the line II-II of FIG. 65.
Figure 68:
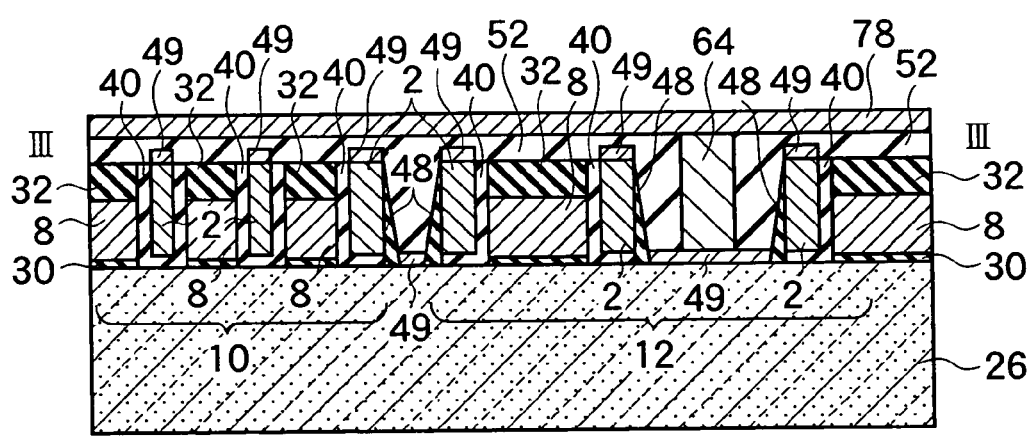
FIG. 68 is a schematic cross-sectional block diagram cut along the line III-III of FIG. 65.
Figure 69:
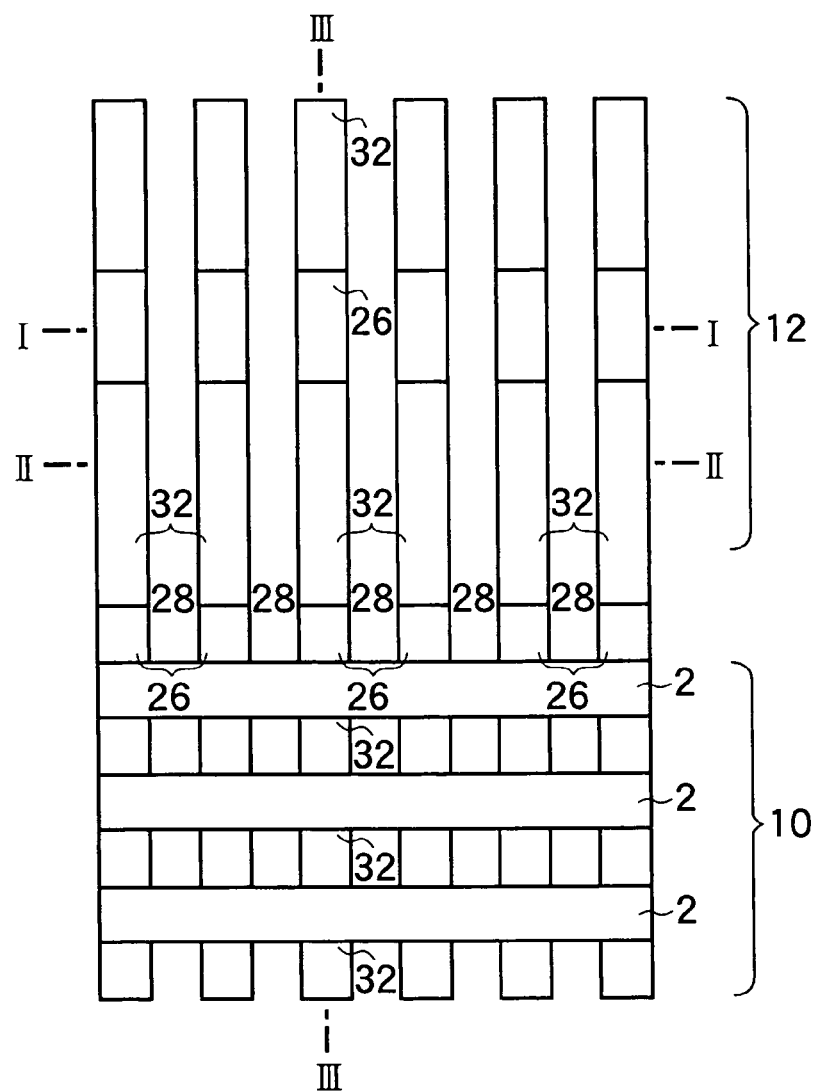
FIG. 69 is a top view of a schematic device pattern in a process of a nonvolatile semiconductor memory fabrication method according to a fourth embodiment of the present invention.
Figure 70:
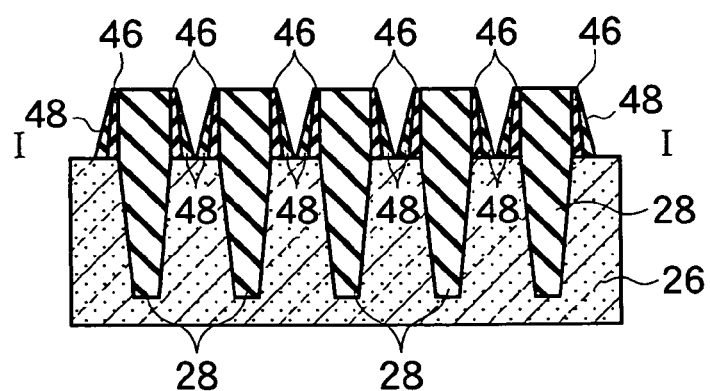
FIG. 70 is a schematic cross-sectional block diagram cut along the line I-I of FIG. 69.
Figure 71:
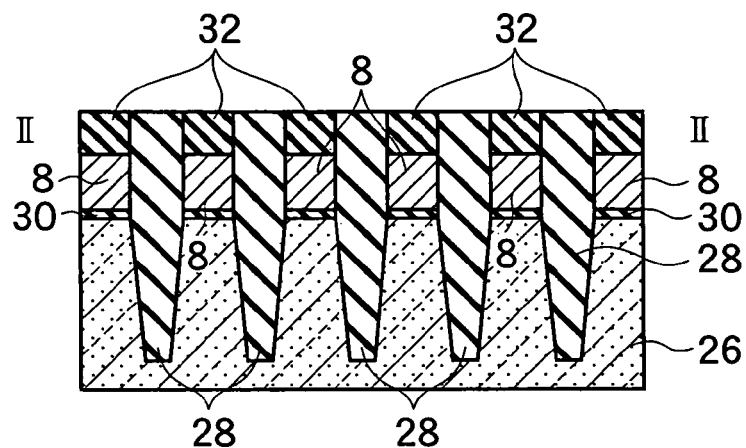
FIG. 71 is a schematic cross-sectional block diagram cut along the line II-II of FIG. 69.
Figure 72:
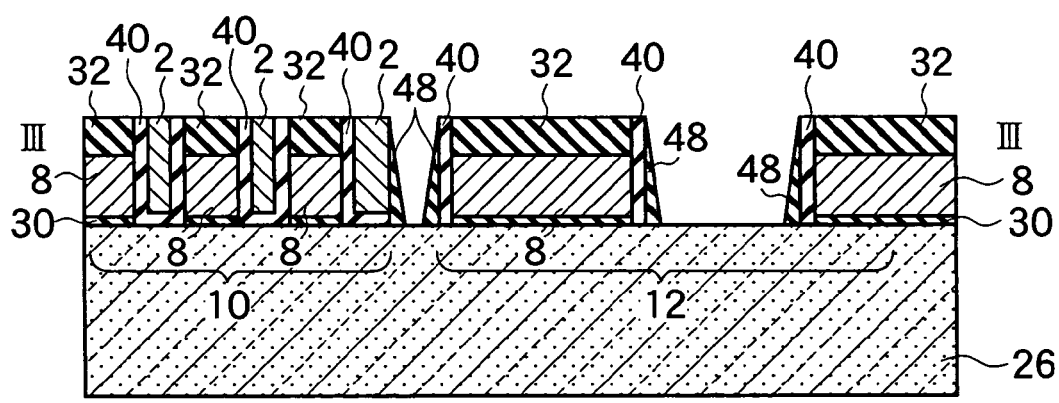
FIG. 72 is a schematic cross-sectional block diagram cut along the line III-III of FIG. 69.
Figure 73:
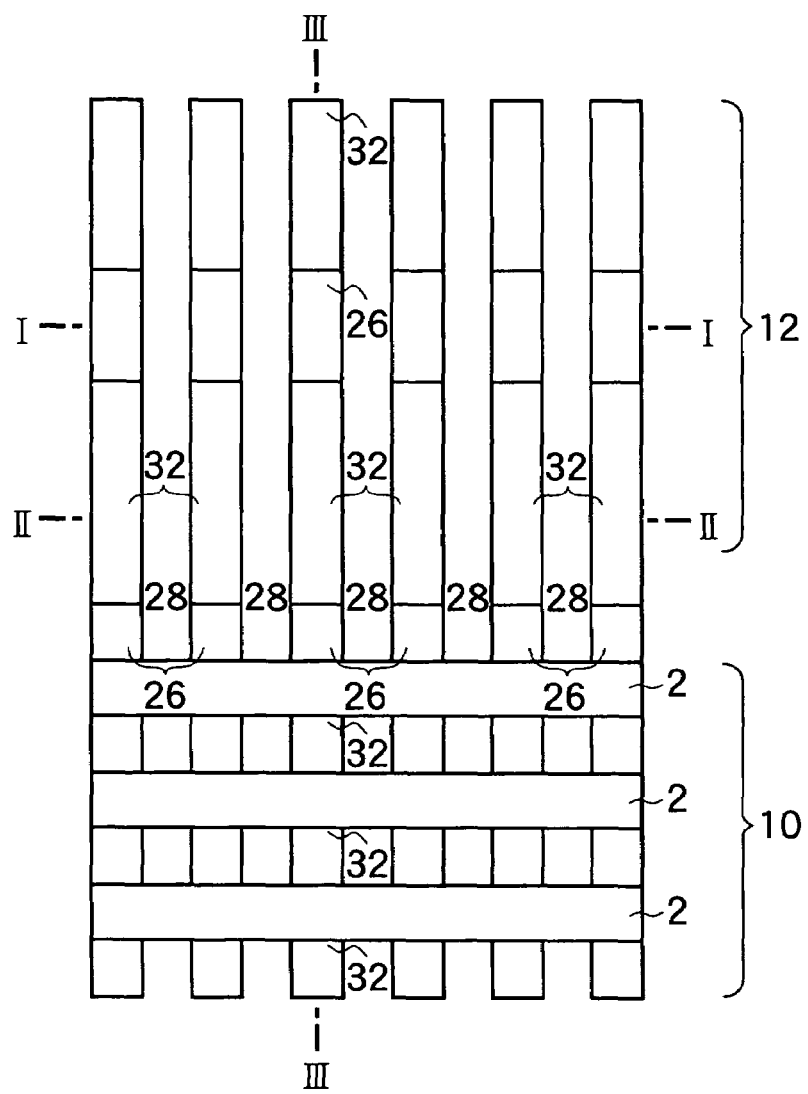
FIG. 73 is a top view of a schematic device pattern in a process of the nonvolatile semiconductor memory fabrication method according to the fourth embodiment of the present invention.
Figure 74:
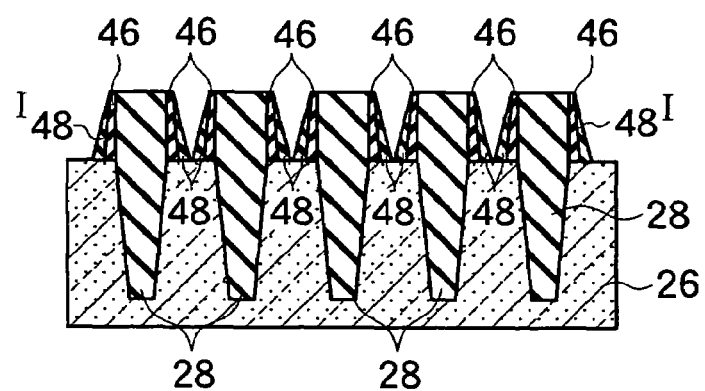
FIG. 74 is a schematic cross-sectional block diagram cut along the line I-I of FIG. 73.
Figure 75:
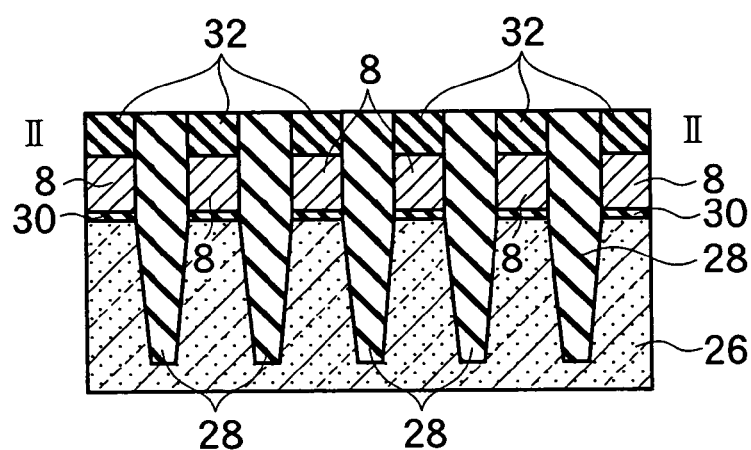
FIG. 75 is a schematic cross-sectional block diagram cut along the line II-II of FIG. 73.
Figure 76:
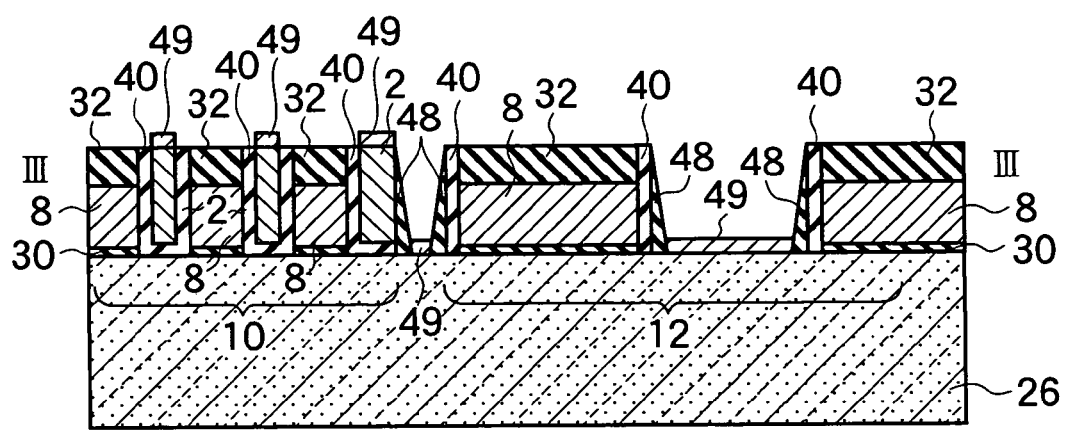
FIG. 76 is a schematic cross-sectional block diagram cut along the line III-III of FIG. 73.
Figure 77:
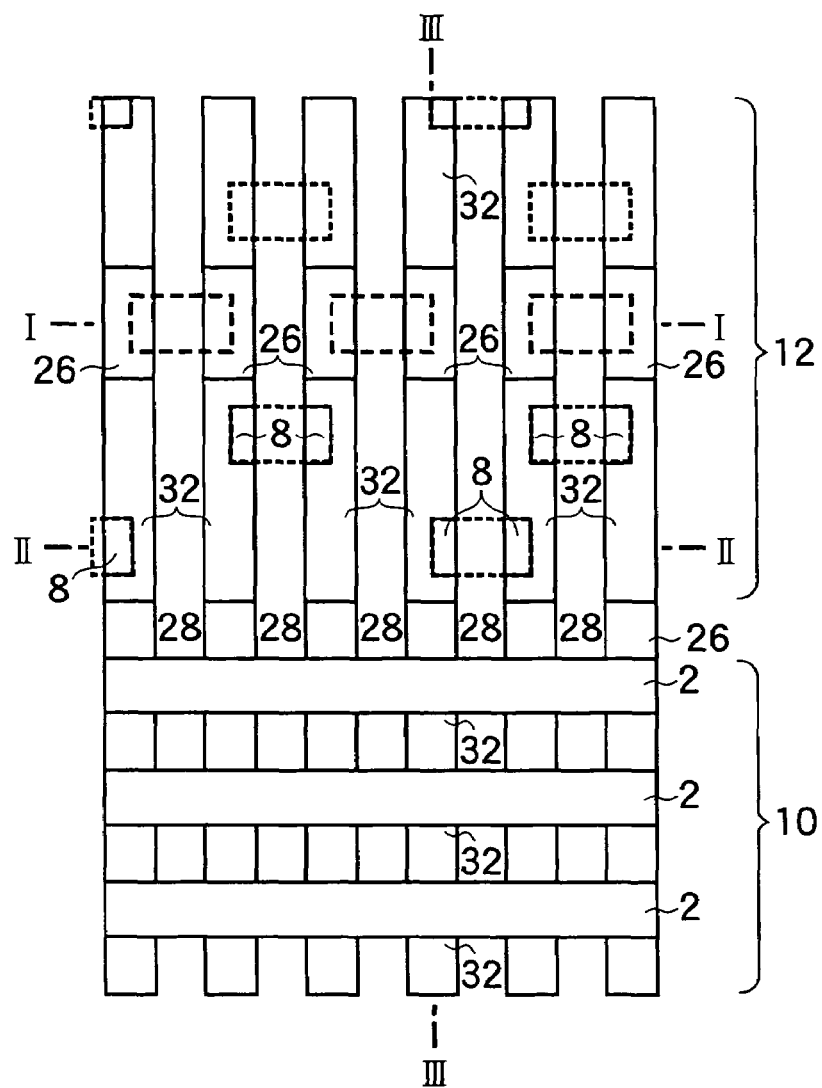
FIG. 77 is a top view of a schematic device pattern in a process of the nonvolatile semiconductor memory fabrication method according to the fourth embodiment of the present invention.
Figure 78:
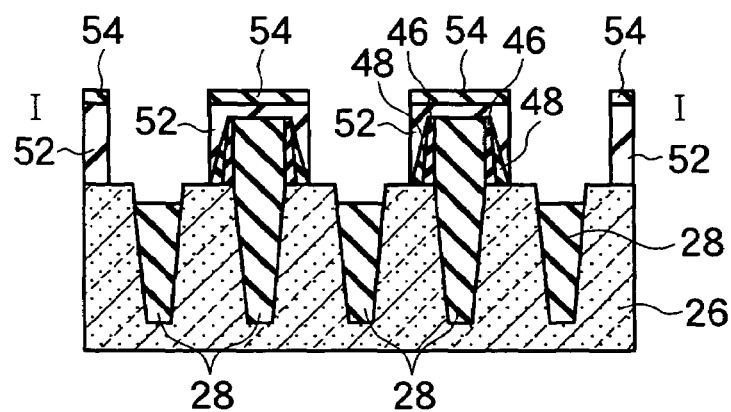
FIG. 78 is a schematic cross-sectional block diagram cut along the line I-I of FIG. 77.
Figure 79:
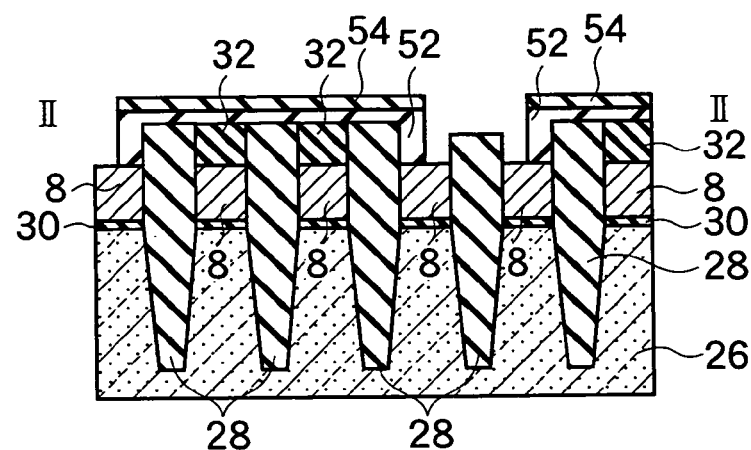
FIG. 79 is a schematic cross-sectional block diagram cut along the line II-II of FIG. 77.
Figure 80:
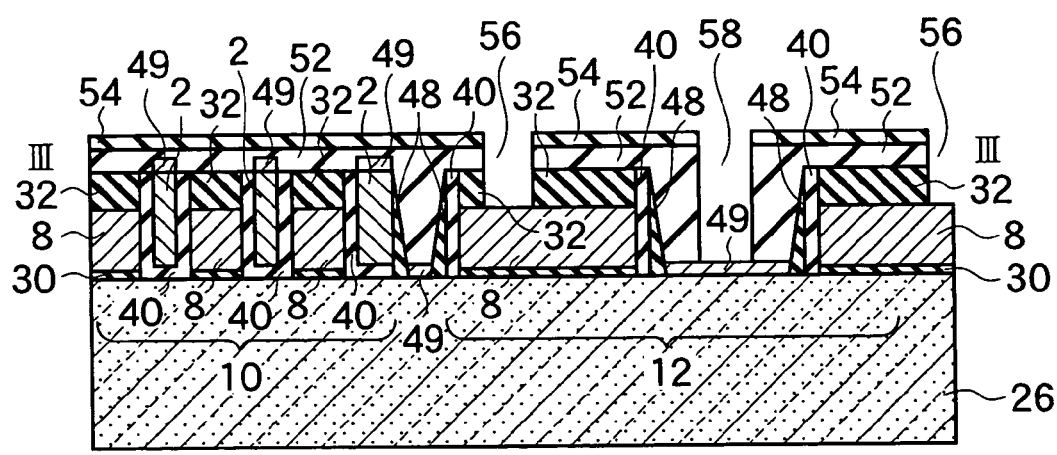
FIG. 80 is a schematic cross-sectional block diagram cut along the line III-III of FIG. 77.

(h) Next, as shown in FIG. 41 and FIG. 44, once a second interlayer insulating film 72, is deposited across the entire surface, a trench for the third contact 70 is formed and a second metal film 74 is deposited using lithography and etching techniques. The third contact 70, made from the second metal film 74, is then formed by polishing the second metal film 74 until exposing the surface of the second interlayer insulating film 72 using CMP techniques. At this time, the third contact 70 is electrically connected to the second interconnect 68.

(i) Next, a third metal film 76 is deposited across the entire surface, forming third interconnects 78 shown in FIG. 45 to FIG. 48 using lithography and etching techniques. At this time, the third interconnects 78 are electrically connected to the third contacts made from the second metal film 74. The third interconnects 78 are electrically connected to two NAND columns via the third contacts 70 made from the second metal film 74, the second interconnects 68, and the second contacts 64. The third interconnects 78 become bit lines BL. Building on the above processes, as shown in the circuitry of FIG. 1A, FIG. 2A, FIG. 4 and FIG. 9, the bit line contacts CB, each connecting a bit line BL to the diffusion layer of the bit line BL side select gate transistor, can be arranged with a pitch that is twice the NAND column pitch, where two NAND columns share a single common bit line BL.

THIRD EMBODIMENT

Referring to FIG. 49 to FIG. 68, a fabrication method of forming a NAND EEPROM memory cell region 10, a select gate transistor region 12 and a bit line BL of a nonvolatile semiconductor memory according to a third embodiment of the present invention are described with an aerial view of a layout pattern, cross sections cut along line I-I, cross sections cut along line II-II, and cross sections cut along line III-III.

(a) The structures shown in FIG. 49 to FIG. 52 correspond to FIG. 25 to FIG. 28 of the first embodiment. The difference from the first embodiment is that interconnects for two select gate transistors are made from a control gate electrode 2 film.

(b) Next, as shown in FIG. 53 to FIG. 56, the cap insulating films 32 in the first opening region 50 and a second opening region 80 are removed using lithography and etching techniques. At this time, the inter-gate insulating films 40 in the first opening region 50 and the second opening region 80 are similarly removed, and in a metal salicide process hereafter described, the first gate electrode 8 film and the second gate electrode 2 film, which are adjacent to each other via the inter-gate insulating films 40 in the first opening region 50 and the second opening region 80, can be electrically connected via the metal salicide film 49. Next, a thin metal film is formed across the entire surface and heated, and by utilizing the cap insulating film 32 and the salicide control insulating film 48, it is possible to form the metal salicide film 49 only on the top surface of the second gate electrode 2 film, the top surface of the floating gate electrode 8 film in the first opening region 50 and the second opening region 80, and the exposed surface of the silicon semiconductor substrate 26 (FIG. 53 to FIG. 56).

(c) Next, an interlayer insulating film 52 is deposited across the entire surface. The interlayer insulating film 52 is planarized using CMP and chemical dry etching (CDE) techniques, and a second contact trench 58 is then formed so as to provide the structures shown in FIG. 57 to FIG. 60.

(d) Next, a first metal film 60 is deposited across the entire surface, and using CMP techniques, a second contact 64 shown in FIG. 61 to FIG. 64 is formed by polishing the first metal film 60 until exposing the surface of the interlayer insulating film 52. At this time, the second contact 64 is electrically connected to the source and drain of the select gate transistor that is exposed to the second contact 64, and two neighboring NAND columns are electrically connected as a result.

(e) Next, as shown in FIG. 65 to FIG. 68, a third metal film 76 is deposited across the entire surface, and using lithography and etching techniques, third interconnects 78 made from the third metal film 76 are formed. At this time, the third interconnects 78 are electrically connected to respective second contacts 64. The third interconnects 78 are electrically connected to two NAND columns via the second contacts 64. The third interconnects 78 become bit lines BL. Building on the above processes, as shown in the circuitry of FIG. 1A, FIG. 2A, FIG. 4 and FIG. 9, the bit line contacts CB, each connecting a bit line BL to the source and drain of the bit line BL side select gate transistor, can be arranged with a pitch that is twice the NAND column pitch, where two NAND columns share a single common bit line BL. Particularly, in comparison to the second embodiment, the third embodiment has advantages in that the first interconnects 66, the second interconnects 68, and the third contacts 70 may be omitted, thereby simplifying the fabrication method.

FOURTH EMBODIMENT

Referring to FIG. 69 to FIG. 92, a fabrication method of forming a NAND EEPROM memory cell region 10, a select gate transistor region 12 and a bit line BL of a nonvolatile semiconductor memory according to a fourth embodiment of the present invention is described with an aerial view of a layout pattern, cross sections cut along line I-I, cross sections cut along line II-II, and cross sections cut along line III-III.

(a) The structures shown in FIG. 69 to FIG. 72 correspond to FIG. 25 to FIG. 28 of the second embodiment, or FIG. 49 to FIG. 52 of the third embodiment. The difference from the second and the third embodiment is that the interconnects for two select gate transistors are made from a first interconnect 66.

(b) Next, as shown in FIG. 73 to FIG. 76, a thin metal film is formed across the entire surface and heated, and by utilizing the cap insulating film 32 and the salicide control insulating film 48, if it is possible to form the metal salicide film 49 only on the top surface of the control gate electrode 2 film, and the exposed surface of the silicon semiconductor substrate 26.

(c) Next, an interlayer insulating film 52 is deposited across the entire surface. The interlayer insulating film 52 is planarized using CMP and CDE techniques, and a mask insulating film 54 is then deposited across the entire surface. A first contact trench 56 and a second contact trench 58 are then formed using lithography and etching techniques so as to form the structures shown in FIG. 77 to FIG. 80.

Figure 81:
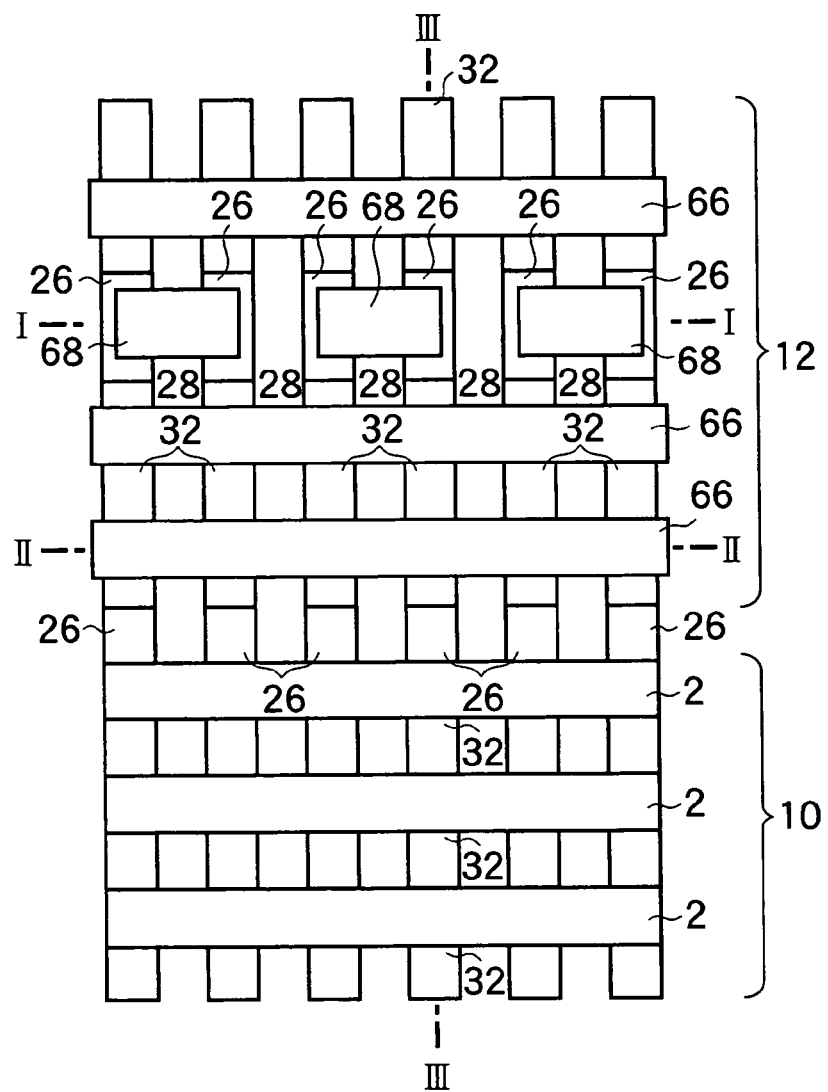
FIG. 81 is a top view of a schematic device pattern in a process of the nonvolatile semiconductor memory fabrication method according to the fourth embodiment of the present invention.
Figure 82:
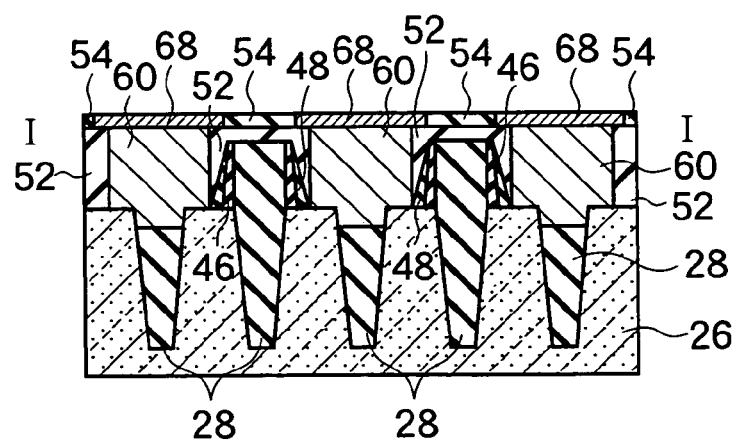
FIG. 82 is a schematic cross-sectional block diagram cut along the line I-I of FIG. 81.
Figure 83:
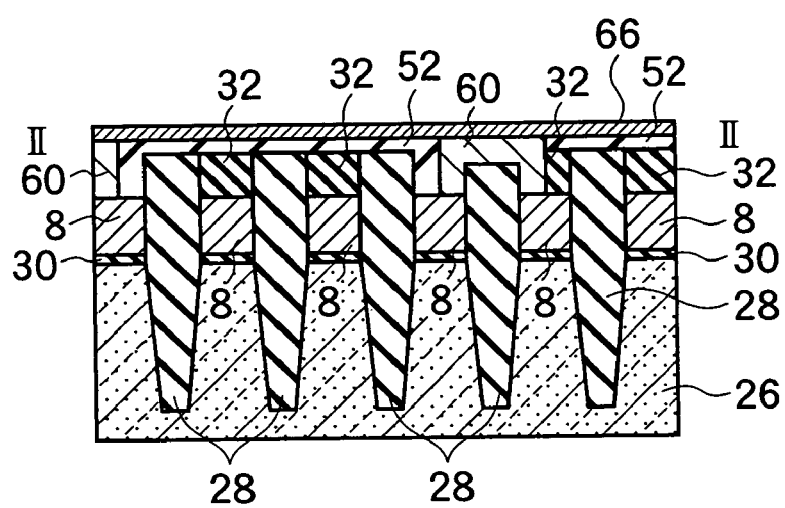
FIG. 83 is a schematic cross-sectional block diagram cut along the line II-II of FIG. 81.
Figure 84:
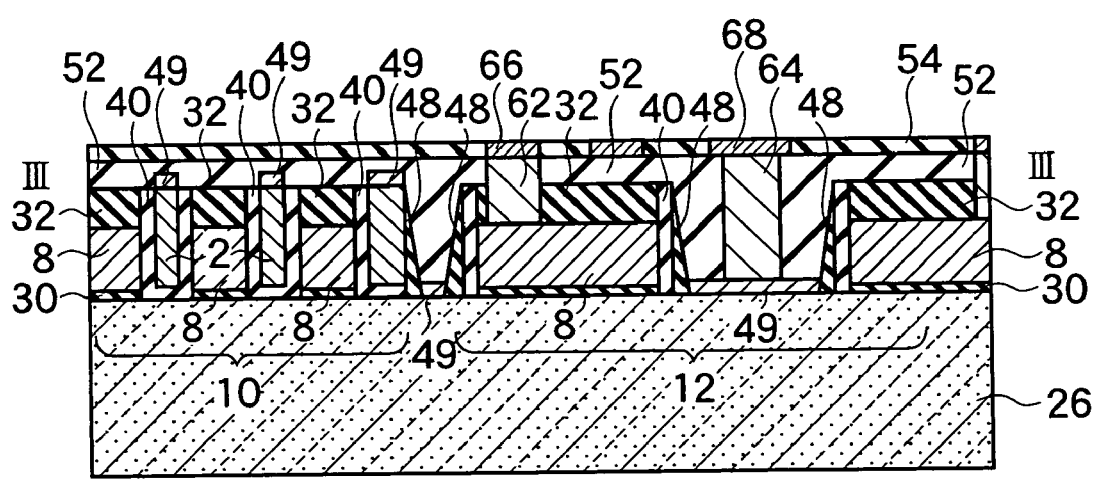
FIG. 84 is a schematic cross-sectional block diagram cut along the line III-III of FIG. 81.

(d) Next, as shown in FIG. 81 and FIG. 84, using lithography and etching techniques, once part of only the mask insulating film 54 is removed and a first interconnect trench and a second interconnect trench are formed, a first metal film 60 is deposited across the entire surface. Then, using CMP techniques, a first contact 62, a second contact 64, a first interconnect 66 and a second interconnect 68 are formed by polishing the first metal film 60 until exposing the surface of the mask insulating film 54. At this time, neighboring floating gates 8 that are exposed to the first contact 62 are electrically connected via the first contact 62. The first contact 62 and the first interconnect 66 are electrically connected. The second contact 64 is electrically connected to the source and drain of the select gate transistor that is disposed adjacent to the second contact 64. As a result, two neighboring NAND columns are electrically connected, and the second contact 64 and the second interconnect 68 are electrically connected.

Figure 85:
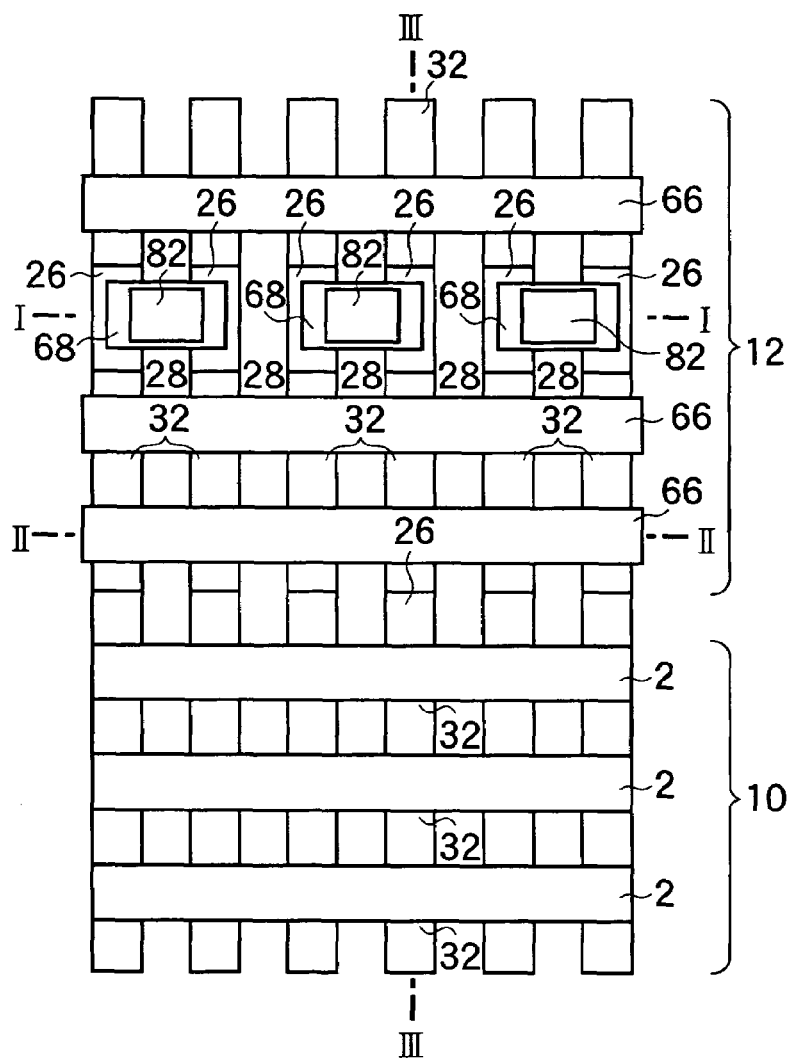
FIG. 85 is a top view of a schematic device pattern in a process of the nonvolatile semiconductor memory fabrication method according to the fourth embodiment of the present invention.
Figure 86:
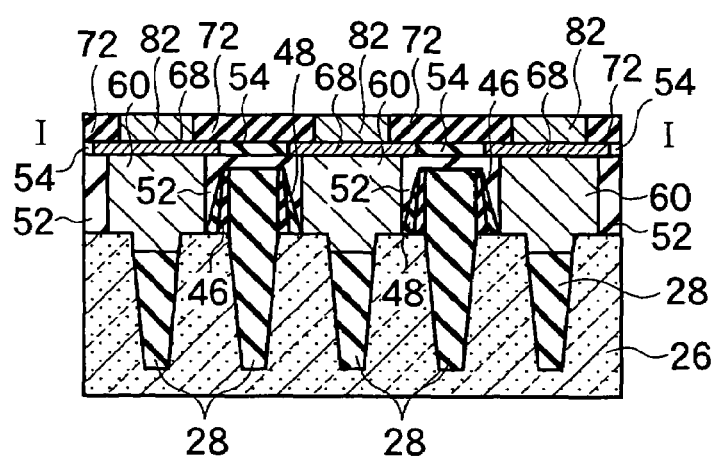
FIG. 86 is a schematic cross-sectional block diagram cut along the line I-I of FIG. 85.
Figure 87:
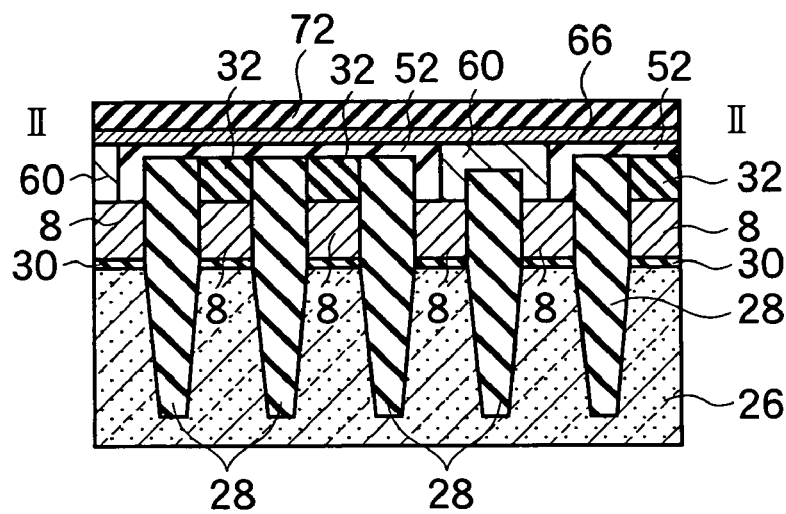
FIG. 87 is a schematic cross-sectional block diagram cut along the line II-II of FIG. 85.
Figure 88:
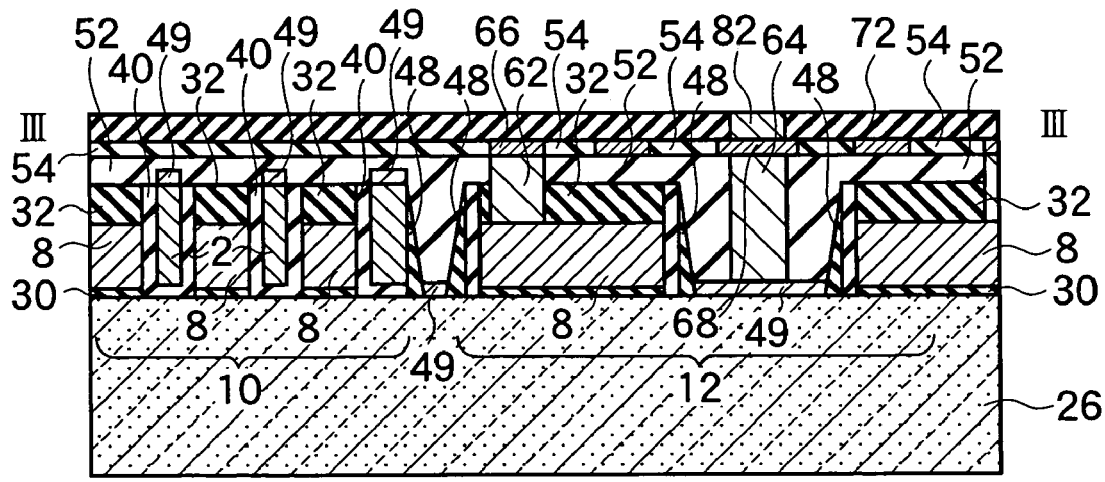
FIG. 88 is a schematic cross-sectional block diagram cut along the line III-III of FIG. 85.
Figure 89:
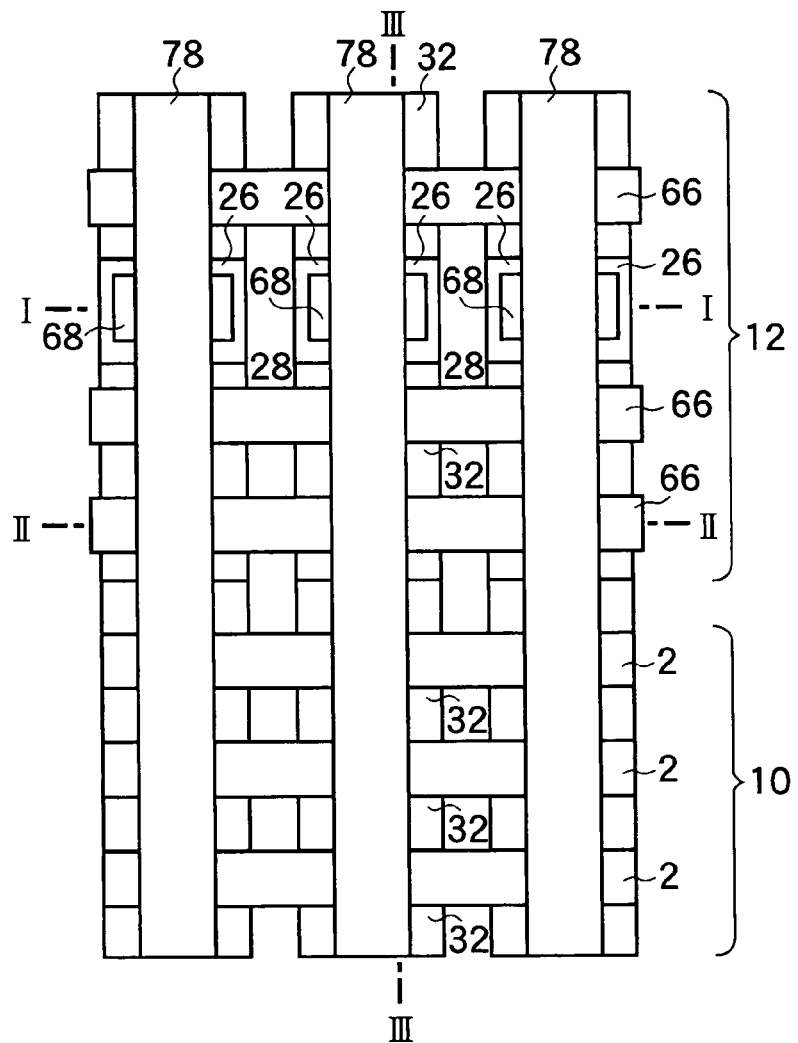
FIG. 89 is a top view of a schematic device pattern in a process of the nonvolatile semiconductor memory fabrication method according to the fourth embodiment of the present invention.
Figure 90:
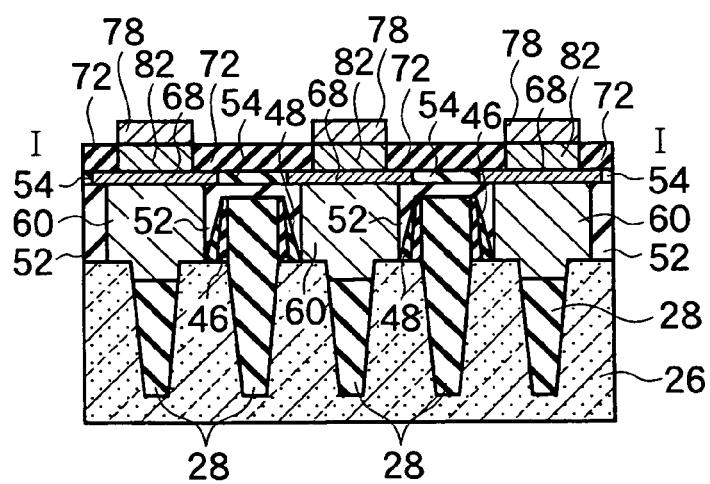
FIG. 90 is a schematic cross-sectional block diagram cut along the line I-I of FIG. 89.
Figure 91:
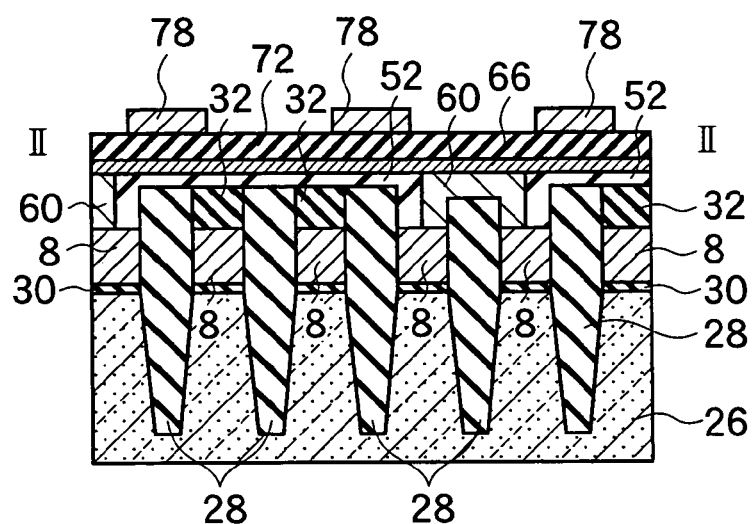
FIG. 91 is a schematic cross-sectional block diagram cut along the line II-II of FIG. 89.
Figure 92:
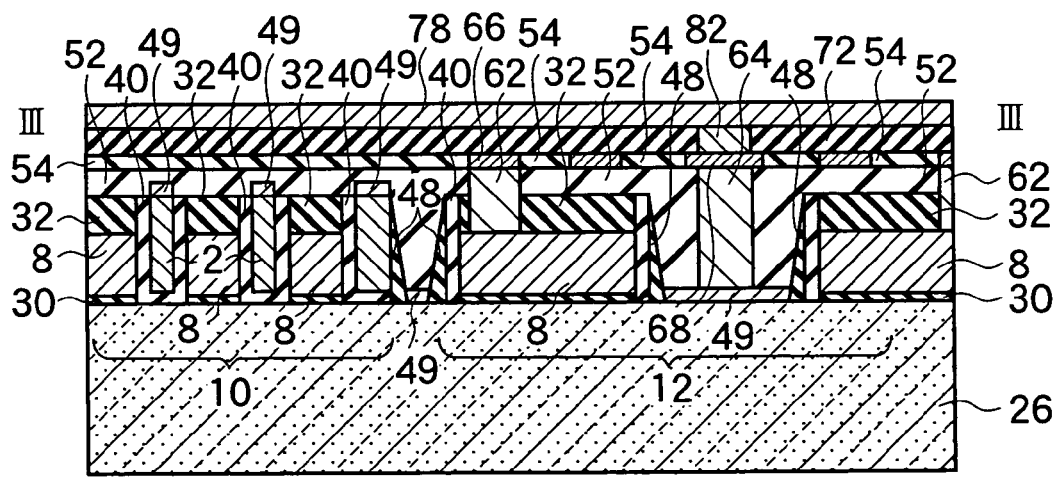
FIG. 92 is a schematic cross-sectional block diagram cut along the line III-III of FIG. 89.
Figure 93:
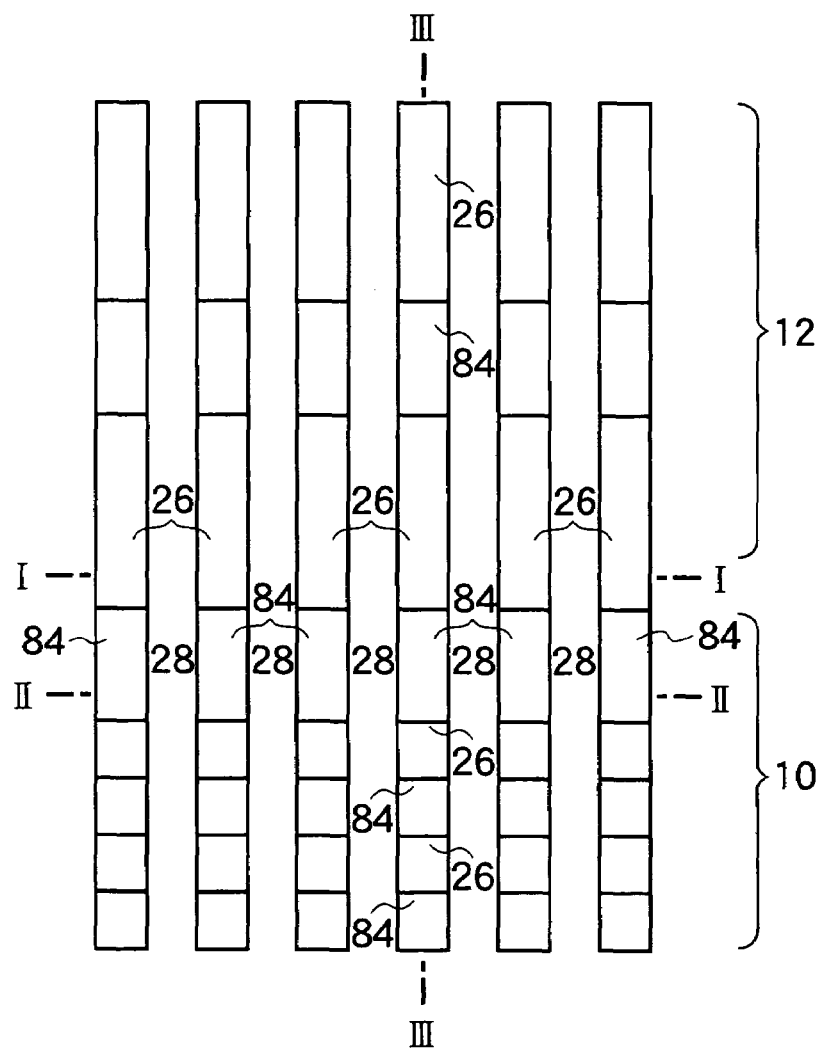
FIG. 93 is a top view of a schematic device pattern in a process of a nonvolatile semiconductor memory fabrication method according to a fifth embodiment of the present invention.
Figure 94:
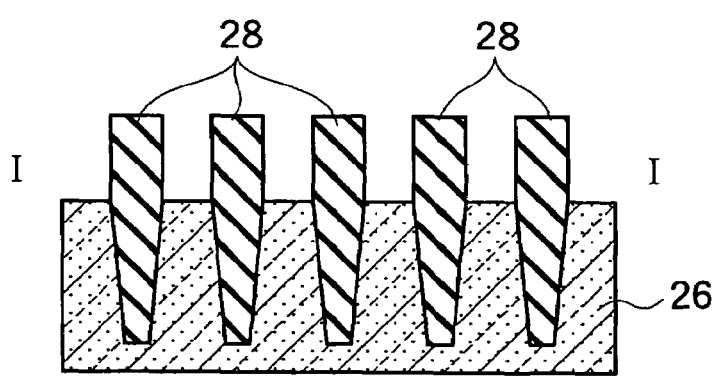
FIG. 94 is a schematic cross-sectional block diagram cut along the line I-I of FIG. 93.
Figure 95:
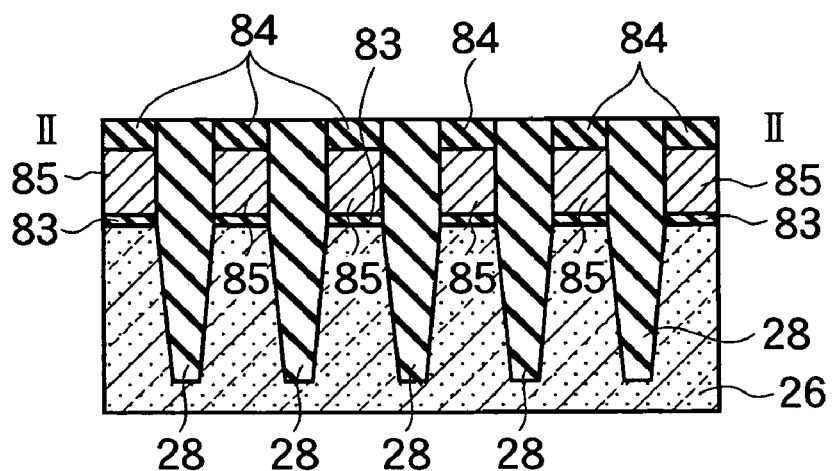
FIG. 95 is a schematic cross-sectional block diagram cut along the line II-II of FIG. 93.
Figure 96:
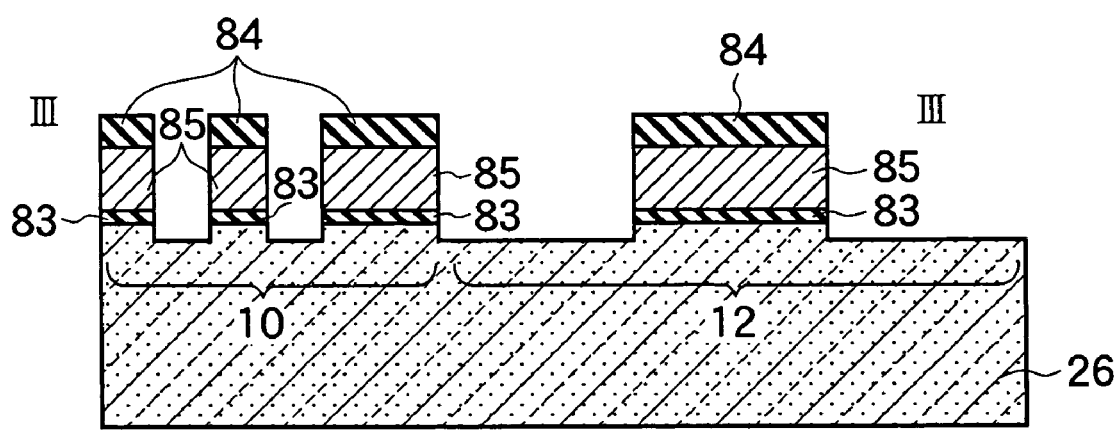
FIG. 96 is a schematic cross-sectional block diagram cut along the line III-III of FIG. 93.
Figure 97:
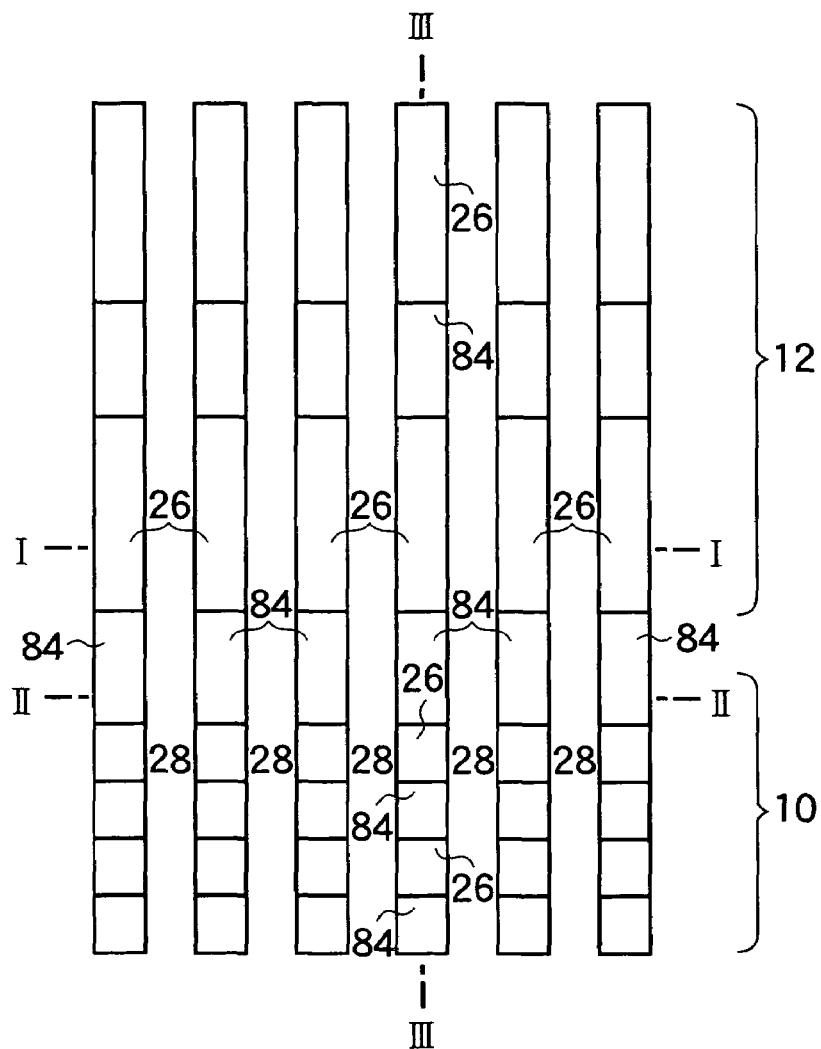
FIG. 97 is a top view of a schematic device pattern in a process of the nonvolatile semiconductor memory fabrication method according to the fifth embodiment of the present invention.
Figure 98:
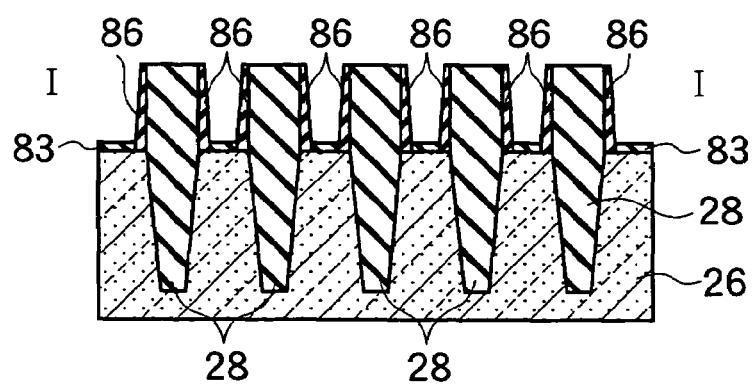
FIG. 98 is a schematic cross-sectional block diagram cut along the line I-I of FIG. 97.
Figure 99:
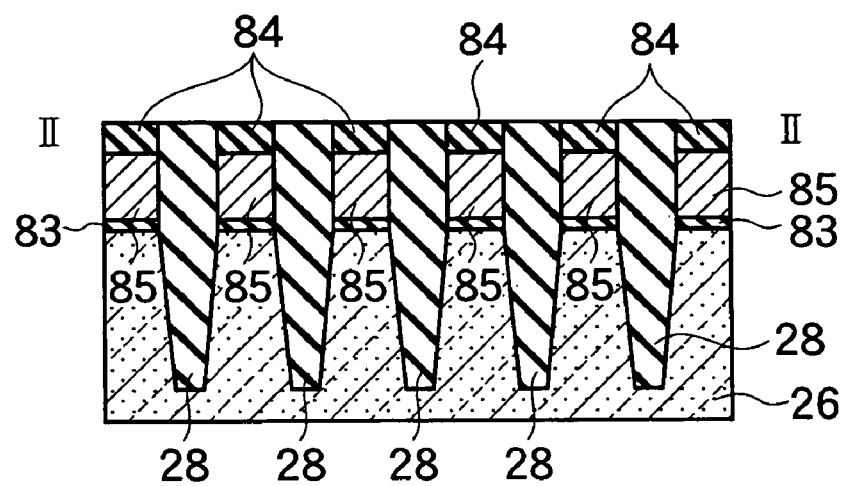
FIG. 99 is a schematic cross-sectional block diagram cut along the line II-II of FIG. 97.
Figure 100:
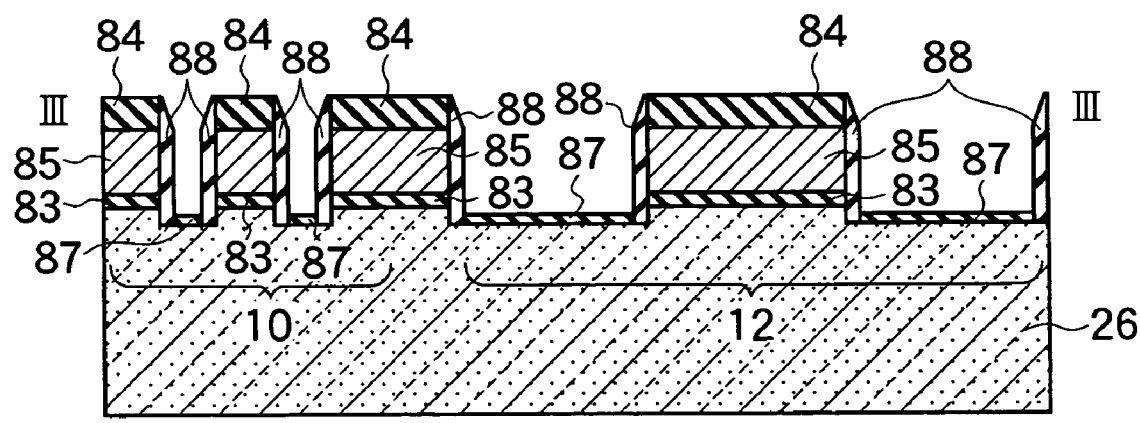
FIG. 100 is a schematic cross-sectional block diagram cut along the line III-III of FIG. 97.
Figure 101:
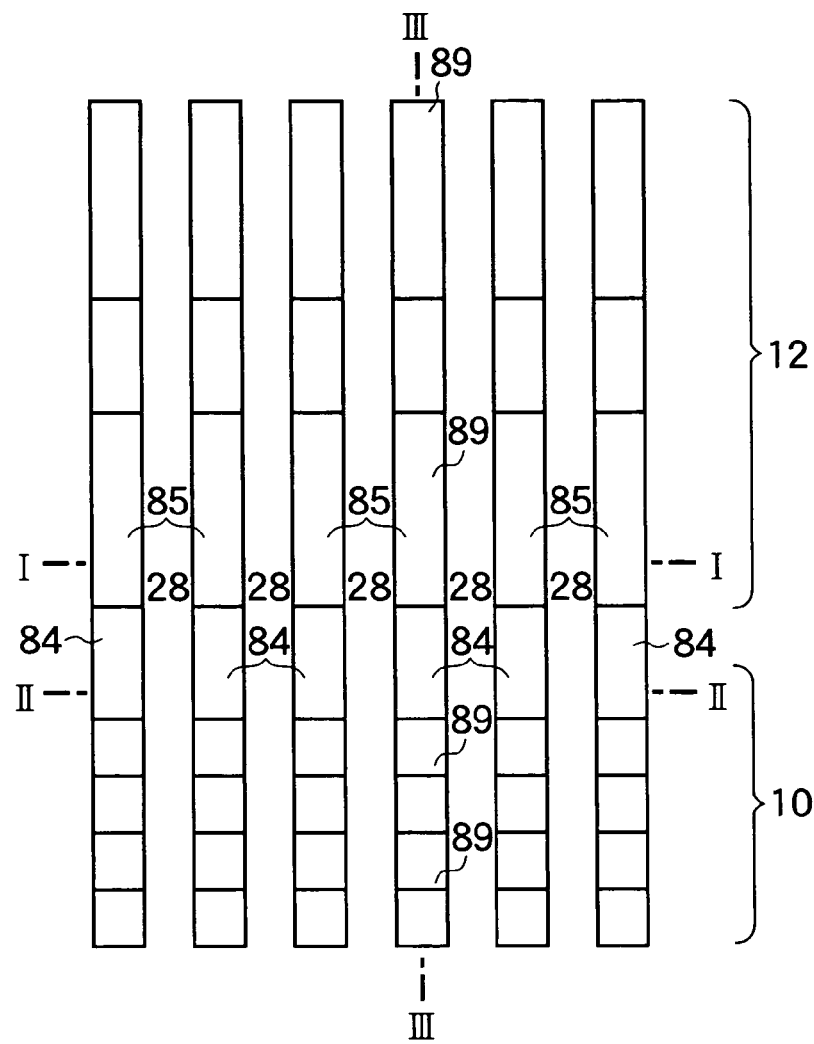
FIG. 101 is a top view of a schematic device pattern in a process of the nonvolatile semiconductor memory fabrication method according to the fifth embodiment of the present invention.
Figure 102:
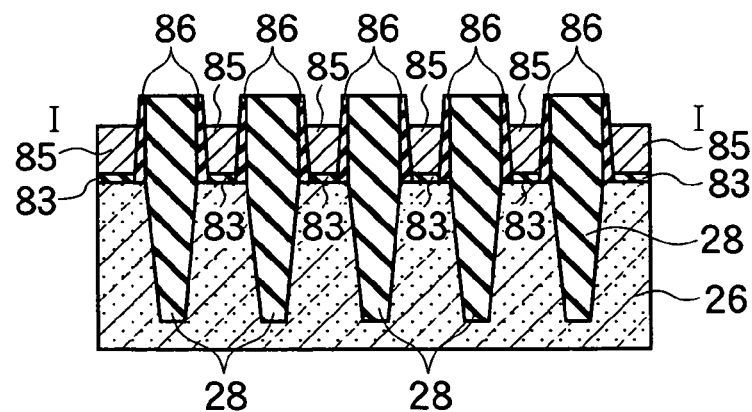
FIG. 102 is a schematic cross-sectional block diagram cut along the line I-I of FIG. 101.
Figure 103:
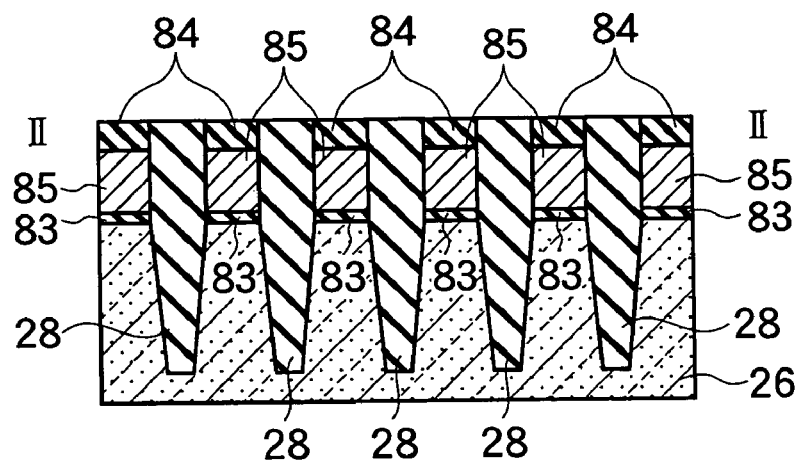
FIG. 103 is a schematic cross-sectional block diagram cut along the line II-II of FIG. 101.
Figure 104:
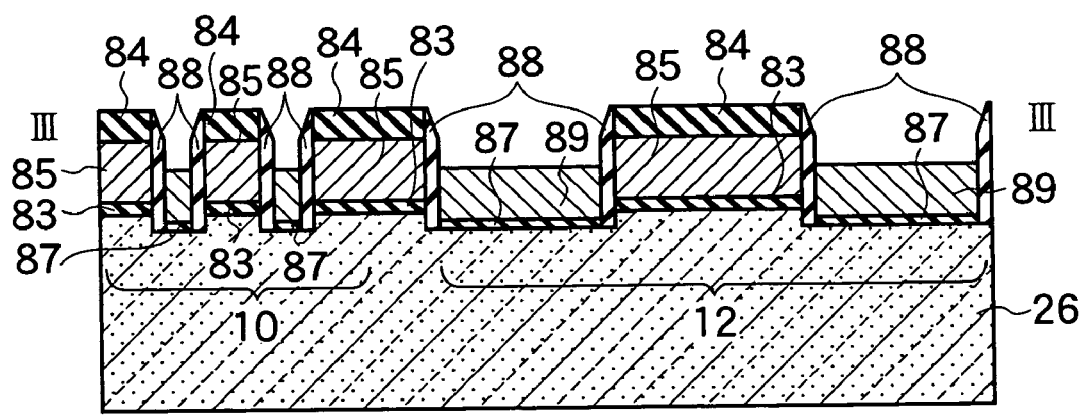
FIG. 104 is a schematic cross-sectional block diagram cut along the line III-III of FIG. 101.
Figure 105:
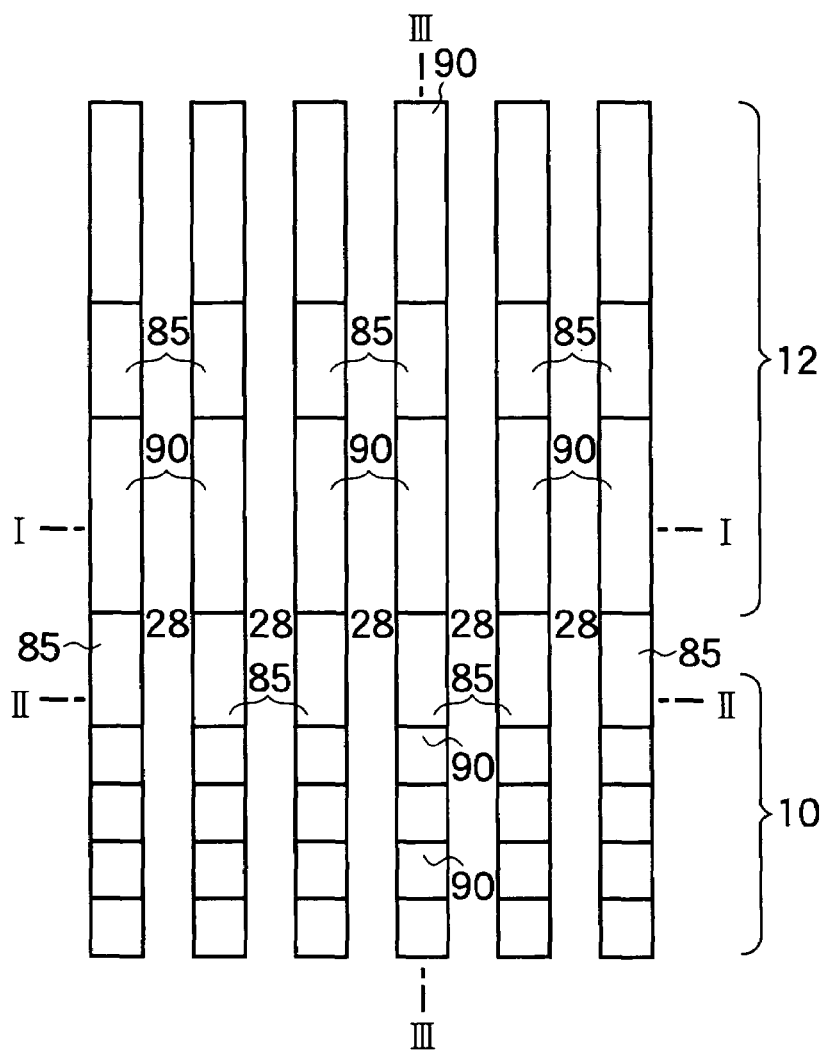
FIG. 105 is a top view of a schematic device pattern in a process of the nonvolatile semiconductor memory fabrication method according to the fifth embodiment of the present invention.
Figure 106:
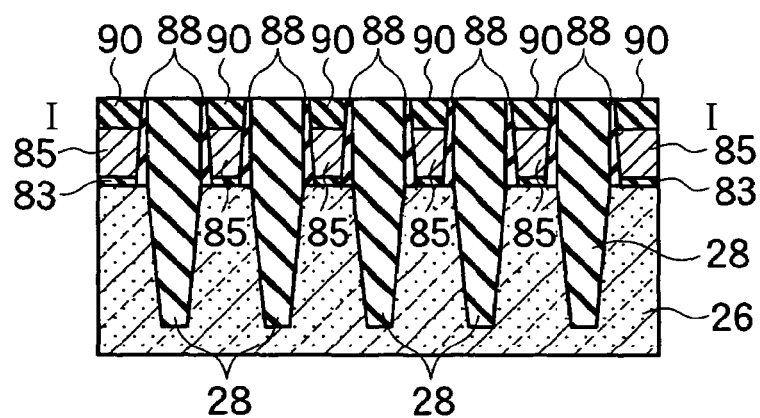
FIG. 106 is a schematic cross-sectional block diagram cut along the line I-I of FIG. 105.
Figure 107:
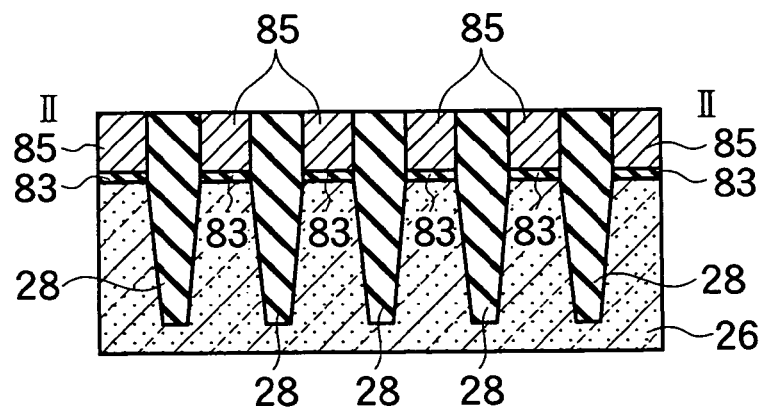
FIG. 107 is a schematic cross-sectional block diagram cut along the line II-II of FIG. 105.
Figure 108:
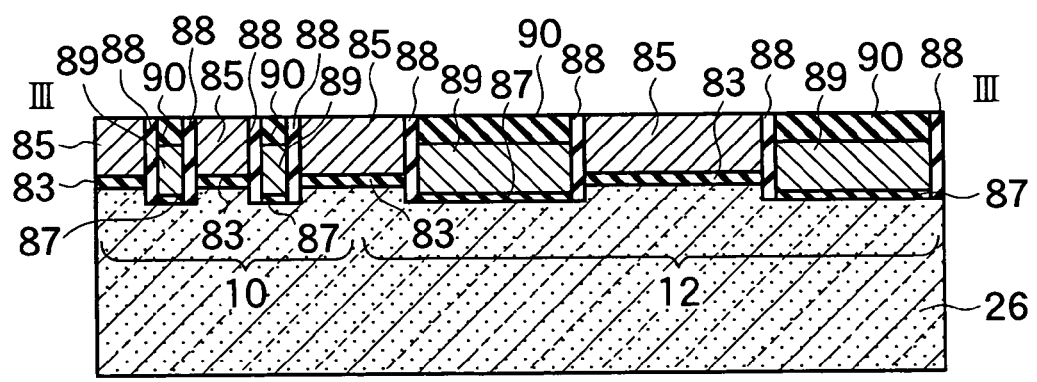
FIG. 108 is a schematic cross-sectional block diagram cut along the line III-III of FIG. 105.
Figure 109:
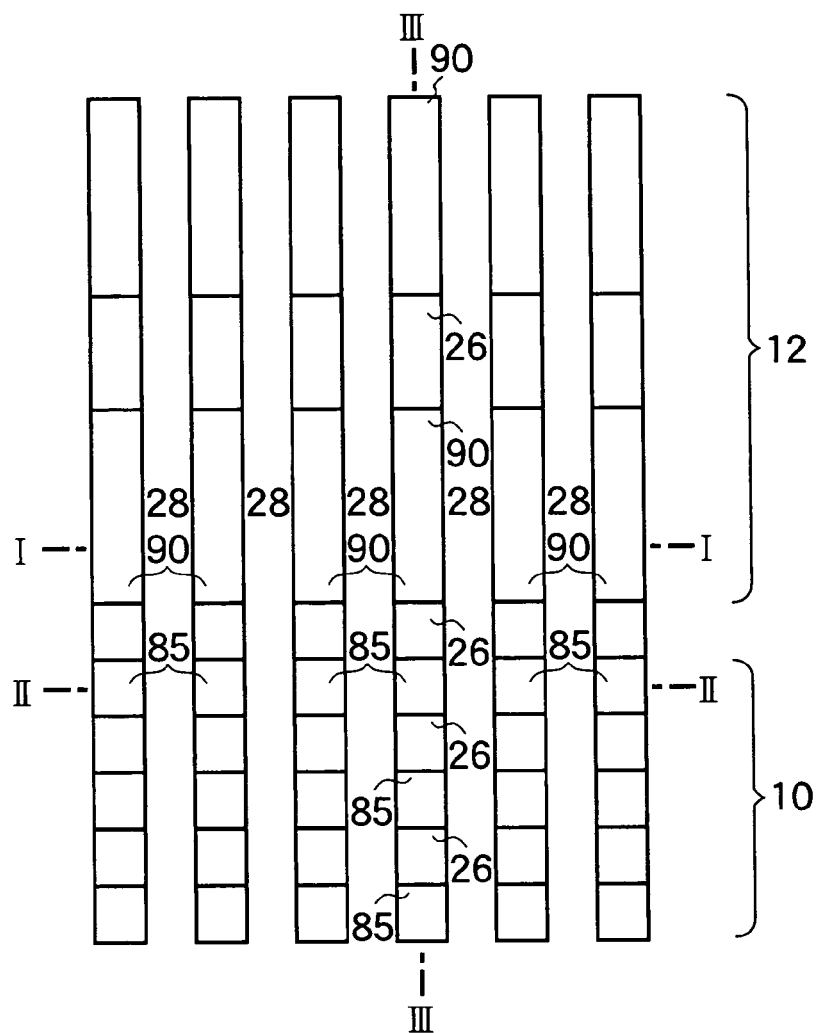
Figure 110:
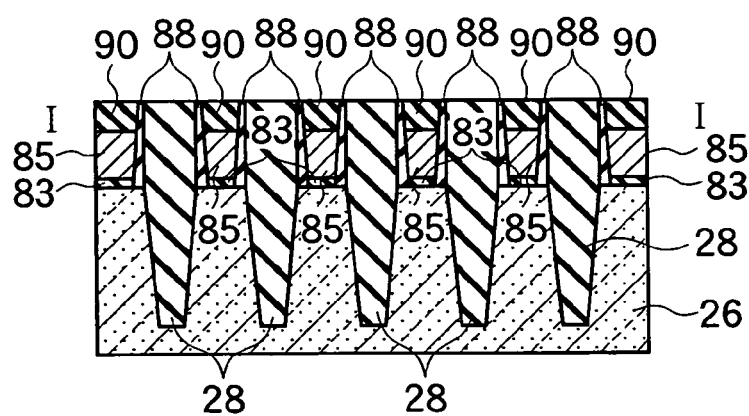
Figure 111:
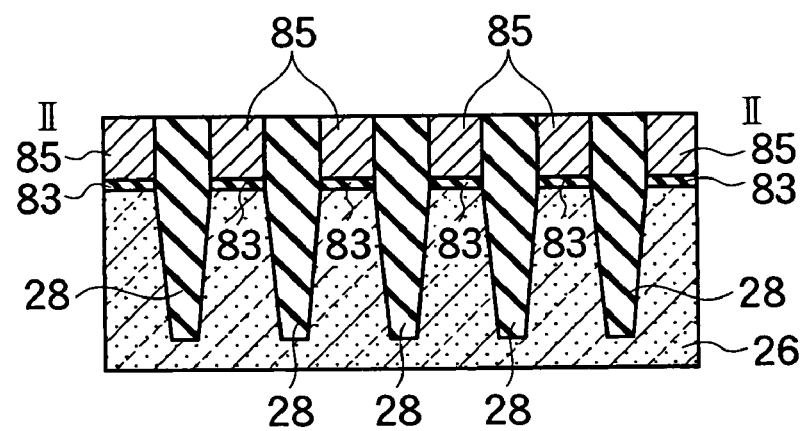
Figure 112:
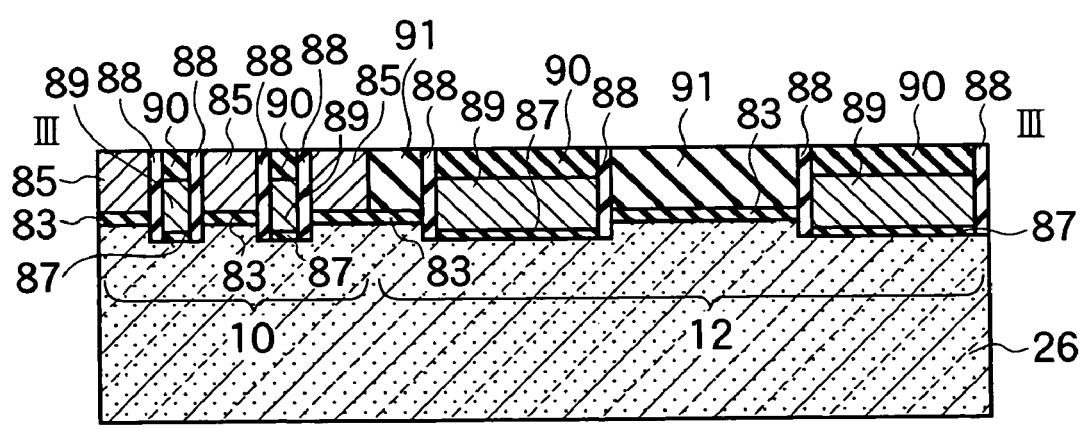

(e) Next, as shown in FIG. 85 and FIG. 88, once a second interlayer insulating film 72 is deposited across the entire surface, a third contact trench is formed and a second metal film 74 is deposited using lithography and etching techniques. Then a third contact 82 made from the second metal film 74 is formed by polishing the second metal film 74 until exposing the surface of the second interlayer insulating film 72 using CMP techniques. At this time, the third contact 82 is electrically connected to the second interconnect 68.

(f) Next, as shown in FIG. 89 to FIG. 92, a third metal film 76 is deposited across the entire surface, and using lithography and etching techniques, third interconnect 78 made from the third metal film 76 is formed. At this time, the third interconnect 78 is electrically connected to the third contact 82. The third interconnect 78 is electrically connected to two NAND columns via the third contact 82, the second interconnect 68, and the second contact 64. As a result, the third interconnect 78 becomes a bit line BL.

Building on the above processes, as shown in the circuitry of FIG. 1A, FIG. 2A, FIG. 4 and FIG. 9, the bit line contacts CB, each connecting a bit line BL to the source and drain of the bit line BL side select gate transistor, can be arranged with a pitch that is twice the NAND column pitch, where two NAND columns share a single common bit line BL. In comparison to the second embodiment, there is an advantage in that the step of forming the first opening region 50 shown in FIG. 29 may be omitted, thereby simplifying the fabrication method.

FIFTH EMBODIMENT

Referring to FIG. 93 to FIG. 140, a fabrication method of forming a NAND EEPROM memory cell region 10, a select gate transistor region 12 and a bit line BL in a nonvolatile semiconductor memory according to a fifth embodiment of the present invention is described with an aerial view of a layout pattern, cross sections cut along line I-I, cross sections cut along line II-II, and cross sections cut along line III-III.

(a) To begin with, an first insulating film 83, which becomes memory cell transistor gate insulating films, a second gate electrode 85 film, which becomes control gates, and then a first mask insulating film 84 are deposited across the entire surface of a silicon semiconductor substrate 26. As to selectivity for the first mask insulating film 84, a predetermined appropriate selective etching ratio relative to the control gate electrode 85 film is a minimum requirement; however, it is further preferable that the first mask insulating film 84 should be one that allows a appropriate selective polishing ratio for the CMP processing for floating gate electrodes 89 and a device isolating region 28 insulating film hereafter described. Subsequently, device-isolating trenches are formed using lithography and etching techniques, and the device isolating region 28 insulating film is deposited across the entire surface. The device isolating regions 28 are then formed using CMP techniques. Portions intended for forming floating gates 89 are then formed using lithography and etching techniques (FIG. 93 to FIG. 96). At this time, it is preferable that the portions of the silicon semiconductor substrate 26 intended for forming the floating gates 89 are etched to an appropriate depth; however, most of the buried insulating film of the device separating region 28 is not etched.

(b) Next, once an appropriate heat treatment is performed, a third insulating film 88, which becomes an inter-gate insulating film between the control gate 85 and the floating gate 89, is deposited, a channel profile for memory cell transistors is formed, and openings are made in a tunnel insulating film 87. The process of forming the channel profile may naturally be omitted through adjustment of the threshold for the memory cell transistors by controlling the impurity profile for the memory cell forming region 10 within the well and the etching depth. Next, the tunnel insulating film 87 for memory cell transistors is formed so as to form the structures shown in FIG. 97 to FIG. 100.

(c) Next, a floating gate electrode 89 film is deposited across the entire surface, and using etch back techniques, the height of the floating gates 89 is decreased so as to form the structures shown in FIG. 101 to FIG. 104. It is preferable for the upper surface of the control gates 85 to be provided at a position detached from the upper surface of the floating gates 89 formed in the CMP process, at a distance capable of providing an appropriate insulation resistance. At this time, in order to improve the controllability of the height of the control gates 85, it is possible to perform the above etching after planarizing the floating gate electrode 89 film, using the tunnel insulating film 87 as mask material.

(d) Next, once a cap insulating film 90 for insulating the control gates 85 is formed across the entire surface, only the control gate electrode 85 is exposed using CMP techniques so as to form the structures shown in FIG. 105 to FIG. 108. At this time, it is a minimum requirement for the cap insulating film 90 having a sufficient selective etching ratio relative to the control gate electrode 85.

(e) Next, in part of the process of forming a select gate transistor, once the control gate electrodes 85 are selectively etched and a interlayer insulating film 91 is deposited across the entire surface using lithography and etching techniques, only the control gate electrodes 85 are exposed using CMP techniques so as to form the structures shown in FIG. 109 to FIG. 112.

Figure 113:
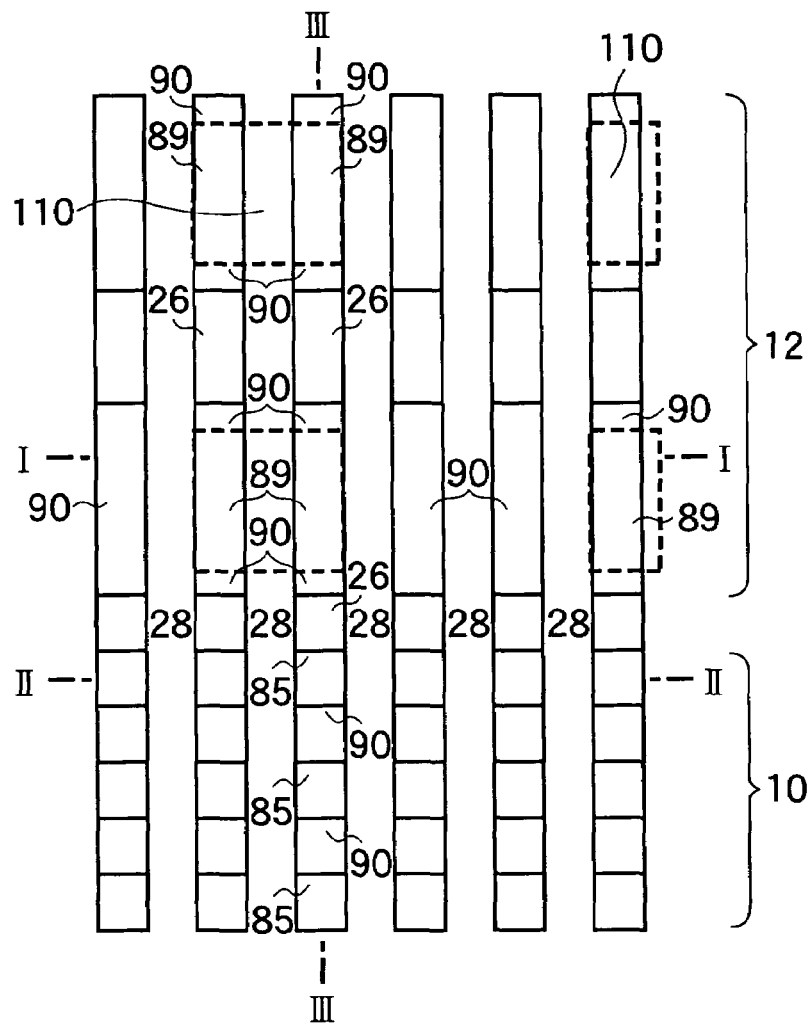
Figure 114:
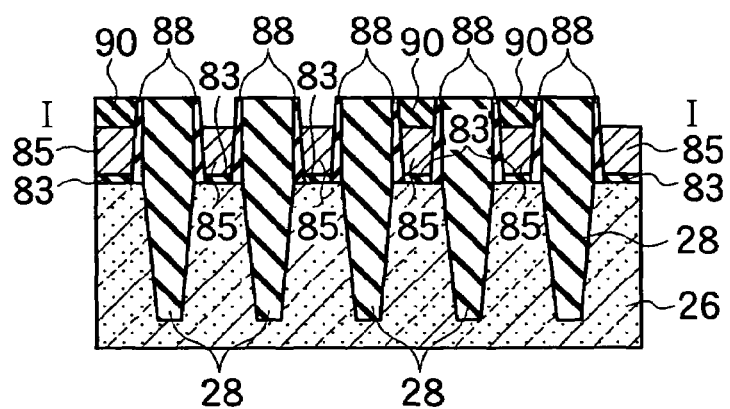
Figure 115:
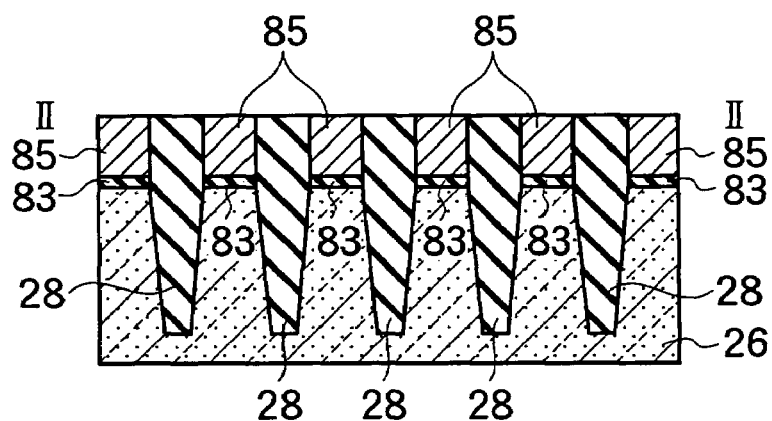
Figure 116:
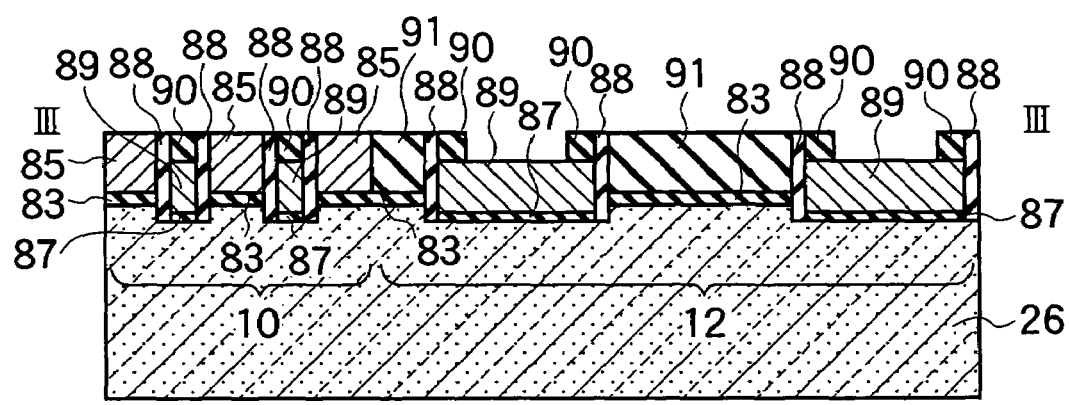
Figure 117:
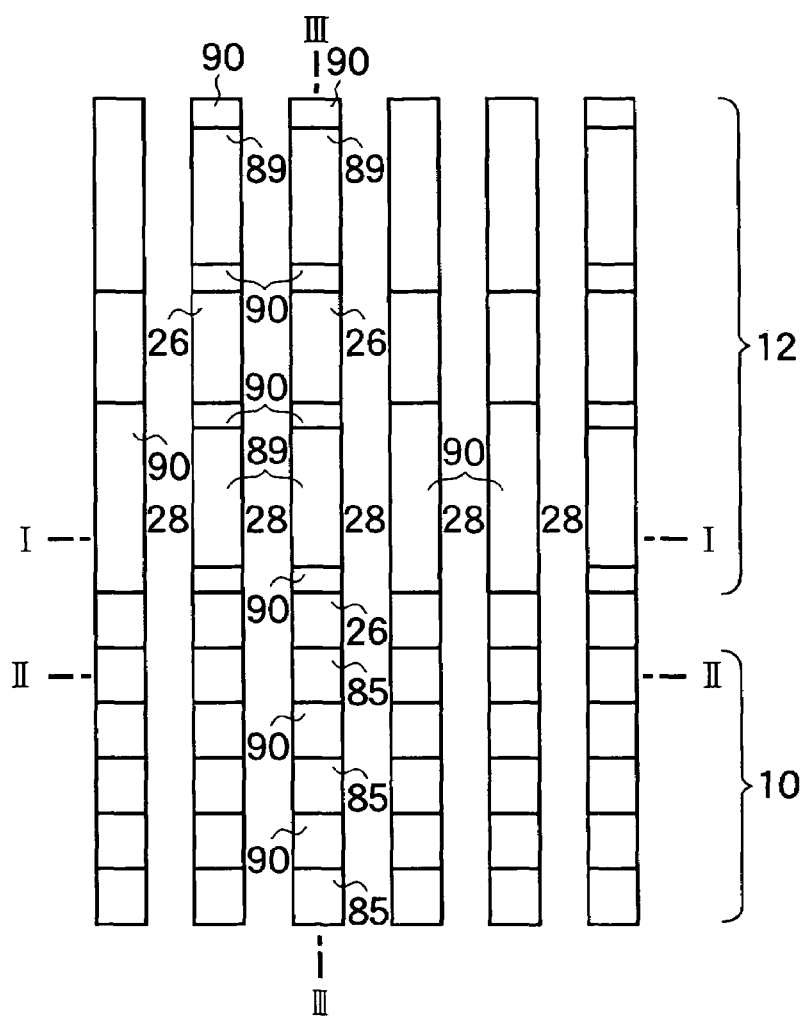
Figure 118:
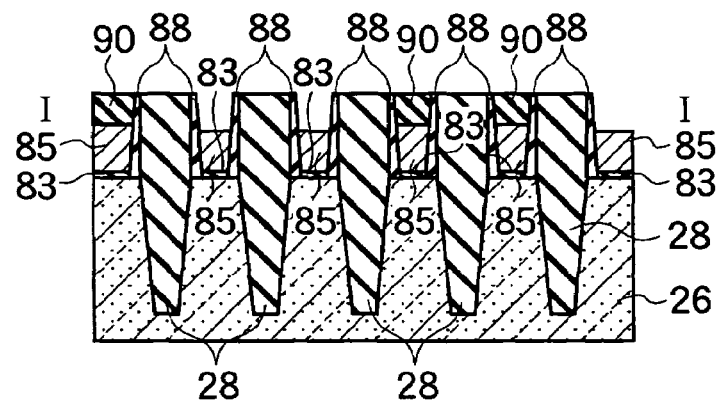
Figure 119:
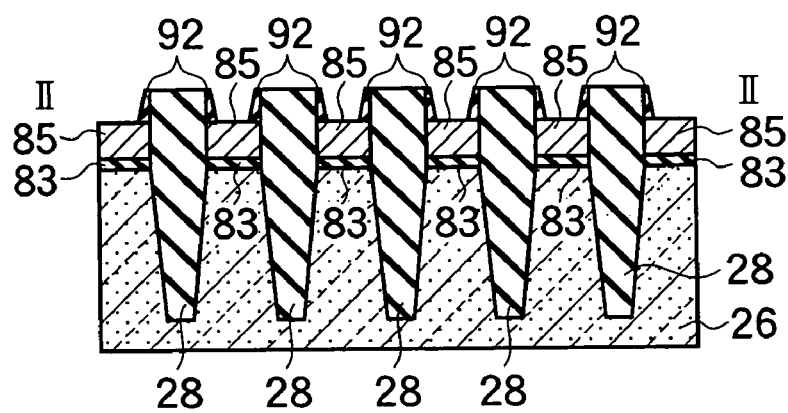
Figure 120:
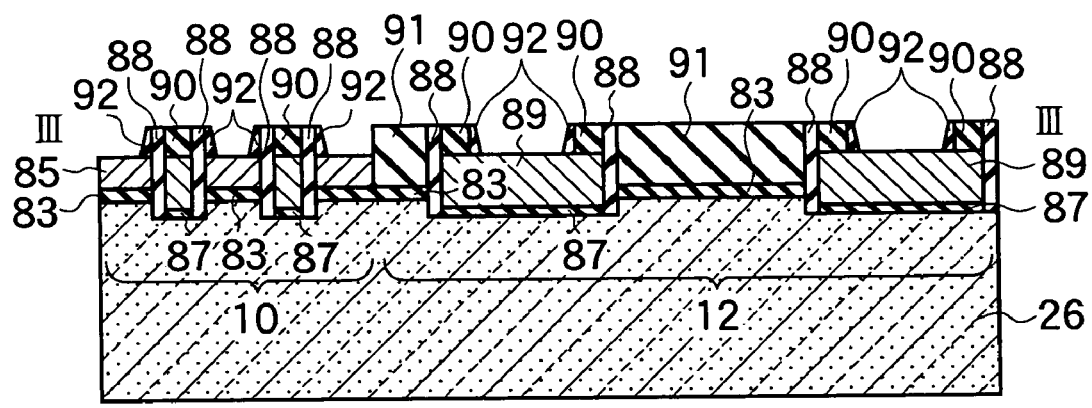

(f) Next, using lithography and etching techniques, the cap insulating film 90 in first opening regions 110 shown in FIG. 113 are selectively etched, and floating gate electrodes 89 are exposed so as to form the structures shown in FIG. 113 to FIG. 116.

(g) Next, once the height of the upper surface of the control gate electrode 85 film is decreased and a sidewall insulating film 92 is formed across the entire surface using etching techniques, an opening narrower than the control gate width is formed in the floating gate 89 upper surface so as to form the structures shown in FIG. 117 to FIG. 120. The sidewall insulating film 92 formed at this time is preferably set to have an appropriate film thickness for securing sufficient insulation breakdown voltage relative to the adjacent control gates 85.

(h) Subsequently, once a metal film is deposited across the entire surface, using lithography and etching techniques, the control gate electrode 85 film and the metal film are electrically connected, a first interconnect 93, which becomes gate interconnects for the select gate transistor and is a word line, is formed and an interlayer insulating film 94 is deposited so as to form the structures shown in FIG. 121 to FIG. 124. Other than the above technique, such formation is possible by using other techniques such as, forming a metal film across the entirety and then forming the first interconnect 93 through selective etching; or forming an insulating film, and then etching a trench and filling in with a metal so as to form the first interconnect 93 through CMP techniques, so long as the method forms typical interconnects. Misalignment develops during the lithography process for forming the interconnects, however, sufficient insulation breakdown voltage may be assured between adjacent word lines by providing an opening formed in the upper surface of the above control gates 85 in a self-aligning manner. Furthermore, in order to reduce contact resistance between each control gate 85 and the interconnect material of the above first interconnect 93, it is needless to say that a salicide process may be carried out before formation of the first interconnect 93.

(i) Next, once a second mask insulating film 95 is deposited across the entire surface, a first contact trench 96 and a second contact trench 97 are formed using lithography and etching techniques so as to form the structures shown in FIG. 125 to FIG. 128.

(j) Next, using lithography and etching techniques, once part of only the second mask insulating film 95 is removed and a first interconnect trench and a second interconnect trench are formed, a metal film is deposited across the entire surface. Using CMP techniques, a first contact 101, a second contact 102, a second interconnect 99 and a third interconnect 100 are then formed by polishing the deposited metal film until exposing the surface of the second mask insulating film 95. At this time, adjacent floating gate electrodes 89 that are exposed to the fourth contact 101 are electrically connected via the first contact 101. The first interconnects 93 become select gate transistor gate interconnects. The second contact 102 is electrically connected to the source and drain of the select gate transistor that is exposed to the second contact 102. As a result, two neighboring NAND columns are electrically connected, and the second contact 102 and the third interconnect 100 are electrically connected. At this time, the second contact 102 and the second interconnect 99, and the first contact 101 and the third interconnect 100 are electrically independent, respectively.

(k) Next, once a second interlayer insulating film 103 is deposited across the entire surface, a third contact trench is formed and a metal film is deposited using lithography and etching techniques. A third contact 104 shown in FIG. 133 to FIG. 136 is then formed by polishing the deposited metal film until exposing the surface of the second interlayer insulating film 103 using CMP techniques. At this time, the third contact 104 is electrically connected to the third interconnect 100.

(l) Next, a metal film is deposited across the entire surface using lithography and etching techniques, thereby forming a fourth interconnect 106 shown in FIG. 137 to FIG. 140. At this time, the fourth interconnect 106 is electrically connected to the third contact 104. The fourth interconnect 106 is electrically connected to two NAND columns via the third contact 104, the third interconnect 100, and the second contact 102. As a result, the fourth interconnect 106 become a bit line BL.

Building on the above processes, bit line contacts CB, each connecting a bit line BL and the diffusion layer of the bit line BL side select gate transistor, may be arranged with a pitch that is twice the NAND column pitch, where two NAND columns share a single common bit line BL.

SIXTH EMBODIMENT

Using FIG. 141 to FIG. 145, a fabrication method of forming a NAND EEPROM memory cell region 10, a select gate transistor region 12 and a bit line BL of a nonvolatile semiconductor memory according to a sixth embodiment of the present invention is described with a plan view of a layout pattern, cross sections cut along line I-I, cross sections cut along line II-II, and cross sections cut along line III-III.

(a) The structure shown in FIG. 141 corresponds to FIG. 113 to FIG. 116 of the fifth embodiment. It differs from the fifth embodiment in that a first opening region 110 and a second opening region 120 are provided, and a first interconnect 93 becomes a gate interconnect for the first and the second select gate transistor.

(b) FIG. 142 to FIG. 145 show structures corresponding to FIG. 137 to FIG. 140 of the fifth embodiment. Similar to the differences between the second embodiment and the third embodiment, the second interconnect 99, the third interconnect 100, the first contact 101 and the second contact 102 may be omitted.

SEVENTH EMBODIMENT

Using FIG. 146 to FIG. 150, a fabrication method of forming a NAND EEPROM memory cell region 10, a select gate transistor region 12 and a bit line BL of a nonvolatile semiconductor memory according to a seventh embodiment of the present invention are described with a plan view of a layout pattern, cross sections cut along line I-I, cross sections cut along line II-II, and cross sections cut along line III-III.

(a) The structure shown in FIG. 146 corresponds to FIG. 125 to FIG. 128 of the fifth embodiment. It differs from the fifth embodiment or the sixth embodiment in that the first opening region 110 or the second opening region 120 are not required, and the second interconnect 99 becomes gate interconnect for first and second select gate transistors.

(b) FIG. 147 to FIG. 150 show structures corresponding to FIG. 137 to FIG. 140 of the fifth embodiment. Similar to the differences between the second embodiment and the third embodiment, the processing steps for forming the first opening region 110 or the second opening region 120 may be omitted.

EIGHTH EMBODIMENT

Referring to partial cross-sectional block diagrams in FIG. 151 to FIG. 154, fabrication methods of particularly forming a select gate transistor region 12 of a NAND EEPROM memory as a nonvolatile semiconductor memory according to an eighth embodiment of the present invention is described. FIG. 151 to FIG. 154 are enlarged cross-sectional diagrams associated with the second embodiment and the third embodiment described above, in the vicinity of a control gate 2 and a floating gate 8 in particular. A feature of the embodiment provides a structure where the gate insulating film 130 at a part of the sidewall is removed so as to directly electrically contact the floating gate 8 and the control gate 2. It should be noted that FIG. 151 to FIG. 154 are enlarged diagrams of the portions above the silicon semiconductor substrate, wherein the silicon semiconductor substrate is omitted.

(a) The cross-sectional structure immediately after a first gate electrode 8 film, which becomes gate electrodes for floating gates or select gate transistors, is processed through lithography and etching, includes a first insulating film 30 formed from a tunnel oxide film, the first gate electrode 8, and a cap insulating film 32, as shown in FIG. 151.

(b) Next, the cross-sectional structure immediately after an inter-gate insulating film 130 is deposited across the entire surface between the first gate electrode 8 and the control gate 2, as shown in FIG. 152, has the inter-gate insulating film 130 deposited almost uniformly, even at the sidewall shown in FIG. 151.

(c) Next, in the cross-sectional structure immediately after the above inter-gate insulating film 130 is selectively removed from the sidewall surface of the first gate electrode 8 film and the cap insulating film 32 through lithography and etching, as indicated by portions M and N in FIG. 153, a portion of the inter-gate insulating film 130 on the first gate electrode 8 may be removed when selectively etching off the inter-gate insulating film 130. Furthermore, as indicated by portion N of FIG. 153, the etched-off portion may alternatively be a part of the side surface of the first gate electrode 8. The etched-off portion may also alternatively be the entire side surface of the first gate electrode 8. A structure allowing the first gate electrode 8 and the control gates (CG) 2, which become select gate interconnects (SG) for select gate transistors, to be electrically connected should be implemented.

(d) Next, once the gate electrode film, which becomes the control gates (CG) and the select gate transistor gate interconnects (SG), is deposited across the entire surface, the first gate electrode 8 and the gate electrode film, which becomes the control gates (CG), and the select gate transistor gate interconnects (SG) are electrically connected, as shown in FIG. 154. Subsequent steps are the same as with the second and the third embodiment. However, the step of removing the mask material from the first gate electrode 8 upper surface is not required.

NINTH EMBODIMENT

FIG. 155 illustrates an application example of a nonvolatile semiconductor memory according to the first to eighth embodiments of the present invention as a ninth embodiment. FIG. 155 is a schematic block diagram of principal elements of a flash memory and system according to the present invention. As shown in the drawing, a flash memory system 142 is configured with a host platform 144 and a universal serial bus (USB) flash unit 146.

The host platform 144 is connected to the USB flash unit 146 according to the present invention via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controlling the interface to the USB bus of the USB flash unit 146; the USB flash unit connector 152; and at least one flash memory module 158 configured with the nonvolatile semiconductor memory according to the first to eighth embodiments of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer called an end point, which stores transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received the request packet, this request is accepted by the USB flash unit controller 156.

Next, the USB flash unit controller 156 performs various operations such as read-in, write-in or erasure of data from or to the flash memory module 158. In addition, the USB flash unit supports basic USB functions such as acquiring a USB address and the like. The USB flash unit controller 156 controls the flash memory module 158 via either a control line 160, which is used to control output from the flash memory module 158, or, for example, other various signals such as/CE, a read-out signal or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit may be implemented. Directly connecting the connectors is also possible by omitting the USB cable described above.

As described above, the present invention is described according to embodiments, however, it should not be perceived that descriptions forming a part of this disclosure and drawings are intended to limit the spirit and scope of the present invention. Various alternative embodiments, working examples, and operational techniques will become apparent from this disclosure for those skilled in the art. Accordingly, the technical scope of the present invention is determined only by specified features of the invention according to the following claims that can be regarded appropriate from the above-mentioned descriptions.

In addition, the embodiments of the present invention can be modified and implemented in various ways as long as not deviating from the scope of the present invention. It should be noted that each of the above embodiments can be implemented in respective combinations. In this manner, the present invention naturally includes various embodiments not described herein.

Since the nonvolatile semiconductor memory of the present invention allows high integration of a NAND EEPROM where two NAND columns share a single bit line, wide industrial applicability can exist not only for a memory card and IC card, but for a vehicle system, a hard disk driver, a portable phone, high-speed network modem equipment, and the like.

OTHER EMBODIMENTS

Various modifications will become possible for those skilled in the art after receiving the teachings of the present disclosure without departing from the scope thereof.

In this manner, the present invention naturally includes various embodiments not described herein. Accordingly, the technical range of the present invention is determined only by the following claims that can be regarded appropriate from the above-mentioned descriptions.

What is claimed is:

1. A nonvolatile semiconductor memory comprising:
    first and second memory cell columns, each having a plurality of memory cell transistors connected in series, each of the memory cell transistors has a gate structure including a floating gate and first and second control gates located at both sides of the floating gate;
    a first select gate transistor connected between the first memory cell column and a bit line;
    a second select gate transistor connected between the second memory cell column and the bit line; and
    a bit line contact connecting the bit line to a diffusion layer of the first select gate transistor and the bit line contact connecting the bit line to a diffusion layer of the second select gate transistor,
    wherein a pitch of two adjacent bit line contacts of a plurality of bit line contacts is twice a pitch of two adjacent memory cell columns.

2. The nonvolatile semiconductor memory according to claim 1, further comprising:
    a plurality of control gate lines connected to the first and second control gates, respectively, and perpendicular to the bit line;
    a first select gate line connected to a gate of the first select gate transistor and parallel to the control gate lines;
    a second select gate line connected to a gate of the second select gate transistor and parallel to the control gate lines;
    a third select gate transistor connected between the first memory cell column and a source line; and
    a third select gate line connected to a gate of the third select gate transistor and parallel to the control gate lines.

3. The nonvolatile semiconductor memory according to claim 2, wherein,
    the third select gate transistor is also connected between the second memory cell column and the source line.

4. The nonvolatile semiconductor memory according to claim 2, further comprising:
    a fourth select gate transistor connected between the second memory cell column and the source line; and
    a fourth select gate line connected to a gate of the fourth select gate transistor and parallel to the control gate lines.

5. The nonvolatile semiconductor memory according to claim 4, further comprising:
    a bit line drive circuit connected to the bit line;
    a control gate line drive circuit connected to the control gate lines;
    a select gate line drive circuit connected to the select gate line; and
    a source line drive circuit connected to the source line.

6. The nonvolatile semiconductor memory according to claim 1, further comprising:
    a gate insulating film formed between a semiconductor substrate and the floating gate;
    a source and a drain of each of the plurality of memory cell transistors formed at both sides of the floating gates within the semiconductor substrate; and
    an interlayer insulating film formed at two sidewalls provided between the floating gate and the first control gate and also between the floating gate and the second control gate, wherein the first and the second control gates face the source and drain.

7. The nonvolatile semiconductor memory according to claim 6, further comprising:
    a plurality of control gate lines connected to the first and second control gates, respectively, and perpendicular to the bit line;
    a first select gate line connected to a gate of the first select gate transistor and parallel to the control gate lines;
    a second select gate line connected to a gate of the second select gate transistor and parallel to the control gate lines;
    a third select gate transistor connected between the first memory cell column and a source line; and
    a third select gate line connected to a gate of the third select gate transistor and parallel to the control gate lines.

8. The nonvolatile semiconductor memory according to claim 7, wherein,
    the third select gate transistor is also connected between the second memory cell column and the source line.

9. The nonvolatile semiconductor memory according to claim 7, further comprising:
    a fourth select gate transistor connected between the second memory cell column and the source line; and
    a fourth select gate line connected to a gate of the fourth select gate transistor and parallel to the control gate lines.

10. The nonvolatile semiconductor memory according to claim 7, further comprising:
    a bit line drive circuit connected to the bit line;
    a control gate line drive circuit connected to the control gate lines;
    a select gate line drive circuit connected to the select gate line; and
    a source line drive circuit connected to the source line.

11. The nonvolatile semiconductor memory according to claim 1, further comprising:
    a trench formed in a semiconductor substrate;
    a gate insulating film formed between the floating gate and a bottom of the trench;
    a source and a drain of the memory cell transistor formed at both sides of the floating gate in the semiconductor substrate; and
    an interlayer insulating film formed at sidewalls between the floating gate and the first control gate and also between the floating gate and the second control gate, wherein the first and second control gates are located on a gate insulating film formed on the source and drain and the first and second control gates drive the floating gate.

12. The nonvolatile semiconductor memory according to claim 11, further comprising:
    a plurality of control gate lines connected to the first and second control gates, respectively, and perpendicular to the bit line;
    a first select gate line connected to a gate of the first select gate transistor and parallel to the control gate lines;
    a second select gate line connected to a gate of the second select gate transistor and parallel to the control gate lines;

a third select gate transistor connected between the first memory cell column and a source line;
a third select gate line connected to a gate of the third select gate transistor and parallel to the control gate lines;
a fourth select gate transistor connected between the second memory cell column and the source line; and
a fourth select gate line connected to a gate of the fourth select gate transistor and parallel to the control gate lines.

13. The nonvolatile semiconductor memory according to claim 12, further comprising:
a bit line drive circuit connected to the bit line;
a control gate line drive circuit connected to the control gate lines;
a select gate line drive circuit connected to the select gate line; and
a source line drive circuit connected to the source line.

\* \* \* \* \*